United States Patent
Inoue et al.

(10) Patent No.: US 12,422,750 B2
(45) Date of Patent: Sep. 23, 2025

(54) METHOD OF MANUFACTURING CURED FILM, PHOTOCURABLE RESIN COMPOSITION, METHOD OF MANUFACTURING LAMINATE, AND METHOD OF MANUFACTURING SEMICONDUCTOR DEVICE

(71) Applicant: FUJIFILM Corporation, Tokyo (JP)

(72) Inventors: Kazuomi Inoue, Shizuoka (JP);
Yuichiro Enomoto, Shizuoka (JP);
Kazuto Shimada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 605 days.

(21) Appl. No.: 17/672,701

(22) Filed: Feb. 16, 2022

(65) Prior Publication Data

US 2022/0171285 A1 Jun. 2, 2022

Related U.S. Application Data

(63) Continuation of application No. PCT/JP2020/032182, filed on Aug. 26, 2020.

(30) Foreign Application Priority Data

Aug. 27, 2019 (JP) ................................ 2019-154278

(51) Int. Cl.
| | |
|---|---|
| G03F 7/20 | (2006.01) |
| C08G 73/10 | (2006.01) |
| G03F 7/037 | (2006.01) |
| G03F 7/038 | (2006.01) |
| G03F 7/075 | (2006.01) |
| G03F 7/38 | (2006.01) |
| G03F 7/40 | (2006.01) |

(52) U.S. Cl.
CPC ......... G03F 7/037 (2013.01); C08G 73/1042 (2013.01); C08G 73/106 (2013.01); G03F 7/0758 (2013.01); G03F 7/2004 (2013.01); G03F 7/2024 (2013.01)

(58) Field of Classification Search
CPC ... G03F 7/30; G03F 7/038; G03F 7/40; G03F 7/037; G03F 77/2024; G03F 7/203; G03F 7/0387
See application file for complete search history.

(56) References Cited

U.S. PATENT DOCUMENTS

| | | | | |
|---|---|---|---|---|
| 10,025,187 | B2* | 7/2018 | Nagahara | G03F 1/24 |
| 2009/0176172 | A1* | 7/2009 | Yamanaka | G03F 7/039 |
| | | | | 430/270.1 |
| 2010/0092879 | A1* | 4/2010 | Minegishi | G03F 7/0233 |
| | | | | 430/18 |
| 2017/0298186 | A1* | 10/2017 | Takemura | C08G 73/126 |
| 2018/0118887 | A1* | 5/2018 | Shibuya | C08G 73/1042 |
| 2018/0215874 | A1* | 8/2018 | Kawabata | G03F 7/20 |

FOREIGN PATENT DOCUMENTS

| | | |
|---|---|---|
| CN | 107329366 | 11/2017 |
| JP | 2005181353 | 7/2005 |
| JP | 2018087956 | 6/2018 |
| TW | 201833182 | 9/2018 |
| WO | 2011065215 | 6/2011 |
| WO | 2018123836 | 7/2018 |
| WO | 2019146778 | 8/2019 |

OTHER PUBLICATIONS

"Office Action of China Counterpart Application", issued on May 29, 2024, with English translation thereof, pp. 1-12.
"International Search Report (Form PCT/ISA/210) of PCT/JP2020/032182," mailed on Oct. 20, 2020, with English translation thereof, pp. 1-5.
"Written Opinion of the International Searching Authority (Form PCT/ISA/237)" of PCT/ JP2020/032182, mailed on Oct. 20, 2020, with English translation thereof, pp. 1-6.
"Office Action of Philippines Counterpart Application", issued on Jul. 18, 2023, p. 1-p. 6.
"Office Action of Taiwan Counterpart Application", issued on Dec. 12, 2023, with partial English translation thereof, p. 1-p. 6.
"Office Action of China Counterpart Application", issued on Jan. 24, 2025, with English translation thereof, p. 1-p. 7.

* cited by examiner

*Primary Examiner* — John S. Chu

(74) *Attorney, Agent, or Firm* — JCIPRNET

(57) ABSTRACT

There are provided a method of manufacturing a cured film, including a first exposure step of exposing a part of a photocurable film formed from a photocurable resin composition, a development step of developing the photocurable film after the exposure with a developing solution to obtain a pattern, and a second exposure step of exposing the pattern with light including light having a wavelength different from a wavelength of light used in the first exposure step, where the photocurable resin composition has a specific constitution, a photocurable resin composition that is used in the method of manufacturing the cured film, a method of manufacturing a laminate including the method of manufacturing a cured film, and a method of manufacturing an electronic device, which includes the method of manufacturing the cured film.

18 Claims, No Drawings

METHOD OF MANUFACTURING CURED FILM, PHOTOCURABLE RESIN COMPOSITION, METHOD OF MANUFACTURING LAMINATE, AND METHOD OF MANUFACTURING SEMICONDUCTOR DEVICE

CROSS-REFERENCE TO RELATED APPLICATIONS

This application is a Continuation of PCT International Application No. PCT/JP2020/032182 filed on Aug. 26, 2020, which claims priority under 35 U.S.C § 119(a) to Japanese Patent Application No. 2019-154278 filed on Aug. 27, 2019. Each of the above application(s) is hereby expressly incorporated by reference, in its entirety, into the present application.

BACKGROUND OF THE INVENTION

1. Field of the Invention

The present invention relates to a method of manufacturing a cured film, a photocurable resin composition, a method of manufacturing a laminate, and a method of manufacturing a semiconductor device.

2. Description of the Related Art

Resins such as polyimide and polybenzoxazole are applied to various use applications since they have excellent heat resistance and insulating properties. The above use applications are not particularly limited, and examples thereof in a semiconductor device for mounting include using a cured film containing such a resin as a material for an insulating film or a sealing material, or as a protective film. In addition, a cured film containing such a resin can also be used as a base film or a cover lay for a flexible substrate.

For example, in the above-described use applications, a resin such as a polyimide or a polybenzoxazole is used in the form of a photocurable resin composition containing this resin. Such a photocurable resin composition is applied onto a base material by coating or the like, and then, as necessary, subjected to exposure, development, or heating, whereby a cured resin can be formed on the base material.

Since the photocurable resin composition can be applied by a known coating method or the like, it can be said that the photocurable resin composition is excellent in the manufacturing adaptability, for example, a high degree of freedom in designing the shape, size, application position of the photocurable resin composition to be applied. From the viewpoint of the excellent manufacturing adaptability described above in addition to the high performance of polyimide, polybenzoxazole, and the like, the industrial application spreading of photocurable resin compositions containing such a resin is expected increasingly.

For example, WO2018/173840A discloses a photosensitive resin composition characterized by containing an alkali-soluble polyimide (a), an unsaturated bond-containing compound (b), a thermal crosslinking compound (c), and a photopolymerization initiator (d) having a specific structure.

SUMMARY OF THE INVENTION

In the related art, a cured film has been obtained by applying a photocurable resin composition containing polyimide or polybenzoxazole onto a base material, forming a pattern by exposure development, and then carrying out heating.

In the manufacture of the cured film, it is desired to provide a method of manufacturing a cured film, with which a cured film having an excellent pattern shape and excellent film hardness can be obtained.

An object of the present invention is to provide a method of manufacturing a cured film with which a cured film having an excellent pattern shape and excellent film hardness is obtained, a photocurable resin composition that is used in the method of manufacturing the cured film, a method of manufacturing a laminate including the method of manufacturing a cured film, and a method of manufacturing an electronic device, which includes the method of manufacturing the cured film.

Examples of typical embodiments of the present invention are described below.

<1> A method of manufacturing a cured film comprising;
a first exposure step of exposing a part of a photocurable film formed from a photocurable resin composition,
a development step of developing the photocurable film after the exposure with a developing solution to obtain a pattern, and
a second exposure step of exposing the pattern with light including light having a wavelength different from a wavelength of light used in the first exposure step,
in which the photocurable resin composition contains
at least one resin selected from the group consisting of polyimide and polybenzoxazole,
a photosensitive compound A having a sensitivity to an exposure wavelength in the first exposure step, and
a photosensitive compound B having no sensitivity to the exposure wavelength in the first exposure step and having a sensitivity to an exposure wavelength in the second exposure step,
where the photosensitive compound A is a compound that changes a solubility of the photocurable film in the developing solution in the first exposure step, and
at least one of the following condition 1 or condition 2 is satisfied;
the condition 1: the resin in the photocurable resin composition contains a group in which a bonding reaction with another group is promoted due to photosensitization of the photosensitive compound B in the second exposure step,
the condition 2: the photocurable resin composition further contains a crosslinking agent having a group in which a bonding reaction with another group is promoted due to photosensitization of the photosensitive compound B in the second exposure step.
<2> The method of manufacturing a cured film according to <1>, in which the photosensitive compound A is a compound that generates a radical in the first exposure step.
<3> The method of manufacturing a cured film according to <1> or <2>, in which the photosensitive compound B is a compound that generates an acid in the second exposure step.
<4> The method of manufacturing a cured film according to any one of <1> or <2>, in which the photosensitive compound B is a compound that generates a radical in the second exposure step.
<5> The method of manufacturing a cured film according to <1> or <2>, in which the photosensitive compound B is a compound that generates a base in the second exposure step.

<6> The method of manufacturing a cured film according to <1>, in which the photosensitive compound A is a photoradical polymerization initiator and the photosensitive compound B is a photoacid generator.

<7> The method of manufacturing a cured film according to <1>, in which both the photosensitive compound A and the photosensitive compound B are a photoradical polymerization initiator.

<8> The method of manufacturing a cured film according to any one of <1> to <7>, in which the exposure in the first exposure step is exposure with an i-line.

<9> A photocurable resin composition, in which the photocurable resin composition is used in the method of manufacturing a cured film according to any one of <1> to <9>.

<10> A photocurable resin composition comprising:
at least one resin selected from the group consisting of polyimide and polybenzoxazole; and
a photosensitive compound A and photosensitive compound B, between which a maximum absorption wavelength difference is 80 nm or more,
in which the photosensitive compound A is a compound that changes a solubility of a photocurable film in a developing solution in the first exposure step,
at least one of the following condition 1 or condition 2 is satisfied, and
the photocurable resin composition is provided for a method of manufacturing a cured film including;
a first exposure step of exposing a part of the photocurable film formed from the photocurable resin composition,
a development step of developing the photocurable film after the exposure with the developing solution to obtain a pattern, and
a second exposure step of exposing the pattern with light including light having a wavelength different from a wavelength of light used in the first exposure step,
the condition 1: the resin in the photocurable resin composition contains a group in which a bonding reaction with another group is promoted due to photosensitization of the photosensitive compound B in the second exposure step,
the condition 2: the photocurable resin composition further contains a crosslinking agent having a group in which a bonding reaction with another group is promoted due to photosensitization of the photosensitive compound B in the second exposure step.

<11> A method of manufacturing a laminate, the method comprising the method of manufacturing a cured film according to any one of <1> to <8>.

<12> A method of manufacturing an electronic device, the method comprising the method of manufacturing a cured film according to any one of <1> to <8>, or the method of manufacturing a laminate according to <11>.

According to the present invention, there are provided a method of manufacturing a cured film with which a cured film having an excellent pattern shape and excellent film hardness is obtained, a photocurable resin composition that is used in the method of manufacturing the cured film, a method of manufacturing a laminate including the method of manufacturing a cured film, and a method of manufacturing an electronic device, which includes the method of manufacturing the cured film.

DESCRIPTION OF THE PREFERRED EMBODIMENTS

Hereinafter, the main embodiments of the present invention will be described. However, the present invention is not limited to the specified embodiments.

In the present specification, a numerical range described by using "to" means a range including numerical values described before and after the preposition "to" as a lower limit value and an upper limit value, respectively.

In the present specification, the term "step" means not only an independent step but also a step that cannot be clearly distinguished from other steps as long as the desired action of the step can be achieved.

In describing a group (an atomic group) in the present specification, in a case where a description about substitution and non-substitution is not provided, the description means the group includes a group (an atomic group) having a substituent as well as a group (an atomic group) having no substituent. For example, the "alkyl group" includes not only an alkyl group that does not have a substituent (an unsubstituted alkyl group) but also an alkyl group that has a substituent (a substituted alkyl group).

In the present specification, the "exposure" includes not only exposure using light but also exposure using particle beams such as an electron beam and an ion beam, unless otherwise specified. In addition, examples of the light that is used for exposure include an actinic ray such as an emission line spectrum of a mercury lamp, a far ultraviolet ray represented by an excimer laser, an extreme ultraviolet ray (an EUV ray), an X-ray, or an electron beam, and a radio-active ray.

In the present specification, "(meth)acrylate" means one or both of "acrylate" and "methacrylate", "(meth)acryl" means one or both of "acryl" and "methacryl", and "(meth) acryloyl" means one or both of "acryloyl" and "methacryloyl".

In the structural formulae of the present specification, Me represents a methyl group, Et represents an ethyl group, Bu represents a butyl group, and Ph represents a phenyl group.

In the present specification, the total solid content refers to the total mass of components excluding a solvent from the entire components of the composition. In addition, in the present specification, the solid content concentration is a mass percentage of other components excluding a solvent with respect to the total mass of the composition.

In the present specification, weight-average molecular weight (Mw) and number-average molecular weight (Mn) are defined as polystyrene equivalent values according to gel permeation chromatography (GPC) measurement unless otherwise specified. In the present specification, the weight-average molecular weight (Mw) and the number-average molecular weight (Mn) can be determined, for example, by using HLC-8220 GPC (manufactured by Tosoh Corporation) and using, as a column, GUARD COLUMN HZ-L, TSKgel Super HZM-M, TSK gel Super HZ4000, TSK gel Super HZ3000, and TSK gel Super HZ2000 (manufactured by Tosoh Corporation). The measurements of the above molecular weights are carried out using tetrahydrofuran (THF) as an eluent unless otherwise specified. In addition, the detection in GPC measurement is carried out using a detector with an ultraviolet ray (a UV ray) of a wavelength of 254 nm unless otherwise specified.

In the present specification, in a case where the positional relationship of respective layers constituting the laminate is described as "upper" or "lower", another layer may be on the upper side or the lower side of the reference layer among the plurality of layers of interest. That is, a third layer or element may be further interposed between the reference layer and the other layer, and the reference layer and the other layer need not be in contact with each other. In addition, unless otherwise specified, the direction in which the layers are laminated on the base material is referred to as "upward", or in a case where a photocurable layer is present, the direction from the base material to the photocurable layer is referred to as "upper". The opposite direction thereof is referred to as "downward". It is noted that such setting of the upward or downward direction is for convenience in the present specification, and in an actual aspect, the "upward" direction in the present specification may be different from the vertically upward direction.

In the present specification, a composition may contain, as each component contained in the composition, two or more compounds corresponding to the component unless otherwise particularly specified. The content of each component in the composition means the total content of all the compounds corresponding to the component unless otherwise particularly specified.

In the present specification, unless otherwise specified, the temperature is 23° C. and the atmospheric pressure is 101,325 Pa (1 atm).

In the present specification, a combination of preferred aspects is a more preferred aspect.

(Method of Manufacturing Cured Film)

The first aspect of the method of manufacturing a cured film according to the embodiment of the present invention includes a first exposure step of exposing a part of a photocurable film formed from a photocurable resin composition, a development step of developing the photocurable film after the exposure with a developing solution to obtain a pattern, and a second exposure step of exposing the pattern with light including light having a wavelength different from a wavelength of light used in the first exposure step, in which the photocurable resin composition contains at least one resin (hereinafter, also referred to as a "specific resin") selected from the group consisting of polyimide and polybenzoxazole, a photosensitive compound A having a sensitivity to an exposure wavelength in the first exposure step, and a photosensitive compound B having no sensitivity to the exposure wavelength in the first exposure step and having a sensitivity to an exposure wavelength in the second exposure step, where the photosensitive compound A is a compound that changes a solubility of the photocurable film in the developing solution in the first exposure step, and at least one of the following condition 1 or condition 2 is satisfied.

The condition 1: the resin in the photocurable resin composition contains a group in which a bonding reaction with another group is promoted due to photosensitization of the photosensitive compound B in the second exposure step.

the condition 2: the photocurable resin composition further contains a crosslinking agent having a group in which a bonding reaction with another group is promoted due to photosensitization of the photosensitive compound B in the second exposure step.

The second aspect of the method of manufacturing a cured film according to the embodiment of the present invention includes a first exposure step of exposing a part of a photocurable film formed from a photocurable resin composition, a development step of developing the photocurable film after the exposure with a developing solution to obtain a pattern, and a second exposure step of exposing the pattern with light including light having a wavelength different from a wavelength of light used in the first exposure step, in which the photocurable resin composition contains at least one resin selected from the group consisting of polyimide and polybenzoxazole, and a photosensitive compound A and photosensitive compound B, between which a maximum absorption wavelength difference is 80 nm or more, where the photosensitive compound A is a compound that changes a solubility of the photocurable film in the developing solution in the first exposure step, and at least one of the following condition 1 or condition 2 is satisfied.

The first aspect and the second aspect are the same except that the photosensitive compound A and the photosensitive compound B are different.

Hereinafter, the above first aspect is simply referred to as the "first aspect", the above second aspect is simply referred to as the "second aspect", and the first aspect and the second aspect are collectively referred to as the "method of manufacturing a cured film according to the embodiment of the present invention".

According to the method of manufacturing a cured film according to the embodiment of the present invention, a cured film having an excellent pattern shape and film hardness can be obtained.

The mechanism by which the above effect is obtained is unknown; however, it is presumed as follows.

In the related art, a cured film has been obtained by applying a photocurable resin composition containing polyimide or polybenzoxazole onto a base material, forming a pattern by exposure development, and then carrying out heating.

The inventors of the present invention found that there is room for improvement in the fact that the pattern after exposure development is deformed due to expansion and contraction in the heating and subsequent cooling.

As a result of diligent studies, the inventors of the present invention have found that in a case where the photocurable film formed from the photocurable resin composition is subjected to the two-step exposure of the first exposure step and the second exposure step described above, it is possible to obtain a cured film in which the above-described deformation is suppressed and have completed the present invention.

It is conceived that according to the method of manufacturing a cured film according to the embodiment of the present invention, it is also possible to obtain a cured film without carrying out heating for curing (for example, heating at 180° C. or higher), and thus the processing time can be shortened.

In addition, it is conceived that a cured film having excellent film hardness can be easily obtained due to the reason that the crosslink density in the cured film is increased upon the above two-step exposure.

Similarly, it is further conceived that a cured film having excellent solvent resistance can be easily obtained due to the increase in the crosslink density and the like.

However, WO2018/173840A does not describe or suggest a method of manufacturing a cured film including a first exposure step and a second exposure step.

Hereinafter, the method of manufacturing a cured film according to the embodiment of the present invention will be described in detail.

<<First Exposure Step>>

The method of manufacturing a cured film according to the embodiment of the present invention includes a first exposure step of exposing a part of a photocurable film formed from a photocurable resin composition.

In the first exposure step, the photosensitive compound A, which will be described later, is photosensitized, and the solubility of the photocurable film in a developing solution is changed.

Specifically, for example, in a case where the photosensitive compound A is a photopolymerization initiator described later, the polymerization proceeds in the photocurable film, and the solubility of the photocurable film in the developing solution after the first exposure step is decreased.

In addition, for example, in a case where the photosensitive compound A is a photoacid generator described later and the developing solution is an alkaline developing solution described later, an acid is generated in the photocurable film and, the solubility thereof in the developing solution is increased.

Further, for example, in a case where the photosensitive compound A is a photoacid generator described later and the developing solution is an organic solvent described later, an acid is generated in the photocurable film and, the solubility thereof in the developing solution is decreased.

In this manner, in the first exposure step, the solubility of the photocurable film in the developing solution may be changed by the promotion of the bonding reaction between the crosslinkable group contained in the specific resin or the crosslinking agent and another group due to the photosensitization of the photosensitive compound A, or the solubility of the photocurable film in the developing solution may be changed by the product generated by the chemical change due to the photosensitization of the photosensitive compound A.

That is, the photocurable film in the present invention may be a positive type photocurable film or a negative type photocurable film.

The positive type photocurable film refers to a photocurable film in which parts (exposed portions) exposed in the first exposure step are removed by the developing solution, and the negative type photocurable film refers to a photocurable film in which parts (unexposed portions) unexposed in the first exposure step are removed by the developing solution.

In the first aspect of the method of manufacturing a cured film according to the embodiment of the present invention, the exposure wavelength in the first exposure step may be appropriately set to a wavelength at which the photosensitive compound A described later has a sensitivity but the photosensitive compound B has no sensitivity, however, it is preferably 190 to 1,000 nm, more preferably 240 to 550 nm, and still more preferably 300 to 380 nm.

In the second aspect of the method of manufacturing a cured film according to the embodiment of the present invention, the exposure wavelength in the first exposure step may be appropriately set to a wavelength which is in the vicinity of the maximum absorption wavelength of the photosensitive compound A (for example, a wavelength within a range of the maximum absorption wavelength±10 nm) and which is sufficiently distant from the maximum absorption wavelength of the photosensitive compound B (for example, a wavelength outside a range of the maximum absorption wavelength±20 nm), which will be described later; however, it is preferably 190 to 1,000 nm, more preferably 240 to 550 nm, and still more preferably 300 to 380 nm.

Examples of the exposure wavelength, which are mentioned in the relationship with the light source, include (1) a semiconductor laser (wavelength: 830 nm, 532 nm, 488 nm, 405 nm, or the like); (2) a metal halide lamp; (3) a high-pressure mercury lamp, a g-line (wavelength: 436 nm), an h-line (wavelength: 405 nm), an i-line (wavelength: 365 nm), or Broad (three wavelengths of the g, h, and i-line); (4) an excimer laser, a KrF excimer laser (wavelength: 248 nm), an ArF excimer laser (wavelength: 193 nm), or an $F_2$ excimer laser (wavelength: 157 nm); (5) an extreme ultraviolet (EUV) ray (wavelength: 13.6 nm); (6) an electron beam; (7) a second harmonic wave of 532 nm and a third harmonic wave of 355 nm of a YAG laser. Regarding the photocurable resin composition according to the embodiment of the present invention, exposure with an i-line is preferable. In this case, particularly high exposure sensitivity can be obtained.

From the viewpoint of handling and productivity, a broad (three wavelengths of an a-line, an h-line, or an i-line) light source of a high-pressure mercury lamp or a semiconductor laser of 405 nm is also suitable.

An optical filter or the like that removes a specific wavelength from these light sources may be used in order to suppress the photosensitization of the photosensitive compound B.

Examples of the method of exposing a part of a photocurable film in the first exposure step include an exposure method using a known photomask and an exposure method of exposing a part of a photocurable film with laser exposure or the like.

In the first aspect of the method of manufacturing a cured film according to the embodiment of the present invention, the exposure amount in the first exposure step is preferably 100 to 10,000 mJ/cm$^2$ and more preferably 200 to 8,000 mJ/cm$^2$ in terms of exposure energy at the wavelength at which the photosensitive compound A has a sensitivity. In the second aspect of the method of manufacturing a cured film according to the embodiment of the present invention, the exposure amount in the first exposure step is preferably 100 to 10,000 mJ/cm$^2$ and more preferably 200 to 8,000 mJ/cm$^2$ in terms of exposure energy at the maximum absorption wavelength of the photosensitive compound A.

<Heating Step after Exposure>

The method of manufacturing a cured film according to the embodiment of the present invention may include a step of heating the photocurable film after the exposure (a heating step after the exposure) after the first exposure step and before the development step. The heating temperature in the heating step after the exposure is preferably 50° C. to 140° C. and more preferably 60° C. to 120° C.

The heating time in the heating step after the exposure is preferably 1 minute to 300 minutes and more preferably 5 minutes to 120 minutes.

In the heating step after the exposure, the temperature elevation rate from the temperature at the start of heating to the maximum heating temperature is preferably 1° C. to 12° C./min, more preferably 2° C. to 10° C./min, and still more preferably 3° C. to 10° C./min.

In addition, the temperature elevation rate may be appropriately changed during heating.

The heating unit in the heating step after the exposure is not particularly limited, and a known hot plate, oven, infrared heater, or the like can be used.

In addition, it is also preferable to carry out the heating in an atmosphere having a low oxygen concentration by allowing an inert gas such as nitrogen, helium, argon, or the like to flow or carrying out the heating under reduced pressure.

<Film Forming Step>

The method of manufacturing a cured film according to the embodiment of the present invention may include a film forming step of forming a photocurable film from a photocurable resin composition.

The photocurable film in the first exposure step may be a photocurable film formed in the film forming step or may be a photocurable film obtained by means such as a purchase. The film forming step is preferably a step of applying a photocurable resin composition onto a base material to form a (layered) film to obtain a photocurable film.

[Base Material]

The kind of base material can be appropriately determined depending on the use application, and examples thereof are a base material for semiconductor production, such as silicon, silicon nitride, polysilicon, silicon oxide, or amorphous silicon, quartz, glass, an optical film, a ceramic material, a vapor-deposited film, a magnetic film, a reflective film, metal base materials such as Ni, Cu, Cr, and Fe, paper, spin-on-glass (SOG), a thin film transistor (TFT) array base material, and an electrode plate of a plasma display panel (PDP), and are not particularly limited thereto. In the present invention, in particular, a base material for semiconductor production is preferable, and a silicon base material, a Cu base material, or a mold base material is more preferable.

In addition, a layer such as an adhesion layer made of hexamethyldisilazane (HMDS) or the like, or an oxide layer may be provided on the surface of these base materials.

In addition, the shape of the base material is not particularly limited, and it may be a circular shape or a rectangular shape.

Regarding the size of the base material, for example in a case of a circular shape, the diameter thereof is 100 to 450 mm and preferably 200 to 450 mm. In a case where the shape is rectangular, for example, the length of the short side is 100 to 1,000 mm and preferably 200 to 700 mm. In addition, as the base material, for example, a plate-shaped base material (substrate) is used.

In a case where the photocurable film is formed on a surface of a resin layer or a surface of the metal layer, the resin layer or the metal layer is the base material.

The means for applying a photocurable resin composition to a base material is preferably coating.

Specifically, as means for application, a dip coating method, an air knife coating method, a curtain coating method, a wire bar coating method, a gravure coating method, an extrusion coating method, a spray coating method, a spin coating method, a slit coating method, and an inkjet method are exemplified. From the viewpoint of uniformity of the thickness of the photocurable film, the spin coating method, the slit coating method, the spray coating method, or the inkjet method is more preferable, and from the viewpoint that the effects of the present invention are easily obtained, the slit coating method is preferable. A photocurable film having a desired thickness can be obtained by appropriately adjusting the solid content concentration and application conditions according to the method. In addition, the coating method can be appropriately selected depending on the shape of the base material. In a case where a circular base material such as a wafer is used, the spin coating method, the spray coating method, the inkjet method, and the like are preferable, and in a case where a rectangular base material is used, the slit coating method, the spray coating method, the inkjet method, and the like are preferable. For example, the spin coating method can be applied at a rotation speed of 500 to 2,000 rpm for about 10 seconds to 1 minute.

In addition, depending on the viscosity of the photosensitive resin composition and the film thickness to be set, it is also preferably applied at a rotation speed of 300 to 3,500 rpm for 10 to 180 seconds. In addition, in order to obtain the uniformity of the film thickness, a plurality of rotation speeds can be combined and applied.

Further, it is also possible to apply a method of transferring a coating film formed in advance on a temporary support by the above-described coating method, onto a base material.

Regarding the transfer method, the production methods disclosed in paragraphs 0023, and 0036 to 0051 of JP2006-023696A and paragraphs 0096 to 0108 of JP2006-047592A can also be suitably used in the present invention.

In addition, a step of removing an unnecessary film at the edge of the base material may be carried out. Examples of such a step include edge bead rinse (EBR) and back rinse.

Further, a pre-wetting step of applying various solvents to the base material before applying the resin composition onto the base material to improve the wettability of the base material and then applying the resin composition may be adopted.

<<Drying Step>>

The method of manufacturing a cured film according to the embodiment of the present invention may include a step (a drying step) of drying the film (or the layer) formed for removing the solvent, after the film forming step (the layer forming step).

The preferred drying temperature is 50° C. to 150° C., more preferably 70° C. to 130° C., and still more preferably 90° C. to 110° C. Examples of the drying time include 30 seconds to 20 minutes, and the drying time is preferably 1 minute to 10 minutes and more preferably 3 minutes to 7 minutes. In a case where the amount of solvent in the photocurable resin composition is large, vacuum drying and heat drying can be combined. A hot plate, a hot air oven, or the like is used for heat drying, and it is not particularly limited.

<Development Step>

The method of manufacturing a cured film according to the embodiment of the present invention includes a development step of developing the photocurable film after the exposure with a developing solution to obtain a pattern.

By the development, either exposed portions or unexposed portions are removed. The development method is not particularly limited as long as the development method can form the desired pattern, and, for example, a development method such as puddle development, spray development, immersion development, or ultrasonic wave development can be employed.

The development is carried out using a developing solution. As the developing solution, one with which unexposed parts (unexposed portions) are removed in a case of negative type development can be used and one with which exposed parts (exposed portions) are removed in a case of positive type development can be used without any particular limitation.

In the present invention, a case where an alkaline developing solution is used is as the developing solution is referred to as alkaline development, and a case where a developing solution containing 50% by mass or more of an organic solvent is used as the developing solution is referred to as solvent development.

In the alkaline development, the developing solution is preferably a developing solution in which the content of the organic solvent is 10% by mass or less, more preferably a developing solution in which the content thereof is 5% by mass or less, and still more preferably a developing solution in which the content thereof is 1% by mass or less, with respect to the total mass of the developing solution. It is particularly preferably a developing solution in which no organic solvent is contained.

The developing solution in the alkaline development is more preferably an aqueous solution having a pH of 10 to 15.

Examples of the alkaline compound contained in the developing solution in the alkaline development include sodium hydroxide, potassium hydroxide, sodium carbonate, potassium carbonate, sodium hydrogen carbonate, potassium hydrogen carbonate, sodium silicate, potassium silicate, sodium metasilicate, potassium metasilicate, ammonia, and an amine. Examples of the amine include ethylamine, n-propylamine, diethylamine, di-n-propylamine, triethylamine, methyldiethylamine, alkanolamine, dimethylethanolamine, triethanolamine, a quaternary ammonium hydroxide, a tetramethylammonium hydroxide (TMAH), and tetraethylammonium hydroxide. Among them, an alkaline compound containing no metal is preferable, and an ammonium compound is more preferable. TMAH is more preferable. For example, in a case where TMAH is used, the content of the basic compound in the developing solution is preferably 0.01% to 10% by mass, more preferably 0.1% to 5% by mass, and still more preferably 0.3% to 3% by mass with respect to the total mass of the developing solution.

One kind of alkaline compound may be used, or two or more kinds thereof may be used. In a case where two or more kinds of alkaline compounds are used, the total thereof is preferably within the above-described range.

In solvent development, it is more preferable that the developing solution contains 90% by mass or more of an organic solvent with respect to the total mass of the developing solution. In the present invention, the developing solution preferably contains an organic solvent having a C log P value of −1 to 5 and more preferably an organic solvent having a C log P value of 0 to 3. The C log P value can be determined as a calculated value by inputting a structural formula in ChemBioDraw.

Suitable examples of the organic solvent include esters such as ethyl acetate, n-butyl acetate, amyl formate, isoamyl acetate, isobutyl acetate, butyl propionate, isopropyl butyrate, ethyl butyrate, butyl butyrate, methyl lactate, ethyl lactate, γ-butyrolactone, ε-caprolactone, b-valerolactone, an alkyl alkyloxyacetate (example: a methyl alkyloxyacetate, an ethyl alkyloxyacetate, and a butyl alkyloxyacetate (for example, methyl methoxyacetate, ethyl methoxyacetate, butyl methoxyacetate, methyl ethoxyacetate, and ethyl ethoxyacetate)), 3-alkyloxypropionic acid alkyl esters (example: a methyl 3-alkyloxypropionate and an ethyl 3-alkyloxypropionate (for example, methyl 3-methoxypropionate, ethyl 3-methoxypropionate, methyl 3-ethoxypropionate, and ethyl 3-ethoxypropionate)), 2-alkyloxypropionic acid alkyl esters (example: a methyl 2-alkyloxypropionate, an ethyl 2-alkyloxypropionate, and a propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), a methyl 2-alkyloxy-2-methylpropionate and an ethyl 2-alkyloxy-2-methylpropionate (for example, methyl 2-methoxy-2-methylpropionate and ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate; ketones such as methyl ethyl ketone, cyclohexanone, cyclopentanone, 2-heptanone, 3-heptanone, and N-methyl-2-pyrrolidone; cyclic hydrocarbons such as aromatic hydrocarbons such as toluene, xylene, and anisole; cyclic terpenes such as limonene; and sulfoxides such as dimethyl sulfoxide.

In the present invention, cyclopentanone or γ-butyrolactone is particularly preferable, and cyclopentanone is more preferable. In a case where the developing solution contains an organic solvent, one kind of organic solvent can be used, or two or more kinds thereof can be mixedly used as well.

In a case where the developing solution contains an organic solvent, the content of the organic solvent in the developing solution is preferably 50% by mass or more, the content of the organic solvent is more preferably 70% by mass or more, the content of the organic solvent is still more preferably 80% by mass or more, and the content of the organic solvent is particularly preferably 90% by mass or more. In addition, the content of the organic solvent in the developing solution may be 100% by mass.

The developing solution may further contain another component.

Examples of the other component include a known surfactant and a known defoamer.

[Method of Supplying Developing Solution]

The method of supplying a developing solution is not particularly limited as long as a desired pattern can be formed, and it includes a method of immersing a base material in a developing solution, method of supplying a developing solution onto a base material using a nozzle, and a method of continuously supplying a developing solution. The kind of nozzle is not particularly limited, and examples thereof include a straight nozzle, a shower nozzle, and a spray nozzle.

From the viewpoint of the permeability of the developing solution, the removability of the non-image area, and the manufacturing efficiency, a method of supplying a developing solution with a straight nozzle or a method of continuously supplying a developing solution with a spray nozzle is preferable, and from the viewpoint of the permeability of the developing solution into the image area, a method of supplying a developing solution with a spray nozzle is more preferable.

In addition, after the continuous supply with a straight nozzle, the base material is spun to remove the developing solution from the base material, and then the developing solution is continuously supplied by the straight nozzle again after the spin drying, a step of spinning the base material to remove the developing solution from the base material may be adopted, and this step may be repeated a plurality of times.

In addition, in the method of supplying a developing solution in the development step, a step of continuously supplying a developing solution to a base material, a step of keeping a developing solution in a substantially stationary state on a base material, a step of vibrating a developing solution on a base material by ultrasonic waves or the like, and a step obtained by combining these steps can be adopted.

The development time is preferably 5 seconds to 10 minutes and more preferably 10 seconds to 5 minutes. The temperature of the developing solution at the time of development is not particularly limited; however, the development can usually be carried out at 10° C. to 45° C. and preferably 20° C. to 40° C.

In the development step, rinsing may be further carried out after the treatment with the developing solution. In addition, a method such as supplying a rinsing liquid before the developing solution which is in contact with the pattern is completely dried may be adopted. In the case of the solvent development, rinsing is preferably carried out with an organic solvent different from the developing solution. Examples of such an organic solvent include propylene glycol monomethyl ether acetate. The rinsing time is preferably 5 seconds to 5 minutes. In addition, a step of applying both a developing solution and a rinsing liquid may be included between the development and the rinsing. The time of the above step is preferably 1 second to 5 minutes.

In the case of the alkaline development, rinsing is preferably carried out using pure water.

The rinsing time is preferably 10 seconds to 10 minutes, more preferably 20 seconds to 5 minutes, and still more preferably 5 seconds to 1 minute.

The temperature of the rinsing liquid at the time of rinsing is not particularly specified; however, rinsing can be preferably carried out at 10° C. to 45° C. and more preferably 18° C. to 30° C.

Suitable examples of the organic solvent in the case where the rinsing liquid contains the organic solvent include esters such as ethyl acetate, n-butyl acetate, amyl formate, isoamyl acetate, isobutyl acetate, butyl propionate, isopropyl butyrate, ethyl butyrate, butyl butyrate, methyl lactate, ethyl lactate, γ-butyrolactone, ε-caprolactone, δ-valerolactone, an alkyl alkyloxyacetate (example: a methyl alkyloxyacetate, an ethyl alkyloxyacetate, and a butyl alkyloxyacetate (for example, methyl methoxyacetate, ethyl methoxyacetate, butyl methoxyacetate, methyl ethoxyacetate, and ethyl ethoxyacetate)), 3-alkyloxypropionic acid alkyl esters (example: a methyl 3-alkyloxypropionate and an ethyl 3-alkyloxypropionate (for example, methyl 3-methoxypropionate, ethyl 3-methoxypropionate, methyl 3-ethoxypropionate, and ethyl 3-ethoxypropionate)), 2-alkyloxypropionic acid alkyl esters (example: a methyl 2-alkyloxypropionate, an ethyl 2-alkyloxypropionate, and a propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), a methyl 2-alkyloxy-2-methylpropionate and an ethyl 2-alkyloxy-2-methylpropionate (for example, methyl 2-methoxy-2-methylpropionate and ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether (PGME), propylene glycol monomethyl ether acetate (PGMEA), propylene glycol monoethyl ether acetate, and propylene glycol monopropyl ether acetate; ketones such as methyl ethyl ketone, cyclohexanone, cyclopentanone, 2-heptanone, 3-heptanone, and N-methyl-2-pyrrolidone; aromatic hydrocarbons such as toluene, xylene, anisole, and limonene; sulfoxides such as dimethyl sulfoxide; and alcohols such as methanol, ethanol, propanol, isopropanol, butanol, pentanol, octanol, diethylene glycol, propylene glycol, methylisobutyl carbinol, and triethylene glycol; and amides such as N-methylpyrrolidone, N-ethylpyrrolidone, and dimethylformamide.

In a case where the rinsing liquid contains an organic solvent, one kind of organic solvent can be used, or two or more kinds thereof can be mixedly used. In the present invention, cyclopentanone, γ-butyrolactone, dimethyl sulfoxide, N-methylpyrrolidone, cyclohexanone, PGMEA, or PGME is particularly preferable, cyclopentanone, γ-butyrolactone, dimethyl sulfoxide, PGMEA, or PGME is more preferable, and cyclohexanone or PGMEA is still more preferable.

In a case where the rinsing liquid contains an organic solvent, the content of the organic solvent in the rinsing liquid is preferably 50% by mass or more, the content of the organic solvent is more preferably 70% by mass or more, and the content of the organic solvent is still more preferably 90% by mass or more. In addition, 100% by mass of the rinsing liquid may be an organic solvent.

The rinsing liquid may further contain another component.

Examples of the other component include a known surfactant and a known defoamer.

[Method of Supplying Rinsing Liquid]

The method of supplying a rinsing liquid is not particularly limited as long as a desired pattern can be formed and includes a method of immersing a base material in a rinsing liquid, forming a puddle of a rising liquid on the base material, a method of supplying a rinsing liquid to a base material with a shower, and a method of continuously supplying a rinsing solution onto a base material by means such as a straight nozzle.

From the viewpoint of the permeability of the rinsing liquid, the removability of non-image area, and the manufacturing efficiency, there is a method of supplying a rinsing liquid with a shower nozzle, a straight nozzle, a spray nozzle, or the like, and a method of continuously supplying a rinsing liquid with a spray nozzle is preferable. From the viewpoint of the permeability of the rinsing liquid into the image area, a method of supplying a rinsing liquid with a spray nozzle is more preferable. The kind of nozzle is not particularly limited, and examples thereof include a straight nozzle, a shower nozzle, and a spray nozzle.

That is, the rinsing step is preferably a step of supplying, with a straight nozzle, or continuously supplying a rinsing liquid to the film after the exposure, and it is more preferably a step of supplying a rinsing liquid with a spray nozzle.

In addition, in the method of supplying a rinsing liquid in the rinsing step, a step of continuously supplying a rinsing liquid to a base material, a step of keeping a rinsing liquid in a substantially stationary state on a base material, a step of vibrating a rinsing liquid on the base material by ultrasonic waves or the like, and a step obtained by combining these steps can be adopted.

<<Second Exposure Step>>

The method of manufacturing a cured film according to the embodiment of the present invention includes a second exposure step of exposing the pattern with light including light having a wavelength different from a wavelength of light used in the first exposure step.

In the second exposure step, it is conceived that the photosensitive compound B is photosensitized, and the film hardness and the solvent resistance of the cured film are improved.

For example, in a case where the photosensitive compound B is a photoradical polymerization initiator, it is conceived that radically polymerizable groups contained in the crosslinking agent, the specific resin, or the like are polymerized, and thus the film hardness and the solvent resistance of the cured film are improved.

In addition, for example, in a case where the photosensitive compound B is a photoacid generator, it is conceived that crosslinkable groups contained in the crosslinking agent, the specific resin, or the like are polymerized, and thus the film hardness and the solvent resistance of the cured film are improved.

Further, for example, in a case where the photosensitive compound B is a photobase generator, it is conceived that crosslinkable groups contained in the crosslinking agent, the specific resin, or the like are polymerized, and thus the film hardness and the solvent resistance of the cured film are improved.

In the first aspect of the method of manufacturing a cured film according to the embodiment of the present invention, it is sufficient that the exposure light in the second exposure step includes light having a wavelength at which the photosensitive compound B has a sensitivity, and the exposure light may further include light having a wavelength at which the photosensitive compound A has a sensitivity.

In the second aspect of the method of manufacturing a cured film according to the embodiment of the present invention, it is sufficient that the exposure light in the second exposure step includes light having a wavelength in the vicinity of the maximum absorption wavelength of the photosensitive compound B (for example, a wavelength within a range of the maximum absorption wavelength of the photosensitive compound B±10 nm), and the exposure light may further include light having a wavelength in the vicinity of the maximum absorption wavelength of the photosensitive compound A (for example, a wavelength within a range of the maximum absorption wavelength of the photosensitive compound A±10 nm).

That is, in the second exposure step, the photosensitive compound A may be photosensitized or may not be photosensitized.

In a case where the photocurable film is a negative type photocurable film, the exposure light in the second exposure step preferably includes light having a wavelength at which the photosensitive compound A is photosensitized, from the viewpoint of the film hardness and the solvent resistance of the cured film to be obtained.

For example, in a case where the photosensitive compound A is a photoradical polymerization initiator, the photosensitive compound B is an acid generator, and the photosensitive compound A is photosensitized in addition to the photosensitive compound B in the second exposure step, not only the crosslinking due to the acid but also the radical polymerization further proceeds, and thus it is conceived that the film hardness and the solvent resistance of the cured film to be obtained are further improved.

As described above, in a case where the exposure light in the second exposure step further includes light having a wavelength by which the photosensitive compound A is photosensitized, a cured film having excellent film hardness and solvent resistance may be obtained.

In the first aspect of the method of manufacturing a cured film according to the embodiment of the present invention, the light having a wavelength at which the photosensitive compound B has a sensitivity and which is included in the exposure light in the second exposure step may be appropriately set in consideration of the sensitivity of photosensitive compound B described later; however, it is preferably 190 to 1,000 nm, more preferably 200 to 550 nm, and still more preferably 200 to 280 nm.

In the first aspect of the method of manufacturing a cured film according to the embodiment of the present invention, the light having a wavelength at which the photosensitive compound A has a sensitivity and which may be included in the exposure light in the second exposure step may be appropriately set in consideration of the sensitivity of photosensitive compound A described later; however, it is preferably 190 to 1,000 nm, more preferably 240 to 550 nm, and still more preferably 300 to 380 nm.

In the second aspect of the method of manufacturing a cured film according to the embodiment of the present invention, the exposure wavelength in the second exposure step may appropriately set to a wavelength which is in the vicinity of the maximum absorption wavelength of the photosensitive compound B described later (for example, a wavelength within a range of the maximum absorption wavelength of the photosensitive compound B±10 nm); however, it is preferably 190 to 1,000 nm, more preferably 200 to 550 nm, and still more preferably 200 to 280 nm.

In the second aspect of the method of manufacturing a cured film according to the embodiment of the present invention, the exposure light in the second exposure step may include light having a wavelength which is in the vicinity of the maximum absorption wavelength of the photosensitive compound A described later (for example, a wavelength within a range of the maximum absorption wavelength of the photosensitive compound A±10 nm). The wavelength of such light may be appropriately set in consideration of the maximum absorption wavelength of the photosensitive compound A; however, it is preferably 190 to 1,000 nm, more preferably 240 to 550 nm, and still more preferably 300 to 380 nm.

Examples of the exposure wavelength, which are mentioned in the relationship with the light source, include (1) a semiconductor laser (wavelength: 830 nm, 532 nm, 488 nm, 405 nm, or the like); (2) a metal halide lamp; (3) a high-pressure mercury lamp, a g-line (wavelength: 436 nm), an h-line (wavelength: 405 nm), an i-line (wavelength: 365 nm), or Broad (three wavelengths of the g, h, and i-line); (4) an excimer laser, a KrF excimer laser (wavelength: 248 nm), an ArF excimer laser (wavelength: 193 nm), or an $F_2$ excimer laser (wavelength: 157 nm); (5) an extreme ultraviolet (EUV) ray (wavelength: 13.6 nm); (6) an electron beam; (7) a second harmonic wave of 532 nm and a third harmonic wave of 355 nm of a YAG laser. In the method of manufacturing a cured film according to the embodiment of the present invention, exposure with a high-pressure mercury lamp is particularly preferable.

An optical filter or the like that removes specific wavelengths in these light sources may be used in order to suppress the photosensitization of the photosensitive compound A in the second exposure step. However, in order to promote the photosensitization of the photosensitive compound A in the second exposure step, it is preferable to use, for example, the above high-pressure mercury lamp or the like, which is a light source including light having various wavelengths within a wavelength range of 200 to 600 nm, without using a particular optical filter or the like.

In the second exposure step, it is sufficient that at least a part of the pattern obtained in the development step is exposed; however, it is preferable that the whole of the pattern is exposed.

In the first aspect of the method of manufacturing a cured film according to the embodiment of the present invention, the exposure amount in the second exposure step is preferably 100 to 20,000 $mJ/cm^2$ and more preferably 200 to 15,000 $mJ/cm^2$ in terms of exposure energy at the wavelength at which the photosensitive compound B has a sensitivity.

In the second aspect of the method of manufacturing a cured film according to the embodiment of the present invention, the exposure amount in the second exposure step is preferably 100 to 20,000 $mJ/cm^2$ and more preferably 200 to 15,000 $mJ/cm^2$ in terms of exposure energy at the maximum absorption wavelength of the photosensitive compound B.

From the viewpoint of the pattern shape, the film hardness, and the solvent resistance of the cured film to be obtained, the temperature of the photocurable film in the second exposure step is preferably 20° C. to 170° C., more preferably 30° C. to 150° C., and still more preferably 50° C. to 130° C.

The film thickness of the cured film to be obtained in the second exposure step can be set to, for example, 0.5 μm or more, and can be set to 1 μm or more. In addition, the upper limit value thereof can be set to 100 μm or less or can be set to 40 μm or less.

<Heating Step>

From the viewpoint of shortening time and saving energy involved in the manufacturing method, the method of manufacturing a cured film according to the embodiment of the present invention preferably does not include a step (a heating step) of heating the pattern obtained in the development step.

Specifically, from the viewpoint of improving the pattern shape, it is preferable not to include a step of heating the pattern at 200° C. or higher after the development step, and it is more preferable not to include a step of heating the pattern at 160° C. or higher.

In a case where the heating step is included, the heating is preferably carried out at a temperature elevation rate of 1° C. to 12° C./min from the temperature at the start of heating to the maximum heating temperature, more preferably 2° C. to 10° C./min, and still more preferably 3° C. to 10° C./min. In a case where the above temperature elevation rate is set to 1° C./min or higher, excessive volatilization of the acid or solvent can be prevented while securing productivity, and in a case where the above temperature elevation rate is to 12° C./min or lower, residual stress of the pattern can be relieved.

In addition, in a case of an oven with which rapid heating is possible, the heating is preferably carried out at a temperature elevation rate of 1° C. to 8° C./sec from the temperature at the start of heating to the maximum heating temperature, more preferably 2° C. to 7° C./sec, and still more preferably 3° C. to 6° C./sec.

In a case where the heating step is included, the heating time (the heating time at the maximum heating temperature) is preferably 30 sec to 360 minutes, more preferably 45 sec to 300 minutes, and still more preferably 1 minute to 240 minutes.

It is preferable that the heating step is carried out in an atmosphere of low oxygen concentration by allowing an inert gas such as nitrogen, helium, argon, or the like to flow, from the viewpoint of preventing the decomposition of the specific resin. The oxygen concentration is preferably 50 ppm (volume ratio) or less, and more preferably 20 ppm (volume ratio) or less.

The heating unit in the heating step is not particularly limited, and examples thereof include a hot plate, an electric heating oven, and a hot air oven.

<Metal Layer Forming Step>

The method of manufacturing a cured film according to the embodiment of the present invention preferably includes a metal layer forming step of forming a metal layer on the surface of the cured film after the second exposure step.

As the metal layer, while existing metal kinds can be used without particular limitation, copper, aluminum, nickel, vanadium, titanium, chromium, cobalt, gold, and tungsten are exemplified, copper and aluminum are more preferable, and copper is still more preferable.

The method of forming the metal layer is not particularly limited, and the existing method can be applied. For example, the methods disclosed in JP2007-157879A, JP2001-521288A, JP2004-214501A, and JP2004-101850A can be used. For example, photolithography, lift-off, electrolytic plating, electroless plating, etching, printing, and a method obtained by combining these may be conceivable. More specific examples thereof include a patterning method obtained by combining sputtering, photolithography, and etching, and a patterning method obtained by combining photolithography and electrolytic plating.

The thickness in the thickest portion of the metal layer is preferably 0.01 to 100 μm, more preferably 0.1 to 50 μm, and still more preferably 1 to 10 μm.

<Use Application>

As a field to which the cured film obtained by the method of manufacturing a cured film according to the embodiment of the present invention can be applied, an insulating film of a semiconductor device, an interlayer insulating film for a re-distribution layer, a stress buffer film, and the like are mentioned. In addition, a sealing film, a base material material (a base film or cover lay of a flexible print substrate, an interlayer insulating film), or an insulating film applicable for mounting as described above, which is patterned by etching is mentioned. For these use applications, for example, Science & Technology Co., Ltd., "High functionality and applied technology of polyimide" April 2008, CMC Technical library "Basics and development of polyimide materials" supervised by Masaaki Kakimoto, published in November 2011, "Latest Polyimide Basics and Applications" edited by Japan Polyimide & Aromatic Polymers Study Group, NTS Inc, August 2010, or the like can be referred to.

In addition, the cured film obtained by the method of manufacturing a cured film according to the embodiment of the present invention can also be used for the production of board surfaces such as an offset board surface or a screen board surface, for etching of molded parts, for the production of protective lacquers and dielectric layers in electronics, in particular, microelectronics, and the like.

(Method of Manufacturing Laminate)

The method of manufacturing a laminate according to the embodiment of the present invention preferably includes a method of manufacturing a cured film according to the embodiment of the present invention.

The laminate obtained by the method of manufacturing a laminate according to the embodiment of the present invention is a laminate including two or more cured films, and it may be a laminate in which 3 to 7 layers are laminated.

At least one of the two or more cured films included in the laminate is a cured film obtained by the method of manufacturing a cured film according to the embodiment of the present invention, and from the viewpoint of improving the pattern shape of the cured film, all of the cured films included in the above laminate are preferably cured films obtained by the method of manufacturing a cured film according to the embodiment of the present invention.

In the above laminate, an aspect in which two or more layers of the cured films are included and a metal layer is provided between any cured films is preferable. The metal layer is preferably formed in the metal layer forming step.

Examples of the preferred laminate include a laminate including at least a layer structure in which three layers of a first cured film, a metal layer, and a second cured film are laminated in order.

Both the first cured film and the second cured film are preferably cured films obtained by the method of manufacturing a cured film according to the embodiment of the present invention. The photocurable resin composition according to the embodiment of the present invention that is used for forming the first cured film and the photocurable resin composition according to the embodiment of the present invention that is used for forming the second cured film may have the same composition or may have compositions different from each other. The metal layer in the laminate according to the embodiment of the present invention is preferably used as the metal wire of the re-distribution layer or the like.

<Laminating Step>

The method of manufacturing a laminate according to the embodiment of the present invention preferably further includes a laminating step.

The laminating step is a series of steps including carrying out again the following steps in order on the surface of the cured film (the resin layer) or the metal layer; (a) film forming step (layer forming step), (b) first exposure step, (c) development step, and (d) second exposure step. However, the aspect may be such that only the (a) film forming step is repeated. In addition, (e) metal layer forming step may be included after the (d) second exposure step. Further, the laminating step may appropriately include the above-described drying step, heating step, and the like.

In a case where another laminating step is further carried out after the laminating step, a surface activation treatment step may be further carried out after the first exposure step, after the second exposure step, or after the metal layer forming step. Examples of the surface activation treatment include plasma treatment.

The laminating step is preferably carried out 2 to 20 times, more preferably 2 to 5 times, and still more preferably 3 to 5 times.

For example, like a configuration such as a resin layer/a metal layer/a resin layer/a metal layer/a resin layer/a metal layer, a configuration having resin layers of 2 or more layers and 20 or fewer layers is preferable, a configuration having resin layers of 3 or more layers and 7 or fewer layers is more preferable, and a configuration having resin layers of 3 or more layers and 5 or fewer layers is still more preferable.

In the present invention, an aspect in which after a metal layer is provided, further a cured film (a resin layer) of the photocurable resin composition is formed to cover the metal layer is particularly preferable. Specific examples thereof include an aspect in which the (a) film forming step, the (b) first exposure step, the (c) development step, the (d) second exposure step, and the (e) metal layer forming step are repeated in this order. In a case where the steps (a) to (d), which are steps for forming a cured film, and the metal layer forming step are carried out alternately, it is possible to alternately laminate the cured film and the metal layer.

(Surface Activation Treatment Step)

The method of manufacturing a laminate according to the embodiment of the present invention may include a surface activation treatment step of subjecting at least a part of the metal layer or a part of the photosensitive resin composition layer to surface activation treatment.

The surface activation treatment step is usually carried out after the metal layer forming step. However, after the exposure development step, the metal layer forming step may be carried out after the photosensitive resin composition layer is subjected to the surface activation treatment step.

At least a part of the metal layer may be subjected to the surface activation treatment, at least a part of the photosensitive resin composition layer after the exposure may be subjected to the surface activation treatment, or both at least a part of the metal layer and at least a part of the photosensitive resin composition layer after the exposure may be subjected to the surface activation treatment. It is preferable to carry out the surface activation treatment on at least a part of the metal layer, and it is more preferable to carry out the surface activation treatment on a part or the whole of the region of the metal layer having a surface on which the photosensitive resin composition layer is formed. In a case where a surface of the metal layer is subjected to the surface activation treatment in this manner, it is possible to improve the adhesiveness to the resin layer to be provided on the surface thereof.

In addition, it is preferable that the surface activation treatment is carried out on a part or the whole of the photosensitive resin composition layer (the resin layer) after the exposure. In a case where a surface of the photosensitive resin composition layer is subjected to the surface activation treatment in this manner, it is possible to improve the adhesiveness to the metal layer or resin layer to be provided on the surface that has been subjected to the surface activation treatment.

Specifically, the surface activation treatment is selected from plasma treatment of various raw material gases (oxygen, hydrogen, argon, nitrogen, nitrogen/hydrogen mixed gas, argon/oxygen mixed gas, and the like), corona discharge treatment, etching treatment with $CF_4/O_2$, $NF_3/O_2$, $SF_6$, $NF_3$, or $NF_3/O_2$, surface treatment with an ultraviolet ray (UV) ozone method, immersion treatment in an organic surface treatment agent including a compound having at least one of an amino group or a thiol group after immersion in a hydrochloric acid aqueous solution to remove the oxide film, and mechanical roughening treatment using a brush. It is preferably plasma treatment and particularly preferably oxygen plasma treatment using oxygen as the raw material gas. In a case of corona discharge treatment, the energy is preferably 500 to 200,000 $J/m^2$, more preferably 1,000 to 100,000 $J/m^2$, and most preferably 10,000 to 50,000 $J/m^2$.

(Method of Manufacturing Electronic Device)

The present invention also discloses a method of manufacturing a semiconductor device, which includes the method of manufacturing a cured film according to the embodiment of the present invention or the method of manufacturing a laminate according to the embodiment of the present invention. As the specific example of the semiconductor device using the photocurable resin composition according to the embodiment of the present invention for forming an interlayer insulating film for a re-distribution layer, the description in paragraphs 0213 to 0218 and the description of FIG. 1 of JP2016-027357A can be referred to, the content of which is incorporated in the present specification.

Hereinafter, the details of the photocurable resin composition that is used in the method of manufacturing a cured film according to the embodiment of the present invention, the method of manufacturing a laminate according to the embodiment of the present invention, or the method of manufacturing a semiconductor device according to the embodiment of the present invention will be described.

(Photocurable Resin Composition)

The photocurable resin composition according to the embodiment of the present invention is a photocurable resin composition that is used in the method of manufacturing a cured film according to the embodiment of the present invention, the method of manufacturing a laminate according to the embodiment of the present invention, or the method of manufacturing a semiconductor device according to the embodiment of the present invention will be described.

The first aspect of the photocurable resin composition according to the embodiment of the present invention contains at least one resin selected from the group consisting of polyimide and polybenzoxazole, a photosensitive compound A having a sensitivity to an exposure wavelength in the first exposure step, and a photosensitive compound B having no sensitivity to the exposure wavelength in the first exposure step and having a sensitivity to an exposure wavelength in the second exposure step, where the photosensitive compound A is a compound that changes a solubility of the photocurable film in the developing solution in the first exposure step, and at least one of the following condition 1 or condition 2 is satisfied.

The second aspect of the photocurable resin composition according to the embodiment of the present invention contains at least one resin selected from the group consisting of polyimide and polybenzoxazole, and a photosensitive compound A and photosensitive compound B, between which a maximum absorption wavelength difference is 80 nm or more, where the photosensitive compound A is a compound that changes a solubility of the photocurable film in the developing solution in the first exposure step and at least one of the following condition 1 or condition 2 is satisfied, and is photocurable resin composition that is provided for a method of manufacturing a cured film, which includes a first exposure step of exposing a part of a photocurable film formed from a photocurable resin composition, a development step of developing the photocurable film after the exposure with a developing solution to obtain a pattern, and a second exposure step of exposing the pattern with light including light having a wavelength different from a wavelength of light used in the first exposure step.

the condition 1: the resin in the photocurable resin composition contains a group in which a bonding reaction with another group is promoted due to photosensitization of the photosensitive compound B in the second exposure step, the condition 2: the photocurable resin composition further contains a crosslinking agent having a group in which a bonding reaction with another group is promoted due to photosensitization of the photosensitive compound B in the second exposure step.

The combination of the photosensitive compound A and the photosensitive compound B in the photocurable resin composition according to the embodiment of the present invention is preferably any of the following aspects 1 to 7.

The aspect 1: the photosensitive compound A is a photoradical polymerization initiator and the photosensitive compound B is a photoacid generator.

The aspect 2: both the photosensitive compound A and the photosensitive compound B are a photoradical polymerization initiator.

The aspect 3: the photosensitive compound A is a photoradical polymerization initiator and the photosensitive compound B is a photobase generator.

The aspect 4: the photosensitive compound A is a photoacid generator and the photosensitive compound B is a photoradical polymerization initiator.

The aspect 5: the photosensitive compound A is a photobase generator and the photosensitive compound B is a photoradical polymerization initiator.

The aspect 6: both the photosensitive compound A and the photosensitive compound B are a photoacid generator.

The aspect 7: both the photosensitive compound A and the photosensitive compound B are a photobase generator.

Among these, any one of the aspects 1 to 4 is preferable from the viewpoint of pattern resolution.

The aspect 1 is preferable from the viewpoint of pattern rectangularity.

The aspect 6 is preferable from the viewpoint of solvent resistance.

The aspect 4 is preferable from the viewpoint of the film hardness of the cured film to be obtained.

The aspect 4 is preferable from the viewpoint of enabling positive type development of the photocurable film.

The aspect 2 is preferable from the viewpoint that the robustness (the tolerance) with respect to the exposure amount is good.

Aspect 1

In the aspect 1, it is preferable that the photocurable resin composition further contains a radical crosslinking agent described later and another crosslinking agent described later.

In addition, in the aspect 1, the specific resin contained in the photocurable resin may have or may not have a crosslinkable group described later. The crosslinkable group may be a radically polymerizable group described later or another crosslinkable group described later.

In addition, the photosensitive compound B in the aspect 1 is preferably an onium salt compound or a sulfonate compound described later.

In a case where the photocurable resin composition according to the aspect 1 is used in the method of manufacturing a cured film according to the embodiment of the present invention, radical polymerization is promoted in the exposed portions in the first exposure step, and crosslinking due to the acid is promoted in the exposed portions in the second exposure step.

Aspect 2

In the aspect 2, it is preferable that the photocurable resin composition further contains a radical crosslinking agent described later.

In addition, in the aspect 2, the specific resin contained in the photocurable resin may have or may not have a crosslinkable group described later. The above crosslinkable group is preferably a radically polymerizable group described later.

In a case where the photocurable resin composition according to the aspect 2 is used in the method of manufacturing a cured film according to the embodiment of the present invention, radical polymerization is promoted in the exposed portions in the first exposure step, and radical polymerization is promoted in the exposed portions in the second exposure step as well.

Aspect 3

In the aspect 3, it is preferable that the photocurable resin composition further contains a radical crosslinking agent described later and another crosslinking agent described later.

The above other crosslinking agent is preferably an epoxy compound.

In addition, in the aspect 3, the specific resin contained in the photocurable resin may have or may not have a crosslinkable group described later. The above crosslinkable group is preferably a radically polymerizable group described later or an epoxy group.

In a case where the photocurable resin composition according to the aspect 3 is used in the method of manufacturing a cured film according to the embodiment of the present invention, radical polymerization is promoted in the exposed portions in the first exposure step, and crosslinking due to the base is promoted in the exposed portions in the second exposure step.

Aspect 4

In the aspect 4, it is preferable that the photocurable resin composition further contains a radical crosslinking agent described later.

In addition, in the aspect 4, the specific resin contained in the photocurable resin may have or may not have a crosslinkable group described later. The above crosslinkable group is preferably a radically polymerizable group described later.

In addition, the photosensitive compound A in the aspect 4 is preferably a quinone diazide compound described later.

In a case where the photocurable resin composition according to the aspect 4 is used in the method of manufacturing a cured film according to the embodiment of the present invention, the solubility of the exposed portions in the developing solution is changed due to the generation of the acid in the exposed portions in the first exposure step, and radical polymerization is promoted in the exposed portions in the second exposure step.

In addition, in a case where a photoacid generator, which is the photosensitive compound A, and a crosslinking agent are appropriately selected, it can be designed so that crosslinking due to the acid is promoted in the exposed portions in the first exposure step, and radical polymerization is promoted in the exposed portions in the second exposure step.

Aspect 5

In the aspect 5, it is preferable that the photocurable resin composition further contains a radical crosslinking agent described later and another crosslinking agent described later.

In addition, in the aspect 5, the specific resin contained in the photocurable resin may have or may not have a crosslinkable group described later. The crosslinkable group may be a radically polymerizable group described later or another crosslinkable group described later.

In a case where the photocurable resin composition according to the aspect 5 is used in the method of manufacturing a cured film according to the embodiment of the present invention, crosslinking due to the base is promoted in the exposed portions in the first exposure step, and radical polymerization is promoted in the exposed portions in the second exposure step.

Aspects 6 and 7

In the aspect 6 or the aspect 7, it is preferable that the photocurable resin composition further contains another crosslinking agent described later.

In addition, in the aspect 6 or the aspect 7, the specific resin contained in the photocurable resin may have or may not have a crosslinkable group described later. The crosslinkable group is preferably another crosslinkable group described later.

In a case where the photocurable resin composition according to the aspect 6 is used in the method of manufacturing a cured film according to the embodiment of the present invention, crosslinking due to the acid is promoted in the exposed portion in the first exposure step, and crosslinking due to the acid is promoted in the exposed portion in the second exposure step as well.

In a case where the photocurable resin composition according to the aspect 7 is used in the method of manufacturing a cured film according to the embodiment of the present invention, crosslinking due to the generation of the base is promoted in the exposed portions in the first exposure step, and crosslinking due to the generation of the base is promoted in the exposed portions in the second exposure step.

Hereinafter, details of each component contained in the photocurable resin composition according to the embodiment of the present invention will be described.

<Specific Resin>

The photocurable resin composition according to the embodiment of the present invention contains at least one resin (a specific resin) selected from the group consisting of polyimide and polybenzoxazole.

The photocurable resin composition according to the embodiment of the present invention preferably contains polyimide as the specific resin.

[Polyimide]

The polyimide that is used in the present invention is preferably a polyimide that is soluble in the developing solution described above.

In a case where the developing solution is an alkaline developing solution, the polyimide is preferably an alkali-soluble polyimide, and in a case where the developing solution is an organic solvent, the polyimide is preferably a polyimide soluble in an organic solvent.

The polyimide "soluble in the developing solution" refers to a polyimide, 0.1 g or more of which is dissolved at 23° C. in 100 g of a developing solution, and from the viewpoint of pattern formation properties, it is preferably a polyimide, 0.5 g or more of which is dissolved therein and more preferably a polyimide, 1.0 g or more of which is dissolved therein. The upper limit of the dissolution amount is not particularly limited; however, it is preferably 100 g or less.

In addition, in a case where the polyimide is an alkali-soluble polyimide, it is preferably a polyimide, 0.1 g or more of which is dissolved at 23° C. in 100 g of a 2.38% by mass tetramethylammonium hydroxide solution, and from the viewpoint of pattern formation properties, it is preferably a polyimide, 0.5 g or more of which is dissolved therein and still more preferably a polyimide, 1.0 g or more of which is dissolved therein. The upper limit of the dissolution amount is not particularly limited; however, it is preferably 100 g or less.

In addition, the polyimide is preferably a polyimide having a plurality of imide structures in the main chain from the viewpoint of the film hardness and the insulating properties of the cured film to be obtained.

In the present specification, the "main chain" refers to the relatively longest bonding chain in the molecule of the polymer compound that constitutes the resin, and the "side chain" refers to other bonding chains other than the main chain.

—Fluorine Atom—

From the viewpoint of the film hardness of the cured film to be obtained, the polyimide preferably has a fluorine atom.

The fluorine atom is preferably contained in, for example, $R^{132}$ in a repeating unit represented by Formula (4) described later or $R^{131}$ in a repeating unit represented by Formula (4) described later, and it is more preferably contained, as a fluorinated alkyl group, in $R^{132}$ in a repeating unit represented by Formula (4) described later or $R^{131}$ in a repeating unit represented by Formula (4) described later.

The amount of the fluorine atom with respect to the total mass of the polyimide is preferably 1 to 50 mol/g and more preferably 5 to 30 mol/g.

—Silicon Atom—

From the viewpoint of the film hardness of the cured film to be obtained, the polyimide preferably has a silicon atom.

The silicon atom is preferably contained in, for example, $R^{131}$ in a repeating unit represented by Formula (4) described later, and more preferably contained in $R^{131}$ in a repeating unit represented by Formula (4) described later as an organically modified (poly)siloxane structure.

In addition, the silicon atom or the organically modified (poly)siloxane structure may be contained in the side chain of the polyimide; however, it is preferably contained in the main chain of the polyimide.

The amount of the silicon atom with respect to the total mass of the polyimide is preferably 0.01 to 5 mol/g and more preferably 0.05 to 1 mol/g.

—Ethylenically Unsaturated Bond—

From the viewpoint of the film hardness of the cured film to be obtained, the polyimide preferably has an ethylenically unsaturated bond.

The polyimide preferably has an ethylenically unsaturated group as the radically polymerizable group.

The group having the ethylenically unsaturated bond in the polyimide may be a group in which the bonding reaction with another group is promoted by the photosensitization of the photosensitive compound B in the second exposure step under the condition 1 described above.

In addition, the group having the ethylenically unsaturated bond in the polyimide may be a group in which the bonding reaction with another group is promoted by the photosensitization of the photosensitive compound A in the first exposure step.

The polyimide may have an ethylenically unsaturated bond at the terminal of the main chain or the side chain; however, it preferably has an ethylenically unsaturated bond at the side chain.

The ethylenically unsaturated bond preferably has radical polymerizability.

The ethylenically unsaturated bond is preferably contained in $R^{132}$ in a repeating unit represented by Formula (4) described later or $R^{131}$ in a repeating unit represented by Formula (4) described later, and it is more preferably contained, as a group having an ethylenically unsaturated bond, in $R^{132}$ in a repeating unit represented by Formula (4) described later or $R^{131}$ in a repeating unit represented by Formula (4) described later.

Among the above, the ethylenically unsaturated bond is preferably contained in $R^{131}$ in a repeating unit represented by Formula (4) described later, and it is more preferably contained, as a group having an ethylenically unsaturated bond, in $R^{131}$ in a repeating unit represented by Formula (4) described later.

Examples of the group having an ethylenically unsaturated bond include a group having a vinyl group which may be substituted, which is directly bonded to an aromatic ring such as a vinyl group, an allyl group, or a vinylphenyl group, a (meth)acrylamide group, a (meth)acryloyloxy group, and a group represented by Formula (III).

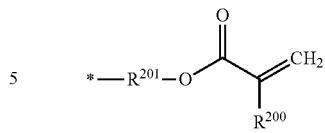

In Formula (III), $R^{200}$ represents a hydrogen atom or a methyl group, and it is preferably a methyl group.

In Formula (III), $R^{201}$ represents an alkylene group having 2 to 12 carbon atoms, —O—$CH_2CH(OH)CH_2$—, —C(=O)O—, —O(C=O)NH—, a (poly)oxyalkylene group having 2 to 30 carbon atoms (the alkylene group preferably has 2 to 12 carbon atoms, more preferably 2 to 6 carbon atoms, and particularly preferably 2 or 3 carbon atoms; the number of repetitions thereof is preferably 1 to 12, more preferably 1 to 6, and particularly preferably 1 to 3), or a group obtained by combining two or more of these.

The (poly)oxyalkylene group means an oxyalkylene group or a polyoxyalkylene group.

Among the above, $R^{201}$ is preferably a group represented by any one of Formulae (R1) to (R3) and more preferably a group represented by Formula (R1).

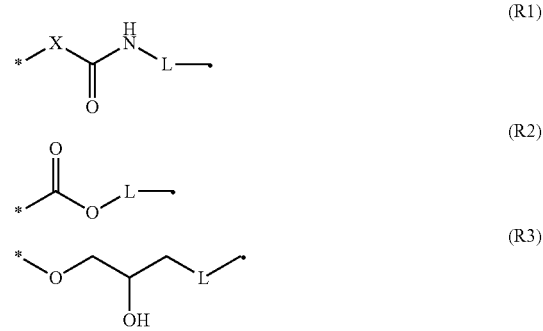

In Formulae (R1) to (R3), L represents a single bond, an alkylene group having 2 to 12 carbon atoms, a (poly)oxyalkylene group having 2 to 30 carbon atoms, or a group obtained by bonding two or more of these, X represents an oxygen atom or a sulfur atom, * represents a bonding site to another structure, and ● represents a bonding site to an oxygen atom to which $R^{201}$ in Formula (III) is bonded.

In Formulae (R1) to (R3), a preferred aspect of the alkylene group having 2 to 12 carbon atoms in L or the (poly)oxyalkylene group having 2 to 30 carbon atoms is the same as the preferred aspect of the alkylene group having 2 to 12 carbon atoms or the (poly)oxyalkylene group having 2 to 30 carbon atoms as $R^{201}$ described above.

In Formula (R1), X is preferably an oxygen atom.

In Formulae (R1) to (R3), * is synonymous with * in Formula (III), and the same applies to the preferred aspect thereof.

The structure represented by Formula (R1) is obtained, for example, by reacting a polyimide having a hydroxy group such as a phenolic hydroxy group with a compound (for example, 2-isocyanatoethyl methacrylate) having an isocyanato group and an ethylenically unsaturated bond.

The structure represented by Formula (R2) is obtained, for example, by reacting a polyimide having a carboxy group with a compound (for example, 2-hydroxyethyl methacrylate) having a hydroxy group and an ethylenically unsaturated bond.

The structure represented by Formula (R3) is obtained, for example, by reacting a polyimide having a hydroxy group such as a phenolic hydroxy group with a compound (for example, glycidyl methacrylate) having a glycidyl group and an ethylenically unsaturated bond.

The polyalkyleneoxy group is preferably a polyethyleneoxy group, a polypropyleneoxy group, a polytrimethyleneoxy group, a polytetramethyleneoxy group, or a group obtained by bonding a plurality of ethyleneoxy groups with a plurality of propyleneoxy groups, more preferably a polypropyleneoxy group or a polyethyleneoxy group, and still more preferably an polyethyleneoxy group, from the viewpoint of solvent solubility and solvent resistance. In the group obtained by bonding a plurality of ethyleneoxy groups with a plurality of propyleneoxy groups, the ethyleneoxy groups and the propyleneoxy groups may be randomly arranged, may be arranged by forming a block, or may be arranged in an alternately patterned manner or the like. The preferred aspect of the number of repetitions of the ethyleneoxy group and the like in these groups is as described above.

In Formula (III), * represents a bonding site to another structure, and it is preferably a bonding site to the main chain of the polyimide.

The amount of the ethylenically unsaturated bond with respect to the total mass of the polyimide is preferably 0.05 to 10 mol/g and more preferably 0.1 to 5 mol/g. In addition, from the viewpoint of manufacturing suitability, the amount of the ethylenically unsaturated bond with respect to the total mass of the polyimide is preferably 0.0001 to 0.1 mol/g and more preferably 0.0005 to 0.05 mol/g.

—Crosslinkable Group Other than Ethylenically Unsaturated Bond—

The polyimide may have a crosslinkable group (another crosslinkable group) other than the ethylenically unsaturated bond.

The crosslinkable group other than the ethylenically unsaturated bond in the polyimide may be a group in which the bonding reaction with another group is promoted by the photosensitization of the photosensitive compound B in the second exposure step under the condition 1 described above.

In addition, the crosslinkable group other than the ethylenically unsaturated bond in the polyimide may be a group in which the bonding reaction with another group is promoted by the photosensitization of the photosensitive compound A in the first exposure step.

Examples of the crosslinkable group other than the ethylenically unsaturated bond include a cyclic ether group such as an epoxy group or an oxetanyl group, an alkoxymethyl group such as a methoxymethyl group, and a methylol group.

The crosslinkable group other than the ethylenically unsaturated bond is preferably contained in, for example, $R^{131}$ in a repeating unit represented by Formula (4) described later.

The amount of the crosslinkable group other than the ethylenically unsaturated bond with respect to the total mass of the polyimide is preferably 0.05 to 10 mol/g and more preferably 0.1 to 5 mol/g.

In addition, from the viewpoint of manufacturing suitability, the amount of the crosslinkable group other than the ethylenically unsaturated bond with respect to the total mass of the polyimide is preferably 0.0001 to 0.1 mol/g and more preferably 0.001 to 0.05 mol/g.

—Polarity Converting Group—

The polyimide may have a polarity converting group such as an acid-decomposable group. The acid-decomposable group is not particularly limited as long as it is decomposed by the action of the acid to generate an alkali-soluble group such as a phenolic hydroxy group or a carboxy group; however, it is preferably an acetal group, a ketal group, a silyl group, or a silyl ether group, a tertiary alkyl ester group, or the like, and from the viewpoint of exposure sensitivity, it is more preferably an acetal group.

Specific examples of the acid-decomposable group include a tert-butoxycarbonyl group, an isopropoxycarbonyl group, a tetrahydropyranyl group, a tetrahydrofuranyl group, an ethoxyethyl group, a methoxyethyl group, an ethoxymethyl group, a trimethylsilyl group, a tert-butoxycarbonylmethyl group, and a trimethylsilyl ether group. From the viewpoint of exposure sensitivity, an ethoxyethyl group or a tetrahydrofuranyl group is preferable.

—Acid Value—

In a case where the polyimide is subjected to alkaline development, the acid value of the polyimide is preferably 30 mgKOH/g or more, more preferably 50 mgKOH/g or more, and still more preferably 70 mgKOH/g or more, from the viewpoint of improving developability.

In addition, the acid value thereof is preferably 500 mgKOH/g or less, more preferably 400 mgKOH/g or less, and still more preferably 200 mgKOH/g or less.

Further, in a case where the polyimide is subjected to the development (for example, the "solvent development" described later) using a developing solution containing an organic solvent as a main component, the acid value of the polyimide is preferably 2 to 35 mgKOH/g, more preferably 3 to 30 mgKOH/g, and still more preferably 5 to 20 mgKOH/g.

The acid value is measured by a known method, for example, by the method described in JTS K0070: 1992.

In addition, the acid group contained in the polyimide is preferably an acid group having a pKa of 0 to 10 and more preferably an acid group having a pKa of 3 to 8 from the viewpoint of achieving both storage stability and developability.

The "pKa" is represented by the negative common logarithm pKa of the equilibrium constant Ka of a dissociation reaction, in a case of assuming that hydrogen ions are released from the acid in the dissociation reaction. In the present specification, unless otherwise specified, pKa is a value calculated by ACD/ChemSketch (registered trade name). Alternatively, the values published in "Handbook of Chemistry, Pure Chemistry, 5th Edition" edited by the Chemical Society of Japan may be referred to.

In addition, in a case where the acid group is a polyvalent acid such as phosphoric acid, the pKa is the first dissociation constant.

As such an acid group, the polyimide preferably contains at least one selected from the group consisting of a carboxy group and a phenolic hydroxy group and more preferably contains a phenolic hydroxy group.

—Phenolic Hydroxy Group—

From the viewpoint of allowing the speed of development with an alkaline developing solution to be proper, the polyimide preferably has a phenolic hydroxy group.

The polyimide may have a phenolic hydroxy group at the terminal of the main chain or the side chain.

The phenolic hydroxy group is preferably contained in, for example, $R^{132}$ in a repeating unit represented by Formula (4) described later or $R^{131}$ in a repeating unit represented by Formula (4) described later.

The amount of the phenolic hydroxy group with respect to the total mass of the polyimide is preferably 0.1 to 30 mol/g and more preferably 1 to 20 mol/g.

—Repeating Unit Represented by Formula (4)—

The polyimide used in the present invention is not particularly limited as long as it is a polymer compound having an imide ring; however, it preferably contains a repeating unit represented by Formula (4), and it is more preferably a compound containing a repeating unit represented by Formula (4) and having a crosslinkable group.

Examples of the crosslinkable group include the above-described group having an ethylenically unsaturated bond and a crosslinkable group other than the above-described ethylenically unsaturated bond.

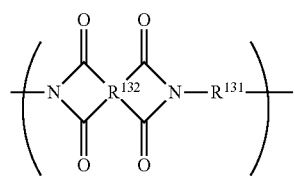

(4)

In Formula (4), $R^{131}$ represents a divalent organic group, and $R^{132}$ represents a tetravalent organic group.

In a case where the polyimide has a crosslinkable group, the crosslinkable group may be located at at least one of $R^{131}$ or $R^{132}$, or may be located at the terminal of the polyimide as shown in Formula (4-1) or Formula (4-2).

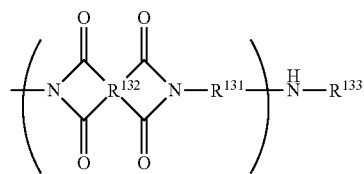

Formula (4-1)

In Formula (4-1), $R^{133}$ is a group having a crosslinkable group, and the other groups are synonymous with those in Formula (4).

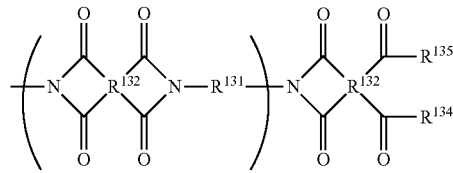

Formula (4-2)

At least one of $R^{134}$ or $R^{135}$ is a group having a crosslinkable group, where $R^{134}$ or R135 is an organic group in a case where it is a group having no crosslinkable group, and the other groups are synonymous with Formula (4).

<<$R^{131}$>>

$R^{131}$ represents a divalent organic group. Examples of the divalent organic group include a group having a linear or branched aliphatic group, a cyclic aliphatic group, or an aromatic group. A linear or branched aliphatic group having 2 to 20 carbon atoms, a cyclic aliphatic group having 6 to 20 carbon atoms, an aromatic group having 6 to 20 carbon atoms, or a group consisting of a combination of these groups is preferable, and a group containing an aromatic group having 6 to 20 carbon atoms is more preferable.

Examples of the particularly preferred embodiment of the present invention include a group represented by —Ar-L-Ar—. However, Ar's are each independently an aromatic group, and L is an aliphatic hydrocarbon group having 1 to 10 carbon atoms, which may be substituted with a fluorine atom, —O—, —CO—, —S—, —SO$_2$—, or —NHCO—, or a group consisting of a combination of two or more of the above. Ar is preferably a phenylene group, and L is preferably an aliphatic hydrocarbon group having 1 or 2 carbon atoms, which may be substituted with a fluorine atom, —O—, —CO—, —S—, or —SO$_2$—. The aliphatic hydrocarbon group here is preferably an alkylene group.

$R^{131}$ is preferably derived from a diamine. Examples of the diamine that is used for producing polyimide include a linear aliphatic or branched aliphatic diamine, a cyclic aliphatic diamine, or an aromatic diamine. One kind of diamine may be used alone, or two or more kinds thereof may be used.

Specifically, the diamine is preferably a diamine containing a linear or branched aliphatic group having 2 to 20 carbon atoms, a cyclic aliphatic group having 6 to 20 carbon atoms, an aromatic group having 6 to 20 carbon atoms, or a group consisting of a combination thereof, and more preferably a diamine containing a group consisting of an aromatic group having 6 to 20 carbon atoms. Examples of the group containing an aromatic group include the following groups. In the following formulae, *'s each independently represent a bonding site to another structure.

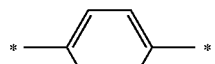

AR-1

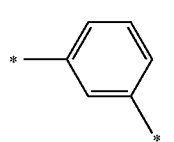

AR-2

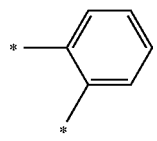

AR-3

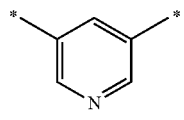

AR-4

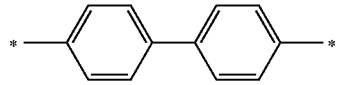

AR-5

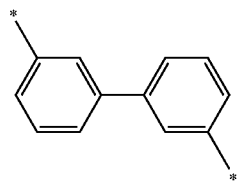

AR-6

-continued

AR-7
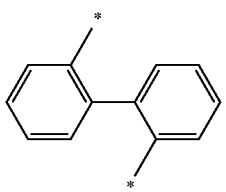

AR-8
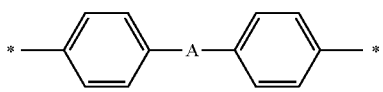

AR-9
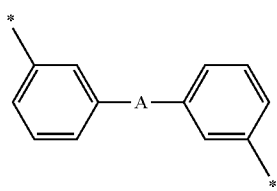

AR-10
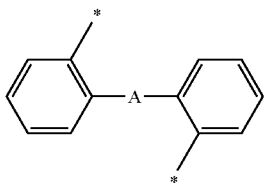

AR-11
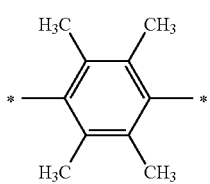

AR-12
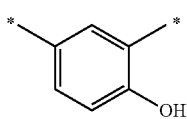

AR-13
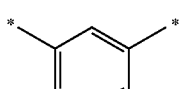

AR-14
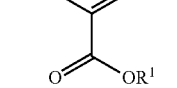

-continued

AR-15
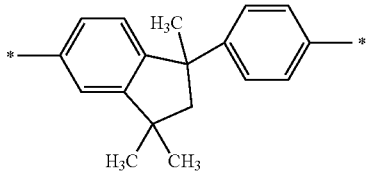

In the formulae, A is preferably a single bond, or an aliphatic hydrocarbon group having 1 to 10 carbon atoms, which may be substituted with a fluorine atom, —O—, —C(=O)—, —S—, —SO$_2$—, —NHCO—, or a group selected from the combinations of these, more preferably a single bond, or a group selected from an alkylene group having 1 to 3 carbon atoms, which may be substituted with a fluorine atom, —O—, —C(=O)—, —S—, —SO$_2$—, and still more preferably a divalent group selected from the group consisting of —CH$_2$—, —O—, —S—, —SO$_2$—, —C(CF$_3$)$_2$—, and —C(CH$_3$)$_2$—.

In the formulae, $R^1$ to $R^3$ each independently represent a hydrogen atom or a substituent, they are preferably a hydrogen atom, a hydrocarbon group, or a group having a crosslinkable group, and more preferably a hydrogen atom, a glycidyl group, or a group represented by Formula (E1).

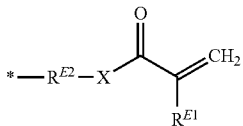

(E1)

In Formula (E1), $R^{E1}$ represents a hydrogen atom or a methyl group and, it is preferably a methyl group.

In Formula (E1), X represents —O— or —NR$^N$—. R$^N$ represents a hydrogen atom or a hydrocarbon group, and it is preferably a hydrogen atom, an alkyl group, or an aromatic hydrocarbon group, and more preferably a hydrogen atom or a methyl group.

In Formula (E1), $R^{E2}$ represents a divalent linking group, and it is preferably an alkylene group having 2 to 12 carbon atoms, —O—CH$_2$CH(OH)CH$_2$—, —C(=O)O—, —O(C=O)NH—, a (poly)oxyalkylene group having 2 to 30 carbon atoms (the alkylene group preferably has 2 to 12 carbon atoms, more preferably 2 to 6 carbon atoms, and particularly preferably 2 or 3 carbon atoms; the number of repetitions thereof is preferably 1 to 12, more preferably 1 to 6, and particularly preferably 1 to 3), or a group obtained by combining two or more of these, and more preferably an alkylene group having 2 to 12 carbon atoms.

In Formula (E1), * represents a bonding site to another structure.

Specific examples of the diamine include at least one diamine selected from 1,2-diaminoethane, 1,2-diaminopropane, 1,3-diaminopropane, 1,4-diaminobutane, or 1,6-diaminohexane; 1,2- or 1,3-diaminocyclopentane, 1,2-, 1,3-, or 1,4-diaminocyclohexane, 1,2-, 1,3-, or 1,4-bis(aminomethyl)cyclohexane, bis-(4-aminocyclohexyl)methane, bis-(3-aminocyclohexyl)methane, 4,4'-diamino-3,3'-dimethylcyclohexylmethane, or isophorone diamine; m- or p-phenylene diamine, diaminotoluene, 4,4'- or 3,3'-diaminobiphenyl, 4,4'-diaminodiphenyl ether, 3,3-diaminodiphenyl ether, 4,4'- or 3,3'-diaminodiphenylmethane, 4,4'- or 3,3'-diaminodiphenyl sulfone, 4,4'- or 3,3'-diaminodiphenyl sulfide, 4,4'- or 3,3'-diaminobenzophenone, 3,3'-dimethyl-4,4'-diaminobiphenyl, 2,2'-dimethyl-4,4'-diaminobiphenyl, 3,3'-dimethoxy-4,4'-diaminobiphenyl, 2,2-bis(4-aminophenyl)propane, 2,2-bis(4-aminophenyl)hexafluoropropane, 2,2-bis(3-hydroxy-4-aminophenyl)propane, 2,2-bis(3-hydroxy-4-aminophenyl)hexafluoropropane, 2,2-bis(3-amino-4-hydroxyphenyl)propane, 2,2-bis(3-amino-4-hydroxyphenyl)hexafluoropropane, bis(3-amino-4-hydroxyphenyl)sulfone, bis(4-amino-3-hydroxyphenyl)sulfone, 4,4'-diaminoparaterphenyl, 4,4-bis(4-aminophenoxy)biphenyl, bis[4-(4-aminophenoxy)phenyl]sulfone, bis[4-(3-aminophenoxy)phenyl]sulfone, bis[4-(2-aminophenoxy)phenyl]sulfone, 1,4-bis(4-aminophenoxy)benzene, 9,10-bis(4-aminophenyl)anthracene, 3,3'-dimethyl-4,4'-diaminodiphenyl sulfone, 1,3-bis(4-aminophenoxy)benzene, 1,3-bis(3-aminophenoxy)benzene, 1,3-bis(4-aminophenyl)benzene, 3,3'-diethyl-4,4'-diaminodiphenylmethane, 3,3'-dimethyl-4,4'-diaminodiphenylmethane, 4,4'-diaminooctafluorobiphenyl, 2,2-bis[4-(4-aminophenoxy)phenyl]propane, 2,2-bis[4-(4-aminophenoxy)phenyl]hexafluoropropane, 9,9-bis(4-aminophenyl)-10-hydroanthracene, 3,3',4,4'-tetraaminobiphenyl, 3,3',4,4'-tetraaminodiphenyl ether, 1,4-diaminoanthraquinone, 1,5-diaminoanthraquinone, 3,3-dihydroxy-4,4'-diaminobiphenyl, 9,9'-bis(4-aminophenyl)fluorene, 4,4'-dimethyl-3,3'-diaminodiphenyl sulfone, 3,3',5,5'-tetramethyl-4,4'-diaminodiphenylmethane, 2,4- or, 2,5-diaminocumene, 2,5-dimethyl-p-phenylene diamine, acetoguanamine, 2,3,5,6-tetramethyl-p-phenylene diamine, 2,4,6-trimethyl-m-phenylene diamine, bis(3-aminopropyl)tetramethyl disiloxane, 2,7-diaminofluorene, 2,5-diaminopyridine, 1,2-bis(4-aminophenyl)ethane, diaminobenzanilide, esters of diaminobenzoic acid, 1,5-diaminonaphthalene, diaminobenzotrifluoride, 1,3-bis(4-aminophenyl)hexafluoropropane, 1,4-bis(4-aminophenyl)octafluorobutane, 1,5-bis(4-aminophenyl)decafluoropentane, 1,7-bis(4-aminophenyl)tetradecafluoroheptane, 2,2-bis[4-(3-aminophenoxy)phenyl]hexafluoropropane, 2,2-bis[4-(2-aminophenoxy)phenyl]hexafluoropropane, 2,2-bis[4-(4-aminophenoxy)-3,5-dimethylphenyl]hexafluoropropane, 2,2-bis[4-(4-aminophenoxy)-3,5-bis(trifluoromethyl)phenyl]hexafluoropropane, p-bis(4-amino-2-trifluoromethylphenoxy)benzene, 4,4'-bis(4-amino-2-trifluoromethylphenoxy)biphenyl, 4,4'-bis(4-amino-3-trifluoromethylphenoxy)biphenyl, 4,4'-bis(4-amino-2-trifluoromethylphenoxy)diphenyl sulfone, 4,4'-bis(3-amino-5-trifluoromethylphenoxy)diphenyl sulfone, 2,2-bis[4-(4-amino-3-trifluoromethylphenoxy)phenyl]hexafluoropropane, 3,3',5,5'-tetramethyl-4,4'-diaminobiphenyl, 4,4'-diamino-2,2'-bis(trifluoromethyl)biphenyl, 2,2',5,5',6,6'-hexafluorotolidine, or 4,4'-diaminoquaterphenyl.

In addition, diamines (DA-1) to (DA-18) shown below are also preferable.

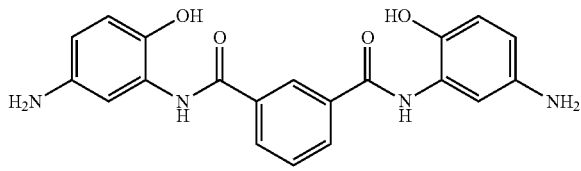

(DA-1)

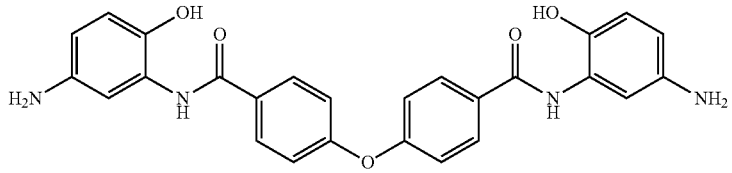

(DA-2)

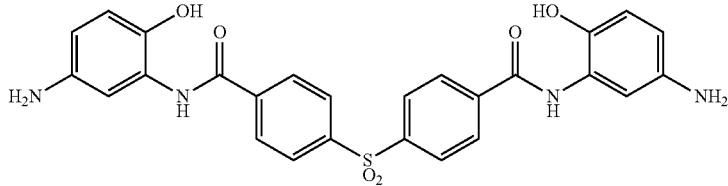

(DA-3)

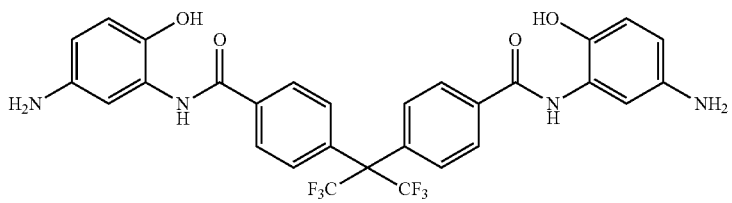

(DA-4)

-continued
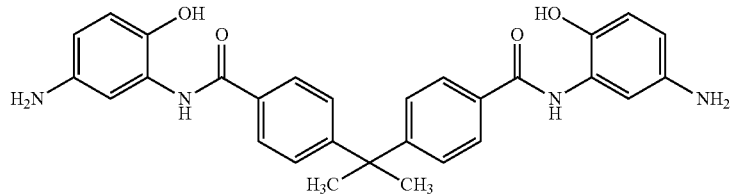
(DA-5)
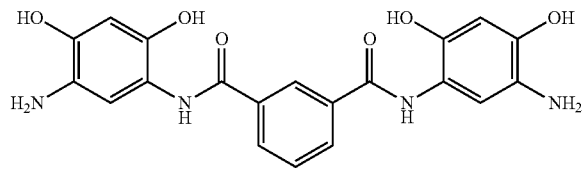
(DA-6)
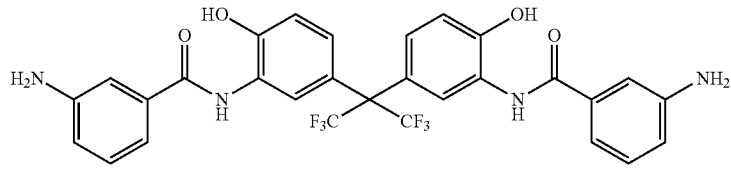
(DA-7)
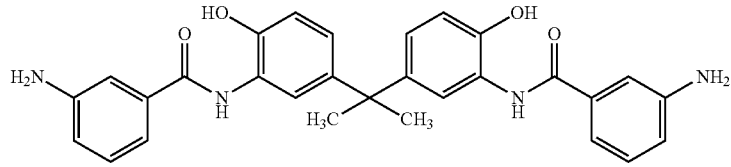
(DA-8)
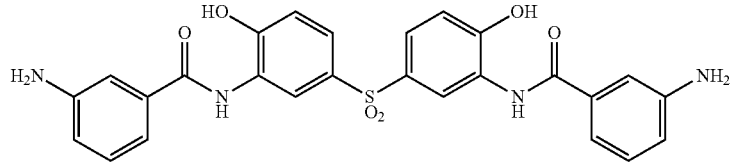
(DA-9)
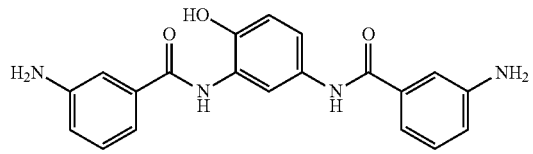
(DA-10)
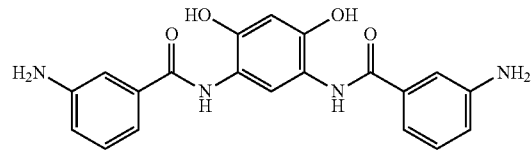
(DA-11)
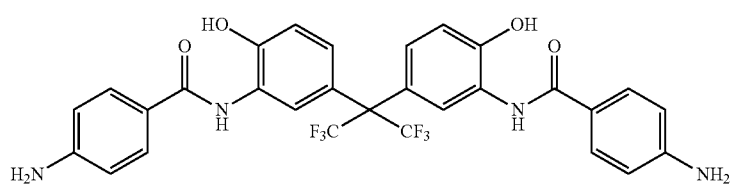
(DA-12)
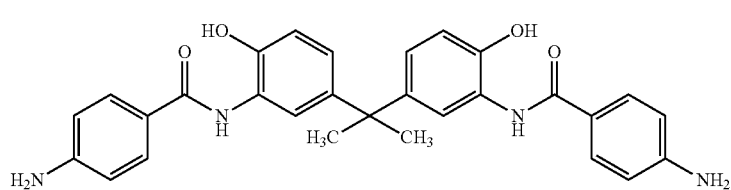
(DA-13)

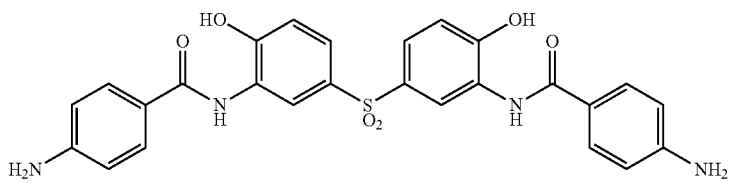
(DA-14)

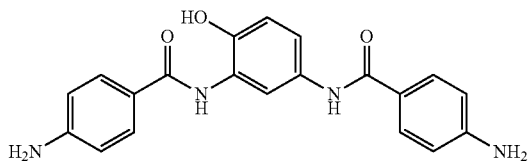
(DA-15)

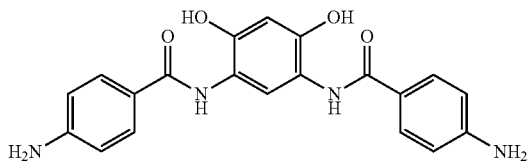
(DA-16)

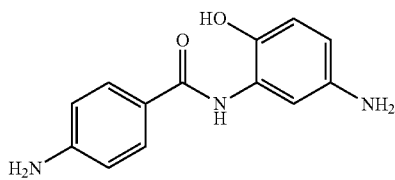
(DA-17)

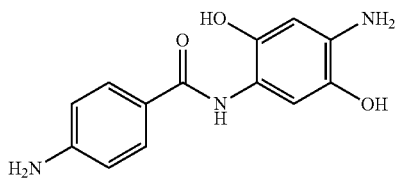
(DA-18)

In addition, preferred examples of the diamine also include a diamine having at least two alkylene glycol units in the main chain. A diamine containing a total of two chains of any one or both of the ethylene glycol chain and the propylene glycol chain in one molecule is more preferable, and the above-described diamine which is a diamine containing no aromatic ring is still more preferable. Specific examples thereof include JEFFAMINE (registered trade name) KH-511, ED-600, ED-900, ED-2003, EDR-148, EDR-176, D-200, D-400, D-2000, D-4000 (all product names, manufactured by HUNTSMAN Corporation), 1-(2-(2-(2-aminopropoxy)ethoxy)propoxy)propan-2-amine, and 1-(1-(1-(2-aminopropoxy)propan-2-yl)oxy)propan-2-amine, which are not limited thereto.

The structures of JEFFAMINE (registered trade name) KH-511, ED-600, ED-900, ED-2003, EDR-148, and EDR-176 are shown below.

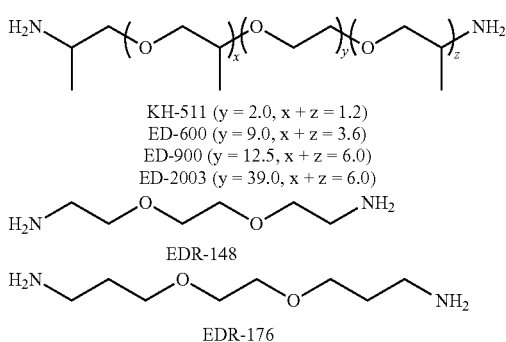

In the above, x, y, and z are average values.

$R^{131}$ is preferably represented by —Ar-L-Ar— from the viewpoint of the flexibility of the cured film to be obtained. However, Ar's are each independently an aromatic group, and L is an aliphatic hydrocarbon group having 1 to 10 carbon atoms, which may be substituted with a fluorine atom, —O—, —CO—, —S—, —SO$_2$—, or —NHCO—, or a group consisting of a combination of two or more of the above. Ar is preferably a phenylene group, and L is preferably an aliphatic hydrocarbon group having 1 or 2 carbon atoms, which may be substituted with a fluorine atom, —O—, —CO—, —S—, or —SO$_2$—. The aliphatic hydrocarbon group here is preferably an alkylene group.

In addition, from the viewpoint of the i-line transmittance, $R^{131}$ is preferably a divalent organic group represented by Formula (51) or Formula (61) below. In particular, from the viewpoint of the i-line transmittance and ease of availability, a divalent organic group represented by Formula (61) is more preferable.

Formula (51)

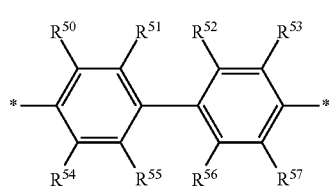
(51)

In Formula (51). $R^{50}$ to $R^{57}$ each independently represent a hydrogen atom, a fluorine atom, or a monovalent organic group, and at least one of $R^{50}$, . . . , or $R^{57}$ represents a fluorine atom, a methyl group, or a trifluoromethyl group, and *'s each independently represent a bonding site to another structure.

Examples of the monovalent organic group as $R^{50}$ to $R^{57}$ include an unsubstituted alkyl group having 1 to 10 (preferably 1 to 6) carbon atoms and a fluorinated alkyl group having 1 to 10 (preferably 1 to 6) carbon atoms.

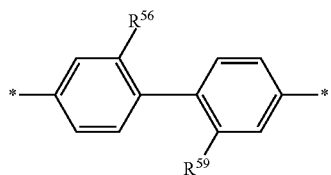

(61)

In Formula (61), $R^{58}$ and $R^{59}$ are each independently a fluorine atom or a trifluoromethyl group. *'s each independently represent a bonding site to another structure.

Examples of the diamine compound that provides a structure of Formula (51) or (61), 2,2'-dimethylbenzidine, 2,2'-bis(trifluoromethyl)-4,4'-diaminobiphenyl, and 2,2'-bis(fluoro)-4,4'-diaminobiphenyl, 4,4'-diaminooctafluorobiphenyl. These may be used alone or in a combination of two or more thereof.

In addition, the following diamines can also be suitably used.

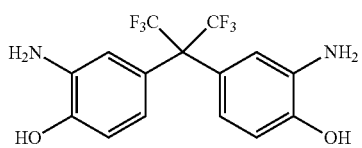

(DA-19)

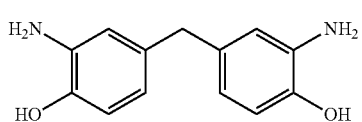

(DA-20)

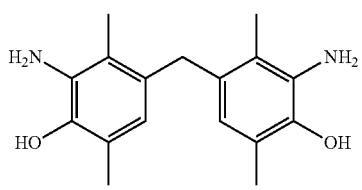

(DA-21)

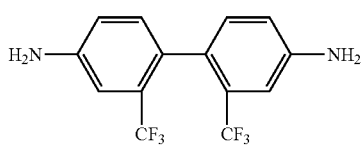

(DA-22)

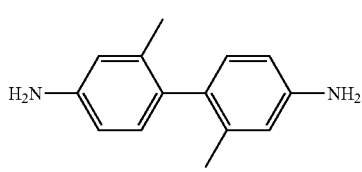

(DA-23)

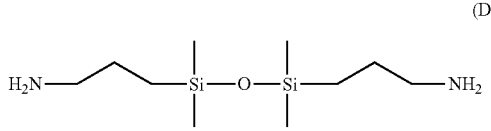

(DA-24)

<<$R^{132}$>>

$R^{132}$ represents a tetravalent organic group. The tetravalent organic group is preferably a tetravalent organic group containing an aromatic ring and more preferably a group represented by Formula (5) or Formula (6). In Formula (5) and Formula (6), *'s each independently represent a bonding site to another structure.

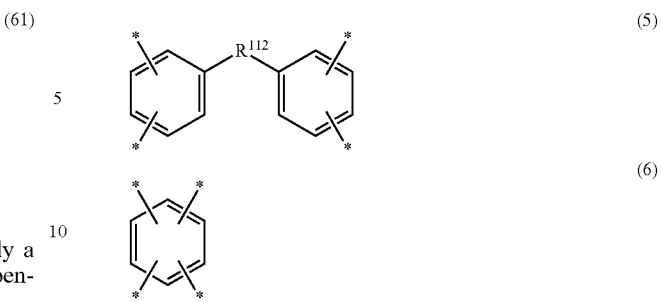

(5)

(6)

In Formula (5), $R^{112}$ is preferably a single bond, or an aliphatic hydrocarbon group having 1 to 10 carbon atoms, which may be substituted with a fluorine atom, —O—, —CO—, —S—, —SO$_2$—, —NHCO—, or a group represented by combining these, more preferably a single bond or a group selected from the group consisting of an alkylene group having 1 to 3 carbon atoms, which may be substituted with a fluorine atom, —O—, —CO—, —S—, and —SO$_2$—, and still more preferably a divalent group selected from the group consisting of —CH$_2$—, —C(CF$_3$)$_2$—, —C(CH$_3$)$_2$—, —O—, —CO—, —S—, and —SO$_2$.

Specific examples of $R^{132}$ include a tetracarboxylic acid residue that remains after the removal of the acid anhydride group from the tetracarboxylic acid dianhydride. One kind of tetracarboxylic acid dianhydride may be used alone, or two or more kinds thereof may be used.

The tetracarboxylic acid dianhydride is preferably represented by Formula (O).

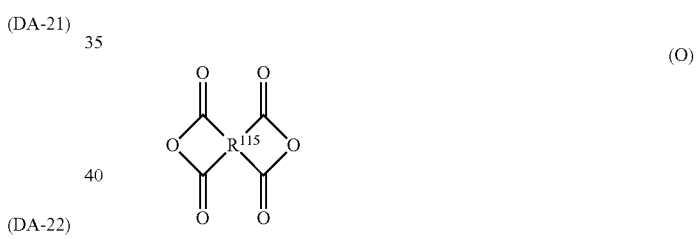

(O)

In Formula (O), $R^{115}$ represents a tetravalent organic group. The preferred range of $R^{115}$ is synonymous with $R^{132}$ in Formula (4), and the same applies to the preferred range thereof.

Specific examples of the tetracarboxylic acid dianhydride include pyromellitic acid dianhydride (PMDA), 3,3',4,4'-biphenyltetracarboxylic acid dianhydride, 3,3',4,4'-diphenylsulfide tetracarboxylic acid dianhydride, 3,3',4,4'-diphenylsulfone tetracarboxylic acid dianhydride, 3,3',4,4'-benzophenone tetracarboxylic acid dianhydride, 3,3',4,4'-diphenylmethane tetracarboxylic acid dianhydride, 2,2',3,3'-diphenylmethane tetracarboxylic acid dianhydride, 2,3,3',4'-biphenyltetracarboxylic acid dianhydride, 2,3,3',4'-benzophenone tetracarboxylic acid dianhydride, 4,4'-oxydiphthalic acid dianhydride, 2,3,6,7-naphthalene tetracarboxylic acid dianhydride, 1,4,5,7-naphthalene tetracarboxylic acid dianhydride, 2,2-bis(3,4-dicarboxyphenyl) propane dianhydride, 2,2-bis(2,3-dicarboxyphenyl)propane dianhydride, 2,2-bis(3,4-dicarboxyphenyl) hexafluoropropane dianhydride, 1,3-diphenylhexafluoropropane-3,3,4,4-tetracarboxylic acid dianhydride, 1,4,5,6-naphthalene tetracarboxylic acid dianhydride, 2,2',3,3'-diphenyl tetracarboxylic acid dianhydride, 3,4,9,10-perylene tetracarboxylic acid dianhydride, 1,2,4,5-naphthalene tetracarboxylic acid dianhydride, 1,4,5,8-naphthalene tetracarboxylic acid dianhydride, 1,8,9,10-phenanthrene tetracarboxylic acid dianhydride, 1,1-bis(2,3-dicarboxyphenyl)ethane dianhydride, 1,1-bis(3,4-dicarboxyphenyl)ethane dianhydride, 1,2,3,4-benzene tetracarboxylic acid dianhydride, and alkyl derivatives having 1 to 6 carbon atoms thereof and alkoxy derivatives having 1 to 6 carbon atoms thereof.

In addition, preferred examples thereof include tetracarboxylic acid dianhydrides (DAA-1) to (DAA-5) shown below.

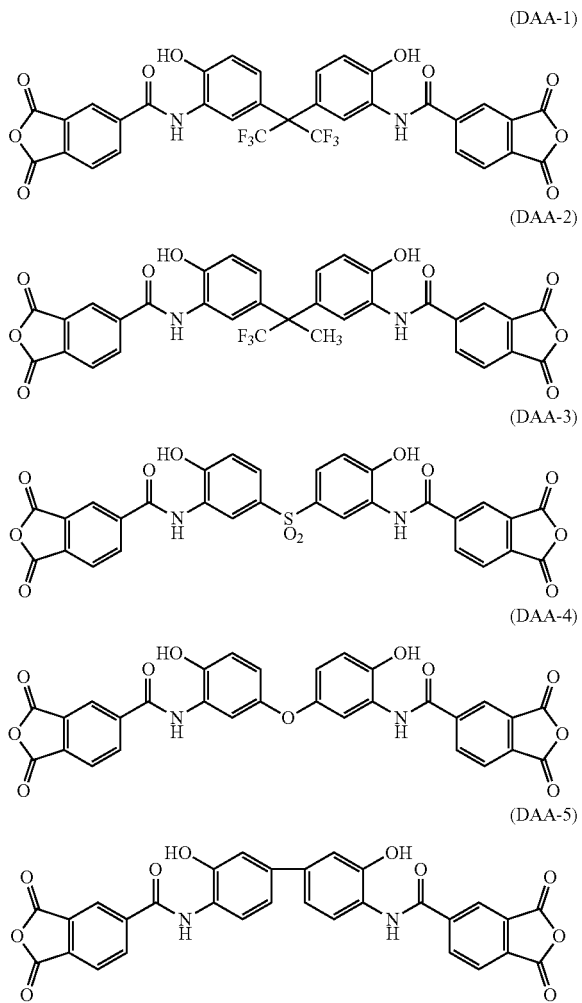

(DAA-1)

(DAA-2)

(DAA-3)

(DAA-4)

(DAA-5)

It is also preferable that an OH group is contained in at least one of $R^{131}$ or $R^{132}$. More specifically, preferred examples of $R^{131}$ include 2,2-bis(3-hydroxy-4-aminophenyl)propane, 2,2-bis(3-hydroxy-4-aminophenyl)hexafluoropropane, 2,2-bis(3-amino-4-hydroxyphenyl)propane, 2,2-bis(3-amino-4-hydroxyphenyl)hexafluoropropane, and the above (DA-1) to (DA-18), and more preferred examples of $R^{132}$ include the above (DAA-1) to (DAA-5).

In addition, in order to improve the storage stability of the composition, the terminal of the main chain of the polyimide is preferably blocked with a terminal blocking agent such as a monoamine, an acid anhydride, a monocarboxylic acid, a monoacid chloride compound, or a monoactive ester compound. Among these, a monoamine can be preferably used, and examples of the preferred monoamine compound include aniline, 2-ethynyl aniline, 3-ethynyl aniline, 4-ethynyl aniline, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, and 4-aminothiophenol. Two or more of these may be used, and a plurality of different terminal groups may be introduced by reacting a plurality of terminal blocking agents.

—Imidization Rate (Ring Closure Rate)—

The imidization rate (also referred to as the "ring closure rate") of the polyimide is preferably 70% or more, more preferably 80% or more, and still more preferably 90% or more, from the viewpoint of the film hardness, the insulating properties, or the like of the cured film to be obtained.

The upper limit of the imidization rate is not particularly limited, and it may be 100% or less.

The imidization rate is measured by, for example, the following method.

The infrared absorption spectrum of polyimide is measured, and a peak intensity P1 in the vicinity of 1,377 cm$^{-1}$ which is the absorption peak derived from the imide structure, is obtained. Next, the polyimide is heat-treated at 350° C. for 1 hour, and then the infrared absorption spectrum is measured again to obtain a peak intensity P2 in the vicinity of 1,377 cm 1. Using the obtained peak intensities P1 and P2, the imidization rate of the polyimide can be determined based on the following expression.

Imidization rate (%)=(peak intensity $P1$/peak intensity $P2$)×100

The polyimide may contain the repeating unit of Formula (4), the whole of which contains one kind of $R^{131}$ or $R^{132}$, or may contain the repeating unit of Formula (4), in which two or more different kinds of $R^{131}$ or $R^{132}$ are contained. In addition, the polyimide may also contain another kind of repeating unit in addition to the above repeating unit represented by Formula (4).

Polyimide can be synthesized by utilizing, for example, a method in which a tetracarboxylic acid dianhydride is reacted with a diamine compound (a part thereof is substituted with a terminal blocking agent which is a monoamine) at a low temperature, a method in which a tetracarboxylic acid dianhydride (a part thereof is substituted with a terminal blocking agent which is an acid anhydride, a monoacid chloride compound, or an monoactive ester compound) is reacted with a diamine compound at a low temperature, a method in which a diester is obtained from a tetracarboxylic acid dianhydride and alcohol and then reacted with a diamine (a part thereof is substituted with a terminal blocking agent which is a monoamine) in the presence of a condensing agent, a method in which a polyimide precursor is obtained, for example, by using a method in which a diester is obtained from a tetracarboxylic acid dianhydride and an alcohol, the remaining dicarboxylic acid is subjected to acid chloride modification and reacted with a diamine (a part thereof is substituted with a terminal blocking agent which is a monoamine), and the polyimide precursor is subjected to full imidization using a known imidization reaction method, or, a method in which the imidization reaction is stopped in the middle of the reaction and the imide structure is partially introduced, or furthermore a method in which a fully imidized polymer is blended with the polyimide precursor, whereby the imide structure is partially introduced.

Examples of the commercially available product of the polyimide include Durimide (registered trade name) 284 (manufactured by FUJIFILM Corporation) and Matrimide 5218 (manufactured by HUNTSMAN Corporation).

—Terminal Blocking Agent—

In a case of producing a polyimide, a polyimide precursor, or the like, the terminal of the polyimide precursor or the like is preferably blocked with a terminal blocking agent such as an acid anhydride, a monocarboxylic acid, a monoacid chloride compound, or a monoactive ester compound in order to further improve storage stability. It is more preferable to use monoalcohol, phenol, thiol, thiophenol, or a monoamine as the terminal blocking agent.

Examples of the preferred monoalcohol compound include primary alcohol such as methanol, ethanol, propanol, butanol, hexanol, octanol, dodecynol, benzyl alcohol, 2-phenylethanol, 2-methoxyethanol, 2-chloromethanol, and furfuryl alcohol; secondary alcohol such as isopropanol, 2-butanol, cyclohexyl alcohol, cyclopentanol, and 1-methoxy-2-propanol; and tertiary alcohol such as t-butyl alcohol and adamantane alcohol. Examples of the preferred phenol compounds include phenol, methoxyphenol, methylphenol, naphthalene-1-ol, and naphthalene-2-ol.

Examples of the preferred monoamine compound include aniline, 2-ethynyl aniline, 3-ethynyl aniline, 4-ethynyl aniline, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, and 4-aminothiophenol. Two or more of these may be used, and a plurality of different terminal groups may be introduced by reacting a plurality of terminal blocking agents.

In addition, in a case of blocking the amino group at the terminal of the resin, it is possible to carry out blocking with a compound having a functional group capable of reacting with the amino group. The preferred blocking agent for the amino group is preferably a carboxylic acid anhydride, a carboxylic acid chloride, a carboxylic acid bromide, a sulfonic acid chloride, sulfonic anhydride, or a sulfonic acid carboxylic acid anhydride, and more preferably a carboxylic acid anhydride or a carboxylic acid chloride. Examples of the preferred carboxylic acid anhydride compound include acetic anhydride, propionic anhydride, oxalic anhydride, succinic anhydride, maleic anhydride, phthalic anhydride, and benzoic anhydride. Examples of the preferred carboxylic acid chloride compound include acetyl chloride, acrylic acid chloride, propionyl chloride, methacrylic acid chloride, pivaloyl chloride, cyclohexanecarbonyl chloride, 2-ethyl-hexanoyl chloride, cinnamoyl chloride, 1-adamantanecarbonyl chloride, heptafluorobutyryl chloride, stearic acid chloride, and benzoyl chloride.

—Solid Precipitation—

In a case of producing a polyimide or the like, a step of precipitating a solid may be included. Specifically, the polyimide or the like in the reaction solution is precipitated as a solid in water and dissolved in a solvent in which the polyimide or the like such as tetrahydrofuran can be solubilized, and then the solid can be precipitated.

Then, the polyimide or the like can be dried to obtain a powdery polyimide or the like.

Examples of the weight-average molecular weight (Mw) of the polyimide include 4,000 to 100,000, 5,000 to 70,000 is preferable, 8,000 to 50,000 is more preferable, and 10,000 to 30,000 is still more preferable. In a case where the weight-average molecular weight is set to 5,000 or more, it is possible to improve the breakage resistance of the film after curing. In order to obtain a cured film having excellent mechanical properties, the weight-average molecular weight is particularly preferably 20,000 or more. In a case where two or more kinds of polyimides are contained, the weight-average molecular weight of at least one kind of polyimide is preferably in the above range.

[Polybenzoxazole]

The polybenzoxazole is not particularly limited as long as it is a polymer compound having a benzoxazole ring; however, it is preferably a compound represented by Formula (X), and it is more preferably a compound represented by Formula (X), which is a compound having a crosslinkable group.

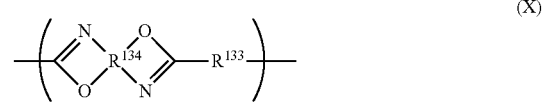

(X)

In Formula (X), $R^{133}$ represents a divalent organic group, and $R^{134}$ represents a tetravalent organic group.

In a case where a crosslinkable group is contained, the crosslinkable group may be located at at least one of $R^{133}$ or $R^{134}$, or may be located at the terminal of the polybenzoxazole as shown in Formula (X-1) or Formula (X-2).

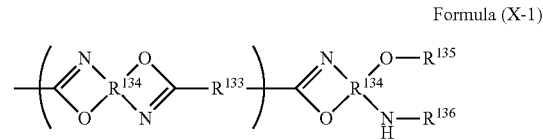

Formula (X-1)

In Formula (X-1), at least one of $R^{135}$ or $R^{136}$ is a group having a crosslinkable group, where $R^{135}$ or $R^{136}$ is an organic group in a case where it is a group having no crosslinkable group, and the other groups are synonymous with Formula (X).

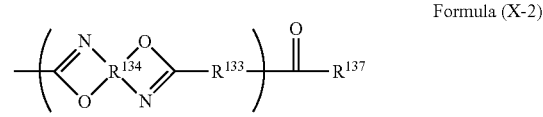

Formula (X-2)

In Formula (X-2), $R^{137}$ is a group having a crosslinkable group, other groups are a substituent, and the other groups are synonymous with those in Formula (X).

The crosslinkable group in the polybenzoxazole is synonymous with the crosslinkable group described as the crosslinkable group contained in the above-described polyimide.

The crosslinkable group in the polybenzoxazole may be a group in which the bonding reaction with another group is promoted by the photosensitization of the photosensitive compound B in the second exposure step under the condition 1 described above.

In addition, the crosslinkable group in the polybenzoxazole may be a group in which the bonding reaction with another group is promoted by the photosensitization of the photosensitive compound A in the first exposure step.

<<$R^{133}$>>

$R^{133}$ represents a divalent organic group. The divalent organic group is preferably a group containing at least one of an aliphatic group or an aromatic group. The aliphatic group is preferably a linear aliphatic group. $R^{133}$ is preferably a dicarboxylic acid residue. One kind of dicarboxylic acid residue may be used alone, or two or more kinds thereof may be used.

The dicarboxylic acid residue is preferably a dicarboxylic acid containing an aliphatic group or a dicarboxylic acid residue containing an aromatic group, and more preferably a dicarboxylic acid residue containing an aromatic group.

The dicarboxylic acid containing an aliphatic group is preferably a dicarboxylic acid containing a linear or branched (preferably linear) aliphatic group, and more preferably a dicarboxylic acid consisting of a linear or branched (preferably linear) aliphatic group and two —COOH. The linear or branched (preferably linear) aliphatic group preferably has 2 to 30 carbon atoms, more preferably 2 to 25 carbon atoms, still more preferably 3 to 20 carbon atoms, even still more preferably 4 to 15 carbon atoms, particularly preferably 5 to 10 carbon atoms. The linear aliphatic group is preferably an alkylene group.

Examples of the dicarboxylic acid containing a linear aliphatic group include malonic acid, dimethylmalonic acid, ethylmalonic acid, isopropylmalonic acid, di-n-butylmalonic acid, succinic acid, tetrafluorosuccinic acid, methylsuccinic acid, 2,2-dimethylsuccinic acid, 2,3-dimethylsuccinic acid, dimethylmethylsuccinic acid, glutaric acid, hexafluoroglutaric acid, 2-methylglutaric acid, 3-methylglutaric acid, 2,2-dimethylglutaric acid, 3,3-dimethylglutaric acid, 3-ethyl-3-methylglutaric acid, adipic acid, octafluoroadipic acid, 3-methyladipic acid, pimelic acid, 2,2,6,6-tetramethylpimelic acid, suberic acid, dodecafluorosuberic acid, azelaic acid, sebacic acid, hexadecafluorosebacic acid, 1,9-nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosanedioic acid, heneicosanedioic acid, docosanedioic acid, tricosanedioic acid, tetracosanedioic acid, pentacosanedioic acid, hexacosanedioic acid, heptacosanedioic acid, octacosanedioic acid, nonacosanedioic acid, triacontanedioic acid, hentriacontanedioic acid, dotriacontanedioic acid, diglycolic acid, and furthermore, dicarboxylic acids represented by the following formulae.

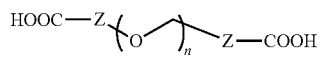

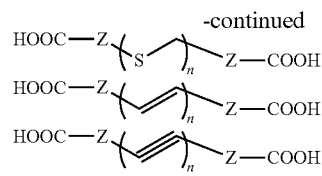

(In the formulae, Z is a hydrocarbon group having 1 to 6 carbon atoms, and n is an integer of 1 to 6).

The dicarboxylic acid containing an aromatic group is preferably a dicarboxylic acid having the following aromatic group and more preferably a dicarboxylic acid consisting of only the following aromatic group and two —COOH.

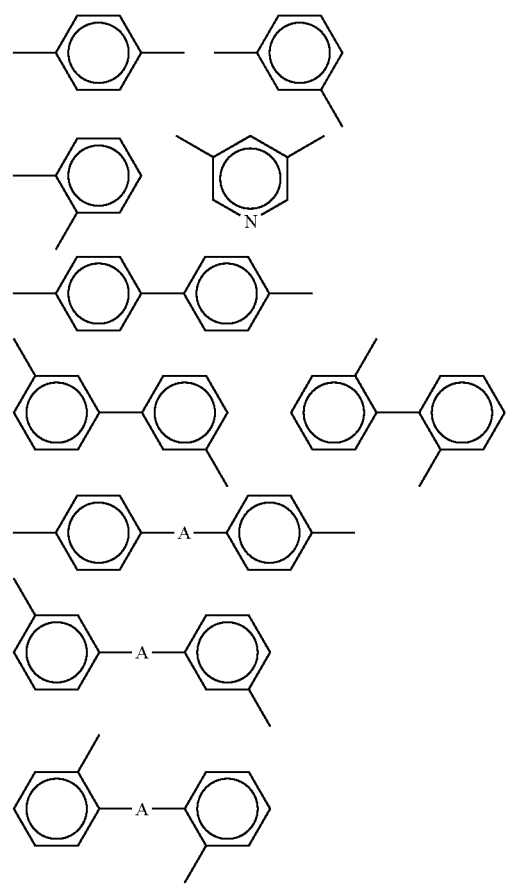

In the formulae, A represents a divalent group selected from the group consisting of —CH$_2$—, —O—, —S—, —SO$_2$—, —CO—, —NHCO—, —C(CF$_3$)$_2$—, and —C(CH$_3$)$_2$—.

Specific examples of the dicarboxylic acid containing an aromatic group include 4,4'-carbonyldibenzoic acid, 4,4'-dicarboxydiphenyl ether, and terephthalic acid.

<<<$R^{134}$>>

In Formula (X), $R^{134}$ represents a tetravalent organic group. The tetravalent organic group is synonymous with $R^{132}$ in Formula (4) described above, and the same applies to the preferred range.

In addition, $R^{134}$ is preferably a group derived from a bisaminophenol derivative. Examples of the group derived from the bisaminophenol derivative include 3,3'-diamino-4,4'-dihydroxybiphenyl, 4,4'-diamino-3,3'-dihydroxybiphenyl, 3,3'-diamino-4,4'-dihydroxydiphenylsulfone, 4,4'-diamino-3,3'-dihydroxydiphenylsulfone, bis-(3-amino-4-hydroxyphenyl)methane, 2,2-bis(3-amino-4-hydroxyphenyl)propane, 2,2-bis-(3-amino-4-hydroxyphenyl)hexafluoropropane, 2,2-bis-(4-amino-3-hydroxyphenyl)hexafluoropropane, bis-(4-amino-3-hydroxyphenyl)methane, 2,2-bis-(4-amino-3-hydroxyphenyl)propane, 4,4'-diamino-3,3'-dihydroxybenzophenone, 3,3'-diamino-4,4'-dihydroxybenzophenone, 4,4'-diamino-3,3'-dihydroxydiphenyl ether, 3,3'-diamino-4,4'-dihydroxydiphenyl ether, 1,4-diamino-2,5-dihydroxybenzene, 1,3-diamino-2,4-dihydroxybenzene, and 1,3-diamino-4,6-dihydroxybenzene. These bisaminophenols may be used alone or may be mixedly use d.

Among the bisaminophenol derivatives, the bisaminophenol derivative having the following aromatic group is preferable.

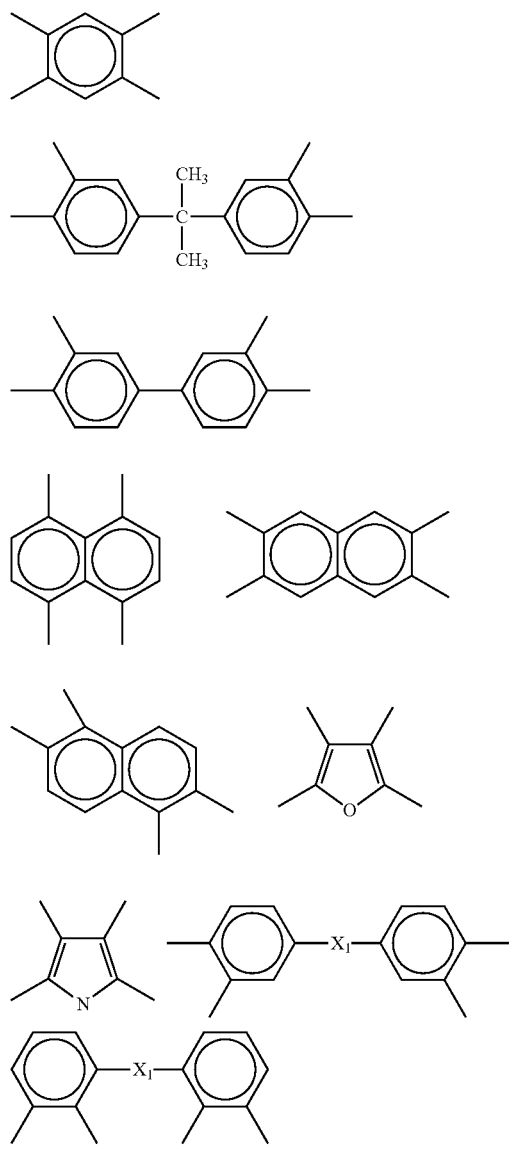

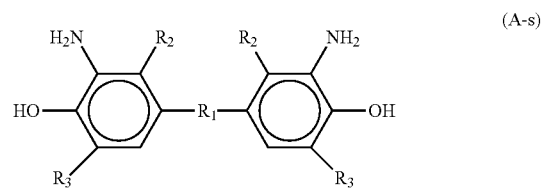

In Formula (A-s), $R_1$ is a hydrogen atom, an alkylene, a substituted alkylene, —O—, —S—, —SO$_2$—, —CO—, —NHCO—, a single bond, or an organic group selected from the group of Formula (A-sc). $R^2$'s are any one of a hydrogen atom, an alkyl group, an alkoxy group, an acyloxy group, or a cyclic alkyl group, and may be the same or different from each other. $R^3$'s are any one of a hydrogen atom, a linear or branched alkyl group, an alkoxy group, an acyloxy group, or a cyclic alkyl group, and may be the same or different from each other.

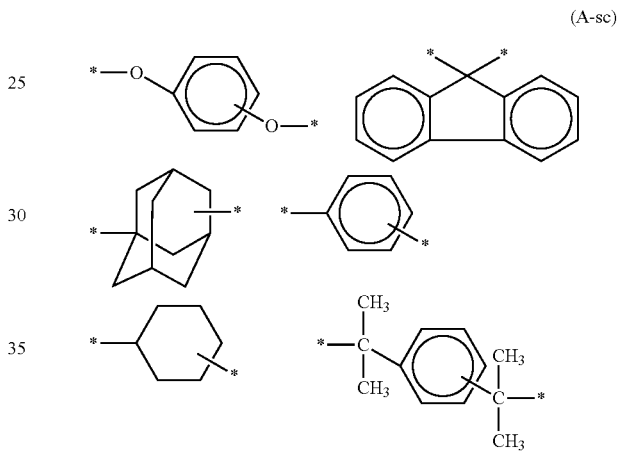

(In Formula (A-sc), * indicates bonding to the aromatic ring of the aminophenol group of the bisaminophenol derivative represented by Formula (A-s).)

In Formula (A-s), it is conceived that in a case where a substituent is also provided at the ortho position of the phenolic hydroxy group, that is, $R_3$, the distance between the carbonyl carbon of the amide bond and the hydroxy group becomes closer, and such a case is particularly preferable since the effect that the cyclization rate becomes high in a case where curing is carried out at a low temperature is further enhanced.

In addition, in Formula (A-s), in a case where $R_2$ is an alkyl group and $R_3$ is an alkyl group, it is possible to maintain the high transparency to the i-line and the effect that the cyclization rate is high in a case where curing is carried out at a low temperature, which is preferable.

In addition, in Formula (A-s), it is more preferable that $R_1$ is an alkylene or a substituted alkylene. Specific examples of alkylene and substituted alkylene related to $R_1$ include —CH$_2$—, —CH(CH$_3$)—, —C(CH$_3$)$_2$—, —CH(CH$_2$CH$_3$)—, —C(CH$_3$)(CH$_2$CH$_3$)—, —C(CH$_2$CH$_3$)(CH$_2$CH$_3$)—, —CH(CH$_2$CH$_2$CH$_3$)—, —C(CH$_3$)(CH$_2$CH$_2$CH$_3$)—, —CH(CH(CH$_3$)$_2$)—, —C(CH$_3$)(CH(CH$_3$)$_2$)—, —CH(CH$_2$CH$_2$CH$_3$)—, —C(CH$_3$)(CH$_2$CH$_2$CH$_2$CH$_3$)—, —CH(CH$_2$CH(CH$_3$)$_2$)—, —C(CH$_3$)(CH$_2$CH(CH$_3$)$_2$)—, —CH(CH$_2$CH$_2$CH$_2$CH$_2$CH$_3$)—, —C(CH$_3$)(CH$_2$CH$_2$CH$_2$CH$_2$CH$_3$)—, —CH(CH$_2$CH$_2$CH$_2$ In the formulae, $X_1$ represents —O—, —S—, —C(CF$_3$)$_2$—, —CH$_2$—, —SO$_2$—, or —NHCO—.

$CH_2CH_2CH_3)$—, and —$C(CH_3)(CH_2CH_2CH_2CH_2CH_3)$—. Among them, —$CH_2$—, —$CH(CH_3)$—, or —$C(CH_3)_2$— is more preferable since it is possible to obtain a polybenzoxazole precursor excellent in balance in terms of having sufficient solubility in a solvent while maintaining the high transparency to the i-line and the effect that the cyclization rate is high in a case where curing is carried out at a low temperature.

As a method of manufacturing the bisaminophenol derivative represented by Formula (A-s), for example, paragraph numbers 0085 to 0094 and Example 1 (paragraph numbers 0189 to 0190) of JP2013-256506A can be referenced, the content of which is incorporated in the present specification by reference.

Specific examples of the structure of the bisaminophenol derivative represented by Formula (A-s) include those described in paragraph numbers 0070 to 0080 of JP2013-256506A, the content of which is incorporated in the present specification. It goes without saying that it is not limited to these.

The polybenzoxazole may also contain another kind of repeating unit in addition to the repeating unit of Formula (X).

From the viewpoint that occurrence of warping due to ring closure can be suppressed, a diamine residue represented by Formula (SL) is preferably contained as another kind of repeating unit.

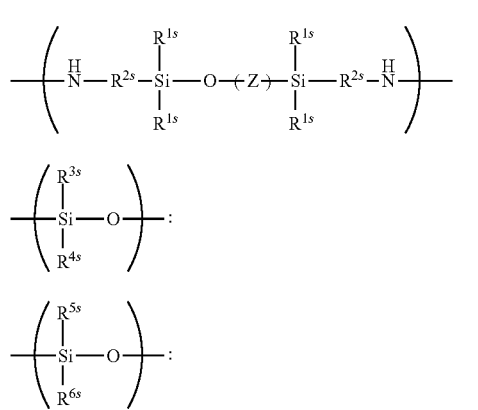

In Formula (SL), Z has a structure and a b structure, $R^{1s}$ is a hydrogen atom or a hydrocarbon group having 1 to 10 carbon atoms, $R^{2s}$ is a hydrocarbon group having 1 to 10 carbon atoms, and at least one of $R^{3s}$, $R^{4s}$, $R^{5s}$, or $R^{6s}$ is an aromatic group, where the rest are a hydrogen atom or an organic group having 1 to 30 carbon atoms and may be the same or different from each other. The polymerization of the a structure and the b structure may be block polymerization or random polymerization. Regarding the contents of the structures in the Z portion in terms of "% by mole", the content of the a structure is 5% to 95% by mole and the content of the b structure is 95% to 5% by mole, the sum (the content of the a structure+the content of the b structure is 100% by mole.

In Formula (SL), examples of the preferred Z include one in which $R^{5s}$ and $R^{6s}$ in the b structure are a phenyl group. In addition, the molecular weight of the structure represented by Formula (SL) is preferably 400 to 4,000 and more preferably 500 to 3,000.

In a case where a diamine residue represented by Formula (SL) is contained as another kind of repeating unit, it is also preferable that a tetracarboxylic acid residue that has remained after removing an acid anhydride group from the tetracarboxylic acid dianhydride is further contained as a repeating unit. Examples of such a tetracarboxylic acid residue include the examples of $R^{132}$ in Formula (4).

Polybenzoxazole can be obtained by, for example, reacting a bisaminophenol derivative with a compound selected from a dicarboxylic acid dichloride, a dicarboxylic acid derivative, and the like of a dicarboxylic acid containing $R^{133}$ or the above dicarboxylic acid, to obtain a polybenzoxazole precursor, and subjecting it to the oxazole modification with a known oxazole reaction method.

In a case of a dicarboxylic acid, an active ester-type dicarboxylic acid derivative subjected to reaction in advance with 1-hydroxy-1,2,3-benzotriazole or the like may be used in order to increase the reaction yield or the like.

In addition, in the synthesis of the polybenzoxazole or the polybenzoxazole precursor, the above-described terminal blocking agent may be used in the same manner as in the above-described synthesis of the polyimide or the polyimide precursor, or the solid precipitation may be carried out in the same manner as in the above-described synthesis of the polybenzoxazole precursor.

The weight-average molecular weight (Mw) of polybenzoxazole is preferably 5,000 to 70,000, more preferably 8,000 to 50,000, and still more preferably 10,000 to 30,000. In a case where the weight-average molecular weight is set to 5,000 or more, it is possible to improve the breakage resistance of the film after curing. In order to obtain a cured film having excellent mechanical properties, the weight-average molecular weight is particularly preferably 20,000 or more. In a case where two or more kinds of polybenzoxazole are contained, it is preferable that the weight-average molecular weight of at least one kind of polybenzoxazole is in the above range.

[Content]

The content of the specific resin in the photocurable resin composition according to the embodiment of the present invention is preferably 20% by mass or more, more preferably 30% by mass or more, still more preferably 40% by mass or more, and even still more preferably 50% by mass or more, with respect to the total solid content of the photocurable resin composition. In addition, the content of the specific resin in the photocurable resin composition according to the embodiment of the present invention is preferably 99.5% by mass or less, more preferably 99% by mass or less, still more preferably 98% by mass or less, still more preferably 97% by mass or less, and even still more preferably 95% by mass or less, with respect to the total solid content of the photocurable resin composition.

The photocurable resin composition according to the embodiment of the present invention may contain only one kind of specific resin or may contain two or more kinds thereof. In a case where two or more kinds thereof are contained, the total amount thereof is preferably within the above-described range.

<Another Resin>

The resin composition according to the embodiment of the present invention may contain the above-described specific resin and another resin (hereinafter, also simply referred to as the "other resin") that is different from the specific resin.

Examples of the other resin include a phenol resin, polyamide, an epoxy resin, polysiloxane, a resin containing a siloxane structure, and an acrylic resin.

For example, in a case where an acrylic resin is further added, it is possible to a composition having excellent coatability, and it is possible to obtain a pattern (a cured film) having excellent solvent resistance.

For example, in a case where an acrylic resin having a high polymerizable base value and having a weight-average molecular weight of 20,000 or less is added to the composition instead of a polymerizable compound described later or in addition to a polymerizable compound described later, it is possible to improve the coatability of the composition, the solvent resistance of the pattern (the cured film), and the like.

In a case where the resin composition according to the embodiment of the present invention contains the other resin, the content of the other resin is preferably 0.010% by mass or more, more preferably 0.05% by mass or more, still more preferably 1% by mass or more, even still more preferably 2% by mass or more, even still more preferably 5% by mass or more, and even further still more preferably 10% by mass or more, with respect to the total solid content of the composition.

In addition, the content of the other resin in the composition according to the embodiment of the present invention is preferably 80% by mass or less, more preferably 75% by mass or less, still more preferably 70% by mass or less, still more preferably 60% by mass or less, and even still more preferably 50% by mass or less, with respect to the total solid content of the composition.

In addition, as the preferred aspect of the resin composition according to the embodiment of the present invention, an aspect in which the content of the other resin is a low content can be adopted. In the above aspect, the content of the other resin is preferably 20% by mass or less, more preferably 15% by mass or less, still more preferably 10% by mass or less, still more preferably 5% by mass or less, and even still more preferably 1% by mass or less, with respect to the total solid content of the composition. The lower limit of the content is not particularly limited, and it may be 0% by mass or more.

The resin composition according to the embodiment of the present invention may contain only one kind of the other resin or may contain two or more kinds thereof. In a case where two or more kinds thereof are contained, the total amount thereof is preferably within the above-described range.

<Photosensitive Compound A>

In the first aspect of the method of manufacturing a cured film according to the embodiment of the present invention, the photocurable resin composition contains the photosensitive compound A having a sensitivity to the exposure wavelength in the first exposure step.

Whether or not a photosensitive compound has a sensitivity to the exposure wavelength in the first exposure step is determined by the following method.

A photosensitive compound and polymethylmethacrylate (PMMA) are dissolved in methyl ethyl ketone to prepare a composition for forming a model film. The content of the photosensitive compound with respect to the total mass of the photosensitive compound A and PMMA in the composition for forming a model film is set to 0.5 mmol/g. In addition, the using amount of methyl ethyl ketone with respect to the total mass of the photosensitive compound A and PMMA in the composition for forming a model film may be appropriately set depending on the film thickness of the model film described later.

The weight-average molecular weight of PMMA is set to 10,000.

Then, the obtained composition for forming a model film is applied onto glass and subjected to heat drying at 80° C. for 1 minute to obtain a model film. The film thickness of the model film is set to be 10 μm. Then, the composition film is exposed with the same wavelength and the same irradiation amount as the those of the above exposure using the same light source as the exposure in the first exposure step.

After the exposure, the model film and the glass on which the model film has been formed are immersed in a solution of methanol/THF=50/50 (mass ratio) for 10 minutes while applying ultrasonic waves thereto. An extract extracted into the above solution is analyzed by high performance liquid chromatography (HPLC), and then the residual rate of the photosensitive compound is calculated according to the following expression.

Residual rate of photosensitive compound (%)=amount (mol) of photosensitive compound contained in model film after exposure/content (mol) of photosensitive compound contained in model film before exposure×100

In addition, in a case where the residual rate of the photosensitive compound is less than 80%, it is determined that the photosensitive compound is a compound having a sensitivity to the exposure wavelength in the first exposure step. The residual rate is preferably 70% or less, more preferably 60% or less, and still more preferably 50% or less. The lower limit of the residual rate is not particularly limited, and it may be 0%.

In a case where the residual rate of the photosensitive compound is 80% or more, it is determined that the photosensitive compound is a compound having no sensitivity to the exposure wavelength in the first exposure step. The above residual rate is preferably 85% or more, more preferably 90% or more, and still more preferably 95% or more. The lower limit of the residual rate is not particularly limited, and it may be 100%.

The photosensitive compound A may have or may not have a sensitivity to the exposure wavelength in the second exposure step; however, it preferably has a sensitivity to the exposure wavelength in the second exposure step from the viewpoint of the film hardness and the solvent resistance of the cured film to be obtained.

Whether or not having a sensitivity to the exposure wavelength in the second exposure step can be determined according to a determination method of which the description of "first exposure step" is replaced with "second exposure step" in the method of determining whether or not having a sensitivity to the exposure wavelength in the first exposure step.

In the second aspect of the method of manufacturing a cured film according to the embodiment of the present invention, the difference between the maximum absorption wavelength of the photosensitive compound A and the maximum absorption wavelength of the photosensitive compound B is 80 nm or more, and it is preferably 90 to 300 nm and more preferably 100 to 200 nm.

The maximum absorption wavelength of the photosensitive compound A is preferably 190 to 450 nm and more preferably 320 to 450 nm.

In addition, the maximum absorption wavelength of the photosensitive compound A is preferably larger than the maximum absorption wavelength of the photosensitive compound B.

The maximum absorption wavelength of the photosensitive compound is defined as the wavelength that is present on the side of the longest wavelength among the maximum absorption wavelengths in a wavelength range of 190 to 500 nm.

The photosensitive compound A is a compound that changes the solubility of the photocurable film in the developing solution in the first exposure step.

Specifically, the photosensitive compound A is preferably a compound that undergoes a chemical change such as generation of a radical or generation of an acid in the first exposure step and, in association with this structural change, has a function of changing the solubility of the photocurable layer in the developing solution, and it is more preferably a compound that generates a radical from the first exposure step.

In addition, the photosensitive compound A is preferably a photopolymerization initiator or a photoacid generator.

[Photopolymerization Initiator]

Examples of the photopolymerization initiator include a photoradical polymerization initiator and a photocationic polymerization initiator, and a photoradical polymerization initiator is preferable.

The photoradical polymerization initiator is a compound corresponding to a compound that generates a radical in the first exposure step described above.

—Photoradical Polymerization Initiator—

The photocurable resin composition according to the embodiment of the present invention preferably contains a photoradical polymerization initiator as the photosensitive compound A.

For example, in a case where the photocurable resin composition contains a photoradical polymerization initiator and at least one of a specific resin having an ethylenically unsaturated bond having radical polymerizability or a radical crosslinking agent described later, the radical polymerization proceeds, the solubility of the exposed portions of the photocurable layer in the developing solution decreases, and thus it is possible to form a negative type pattern.

The photoradical polymerization initiator is not particularly limited and can be appropriately selected, for example, from the known compounds. For example, a photoradical polymerization initiator having photosensitivity to rays ranging from an ultraviolet light range to a visible light range is preferable. In addition, the photoradical polymerization initiator may be an activator that produces an active radical by any action with a photo-excited sensitizer.

The photoradical polymerization initiator preferably contains at least one compound having a molar absorption coefficient of at least about 50 $L \cdot mol^{-1} \, cm^{-1}$ with respect to light having a wavelength within a range of about 300 to 800 nm (preferably 330 to 500 nm). The molar absorption coefficient of a compound can be measured using a known method. For example, it is preferable to carry out measurement at a concentration of 0.01 g/L using an ethyl acetate solvent with an ultraviolet-visible spectrophotometer (Cary-5 spectrophotometer manufactured by Varian Medical Systems, Inc.).

As the photoradical polymerization initiator, any known compound can be used. Examples thereof include a halogenated hydrocarbon derivative (for example, a compound having a triazine skeleton, a compound having an oxadiazole skeleton, or a compound having a trihalomethyl group), an acylphosphine compound such as an acylphosphine oxide, hexaarylbiimidazole, an oxime compound such as an oxime derivative, an organic peroxide, a thio compound, a ketone compound, an aromatic onium salt, a keto oxime ether, an aminoacetophenone compound, hydroxyacetophenone, an azo-based compound, an azide compound, a metallocene compound, an organic boron compound, and an iron arene complex. Regarding the details thereof, the descriptions of paragraphs 0165 to 0182 of JP2016-027357A and paragraphs 0138 to 0151 of WO2015/199219A can be referenced, the contents of which are incorporated in the present specification.

Examples of the ketone compound include compounds described in paragraph 0087 of JP2015-087611A, the content of which is incorporated in the present specification. As a commercially available product thereof, KAYACURE DETX (manufactured by Nippon Kayaku Co., Ltd.) is also suitably used.

As the photoradical polymerization initiator, a hydroxyacetophenone compound, an aminoacetophenone compound, and an acylphosphine compound can also be suitably used. More specifically, for example, the aminoacetophenone-based initiator described in JP1998-291969A (JP-H10-291969A) and the acylphosphine oxide-based initiator described in JP4225898B can also be used.

As the hydroxyacetophenone-based initiator, IRGACURE 184 (IRGACURE is a registered trade name), DAROCUR1173, IRGACURE 500, IRGACURE 2959, and IRGACURE 127 (product names: all manufactured by BASF SE) can be used.

As the aminoacetophenone-based initiator, commercially available products such as IRGACURE 907, IRGACURE 369, and IRGACURE 379 (product names: all manufactured by BASF SE), and Omnirad 907, Omnirad 369, and Omnirad 379 (all manufactured by IGM Resins B.V.) can be used.

As the aminoacetophenone-based initiator, the compound described in JP2009-191179A, an absorption maximum wavelength of which is matched to a light source having a wavelength such as 365 nm or 405 nm, can also be used.

Examples of the acylphosphine-based initiator include 2,4,6-trimethylbenzoyl-diphenyl-phosphine oxide. In addition, commercially available products such as IRGACURE 819 and IRGACURE TPO (product names: all manufactured by BASF SE), and Omnirad 819 and Omnirad TPO (all manufactured by IGM Resins B.V.) can be used.

Examples of the metallocene compound include IRGACURE 784 (manufactured by BASF SE).

Examples of the more preferred photoradical polymerization initiator include an oxime compound. In a case where an oxime compound is used, exposure latitude can be more effectively improved. The oxime compound is particularly preferable since the oxime compound has a wide exposure latitude (a wide exposure margin) and also works as a photocuring accelerator.

As specific examples of the oxime compound, the compound described in JP2001-233842A, the compound described in JP2000-080068A, and the compound described in JP2006-342166A can be used.

Examples of the preferred oxime compound include compounds having the following structures, 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one. In the photocurable resin composition according to the embodiment of the present invention, it is particularly preferable to use an oxime compound (an oxime-based photoradical polymerization initiator) as the photoradical polymerization initiator. The oxime compound, which is a photoradical polymerization initiator, has a linking group represented by >C=N—O—C(=O)— in the molecule.

OXE 01

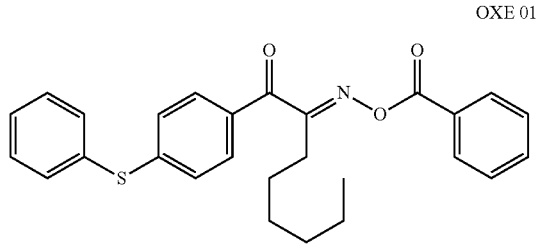

OXE 02

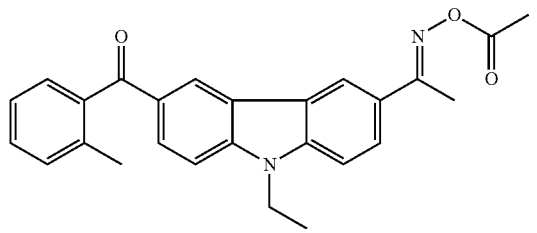

As commercially available products, IRGACURE OXE 01, IRGACURE OXE 02, IRGACURE OXE 03, IRGACURE OXE 04 (all manufactured by BASF SE), ADEKA OPTOMERN-1919 (manufactured by ADEKA Corporation, the photoradical polymerization initiator 2 described in JP2012-014052A) are also suitably used. In addition, TR-PBG-304 (manufactured by Changzhou Tronly New Electronic Materials Co., Ltd.), ADEKA ARKLS NCI-831, and ADEKA ARKLS NCI-930 (manufactured by ADEKA Corporation) can also be used. In addition, DFI-091 (manufactured by DAITO CHEMIX Co., Ltd.) can be used. In addition, oxime compounds having the following structures can also be used.

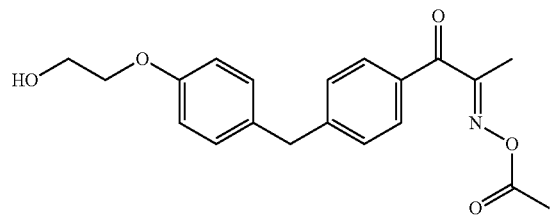

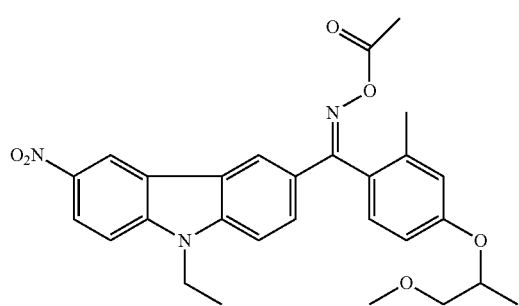

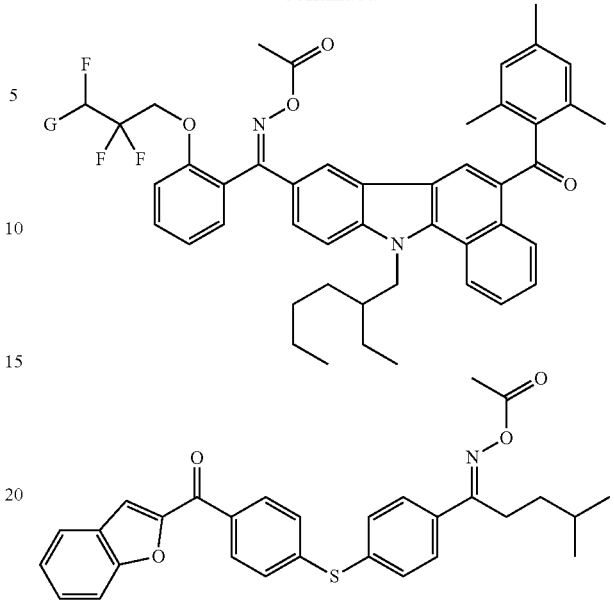

As the photopolymerization initiator, an oxime compound having a fluorene ring can also be used. Specific examples of the oxime compound having a fluorene ring include the compound disclosed in JP2014-137466A and the compound disclosed in JP06636081B3.

As the photopolymerization initiator, an oxime compound having a skeleton in which at least one benzene ring of the carbazole ring is a naphthalene ring can also be used. Specific examples of such an oxime compound include the compound disclosed in WO2013/083505A.

It is also possible to use an oxime compound having a fluorine atom. Specific examples of such oxime compounds include compounds described in JP2010-262028A, compounds 24, and 36 to 40 described in paragraph 0345 of JP2014-500852A, and a compound (C-3) described in paragraph 0101 of JP2013-164471A.

As the most preferable oxime compound, oxime compounds having a specific substituent described in JP2007-269779A or oxime compounds having a thioaryl group shown in JP2009-191061A, and the like are mentioned.

From the viewpoint of exposure sensitivity, the photoradical polymerization initiator is preferably a compound selected from the group consisting of a trihalomethyltriazine compound, a benzyl dimethyl ketal compound, an α-hydroxy ketone compound, an α-aminoketone compound, an acylphosphine compound, a phosphine oxide compound, a metallocene compound, an oxime compound, a triaryl imidazole dimer, an onium salt compound, a benzothiazole compound, a benzophenone compound, an acetophenone compound and a derivative thereof, a cyclopentadiene-benzene-iron complex and a salt thereof, a halomethyl oxadiazole compound, and a 3-aryl substituted coumarin compound.

The photoradical polymerization initiator is more preferably a trihalomethyltriazine compound, an α-aminoketone compound, an acylphosphine compound, a phosphine oxide compound, a metallocene compound, an oxime compound, a triaryl imidazole dimer, an onium salt compound, a benzophenone compound, or an acetophenone compound, still more preferably at least one compound selected from the group consisting of a trihalomethyltriazine compound, an α-aminoketone compound, an oxime compound, a triaryl imidazole dimer, and a benzophenone compound. A metallocene compound or an oxime compound is still more preferably used, and an oxime compound is even still more preferable.

In addition, as the photoradical polymerization initiator, it is possible to use benzophenone, an N,N'-tetraalkyl-4,4'-diaminobenzophenone such as N,N'-tetramethyl-4,4'-diaminobenzophenone (Michler's ketone), an aromatic ketone such as 2-benzyl-2-dimethylamino-1-(4-morpholinophenyl)-butanone-1,2-methyl-1-[4-(methylthio)phenyl]-2-morpholino-propanone-1, quinones fused with an aromatic ring such as an alkylanthraquinone, a benzoin ether compound such as a benzoin alkyl ether, a benzoin compound such as benzoin or an alkyl benzoin, a benzyl derivative such as benzyl dimethyl ketal, or the like. In addition, a compound represented by Formula (I) may also be used.

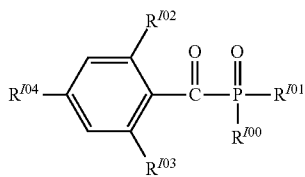

(I)

In Formula (I), $R^{100}$ represents an alkyl group having 1 to 20 carbon atoms, an alkyl group having 2 to 20 carbon atoms, which is interrupted by one or more oxygen atoms, an alkoxy group having 1 to 12 carbon atoms, a phenyl group, an alkyl group having 1 to 20 carbon atoms, an alkoxy group having 1 to 12 carbon atoms, a halogen atom, a cyclopentyl group, a cyclohexyl group, an alkenyl group having 2 to 12 carbon atoms, a phenyl group substituted with at least one of an alkyl group having 2 to 18 carbon atoms, which is interrupted by one or more oxygen atoms or an alkyl group having 1 to 4 carbon atoms, or a biphenyl group, $R^{101}$ is a group represented by Formula (II) or a group which is the same as $R^{100}$, and $R^{102}$ to $R^{104}$ each independently represent an alkyl group having 1 to 12 carbon atoms, an alkoxy group having 1 to 12 carbon atoms, or a halogen atom.

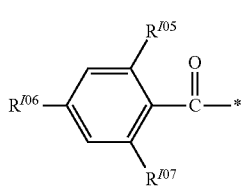

(II)

In the formula, $R^{105}$ to $R^{107}$ are respectively the same as $R^{102}$ to $R^{104}$ in Formula (I).

In addition, as the photoradical polymerization initiator, the compounds described in paragraphs 0048 to 0055 of WO2015/125469A can also be used.

In a case where the photocurable resin composition contains a photoradical polymerization initiator, the content of the photoradical polymerization initiator is preferably 0.1% to 30% by mass, more preferably 0.1% to 20% by mass, still more preferably 0.5% to 15% by mass, and still more preferably 1.0% to 10% by mass, with respect to the total solid content of the photocurable resin composition according to the embodiment of the present invention. One kind of photoradical polymerization initiator may be contained alone, or two or more kinds thereof may be contained. In a case where two or more kinds of photoradical polymerization initiators are contained, the total thereof is preferably within the above-described range.

—Photoacid Generator—

The photocurable resin composition according to the embodiment of the present invention preferably contains a photoacid generator as the photosensitive compound A.

In a case where a photoacid generator is contained, for example, an acid is generated in exposed portions of the photocurable layer, the solubility of the exposed portions in the developing solution (for example, the alkaline aqueous solution) is increased, whereby it possible to obtain a positive type relief pattern in which the exposed portions are removed by the developing solution.

In addition, in a case where the photocurable resin composition contains a photoacid generator and a crosslinking agent described later, for example, an aspect in which the crosslinking reaction of the crosslinking agent is promoted by the acid generated in the exposed portions, and the exposed portions are difficult to be removed by the developing solution as compared with the unexposed portions can be adopted. According to such an aspect, a negative type relief pattern can be obtained.

The photoacid generator is not particularly limited as long as it generates an acid upon exposure; however, examples thereof include a quinone diazide compound, an onium salt compound such as a diazonium salt, a phosphonium salt, a sulfonium salt, or an iodonium salt, and a sulfonate compound such as an imide sulfonate, an oxime sulfonate, a diazodisulfone, a disulfone, or an o-nitrobenzyl sulfonate.

Examples of the quinone diazide compound include a compound in which sulfonic acid of quinone diazide is bonded to a polyhydroxy compound by an ester bond, a compound in which sulfonic acid of quinone diazide is bonded to a polyamino compound by an amide bond, and a compound in which sulfonic acid of quinone diazide is bonded to a polyhydroxypolyamino compound by at least one of an ester bond or a sulfonamide bond. In the present invention, for example, it is preferable that 50% by mole or more of all functional groups of this polyhydroxy compound or polyamino compound is substituted with quinone diazide.

In the present invention, as the quinone diazide, any one of a 5-naphthoquinonediazidosulfonyl group or a 4-naphthoquinonediazidosulfonyl group is preferably used. The 4-naphthoquinonediazidosulfonyl ester compound has an absorption in the i-line range of the mercury lamp and thus is suitable for the i-line exposure. The 5-naphthoquinonediazidosulfonyl ester compound has an absorption extending to the g-line range of the mercury lamp and thus is suitable for the g-line exposure. In the present invention, it is preferable to select a 4-naphthoquinonediazidosulfonyl ester compound or a 5-naphthoquinonediazidosulfonyl ester compound depending on the wavelength for exposure. In addition, in the same molecule, a naphthoquinonediazidosulfonyl ester compound having a 4-naphthoquinonediazidosulfonyl group or a 5-naphthoquinonediazidosulfonyl group may be contained, or a 4-naphthoquinonediazidosulfonyl ester compound and a 5-naphthoquinonediazidosulfonyl ester compound may be contained.

The naphthoquinone diazide compound can be synthesized by an esterification reaction between a compound having a phenolic hydroxy group and a quinone diazide sulfonic acid compound and can be synthesized by a known method. In a case where this naphthoquinone diazide compound is used, it is possible to further improve resolution, sensitivity, and residual film rate.

Examples of the onium salt compound or the sulfonate compound include the compounds described in paragraphs 0064 to 0122 of JP2008-013646.

The photoacid generator is also preferably a compound containing an oxime sulfonate group (hereinafter, also simply referred to as an "oxime sulfonate compound").

The oxime sulfonate compound is not particularly limited as long as it has an oxime sulfonate group; however, it is preferably a oxime sulfonate compound represented by Formula (OS-1) below, Formula (OS-103), Formula (OS-104), or Formula (OS-105) described later.

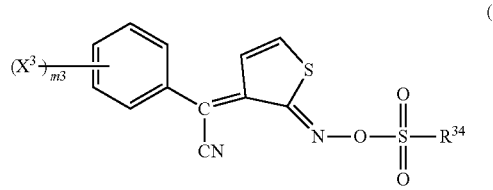

(OS-1)

In Formula (OS-1), $X^3$ represents an alkyl group, an alkoxyl group, or a halogen atom. In a case where a plurality of $X^3$'s are present, they may be the same or different from each other. The alkyl group and the alkoxyl group as $X^3$ may have a substituent. The alkyl group as $X^3$ is preferably a linear or branched alkyl group having 1 to 4 carbon atoms. The alkoxyl group as $X^3$ is preferably a linear or branched alkoxyl group having 1 to 4 carbon atoms. The halogen atom as $X^3$ is preferably a chlorine atom or a fluorine atom.

In Formula (OS-1), m3 represents an integer of 0 to 3, and it is preferably 0 or 1. In a case where m3 is 2 or 3, the plurality of $X^3$'s may be the same or different from each other.

In Formula (OS-1), $R^{34}$ represents an alkyl group or an aryl group, and it is preferably an alkyl group having 1 to 10 carbon atoms, an alkoxyl group having 1 to 10 carbon atoms, a halogenated alkyl group having 1 to 5 carbon atoms, a halogenated alkoxyl group having 1 to 5 carbon atoms, a phenyl group which may be substituted with W, a naphthyl group which may be substituted with W, or an anthranyl group which may be substituted with W. W represents a halogen atom, a cyano group, a nitro group, an alkyl group having 1 to 10 carbon atoms, an alkoxyl group having 1 to 10 carbon atoms, a halogenated alkyl group having 1 to 5 carbon atoms or a halogenated alkoxyl group having 1 to 5 carbon atoms, an aryl group having 6 to 20 carbon atoms, or a halogenated aryl group having 6 to 20 carbon atoms.

A compound represented by Formula (OS-1), in which m3 is 3, $X^3$ is a methyl group, the substitution position of $X^3$ is the ortho position, and $R^{34}$ is a linear alkyl group having 1 to 10 carbon atoms, a 7,7-dimethyl-2-oxonorbornylmethyl group, or a p-tolyl group is particularly preferable.

Specific examples of the oxime sulfonate compound represented by Formula (OS-1) include the following compounds described in paragraph numbers 0064 to 0068 of JP2011-209692A and paragraph numbers 0158 to 0167 of JP2015-194674A, the contents of which are incorporated in the present specification.

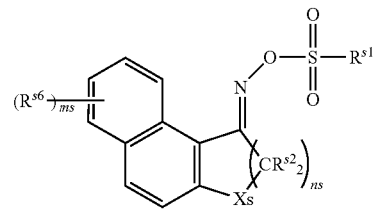

(OS-103)

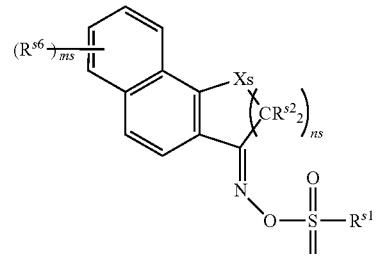

(OS-104)

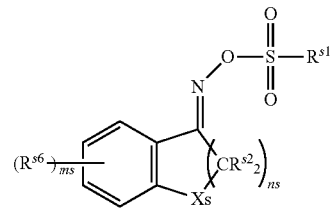

(OS-105)

In Formulae (OS-103) to (OS-105), $R^{s1}$ represents an alkyl group, an aryl group, or a heteroaryl group, $R^{s2}$'s in a case of being present in plurality each independently represent a hydrogen atom, an alkyl group, an aryl group, or a halogen atom, $R^{s6}$'s in a case of being present in plurality each independently represent a halogen atom, an alkyl group, an alkyloxy group, a sulfonic acid group, an aminosulfonyl group, or an alkoxysulfonyl group, Xs represents O or S, ns represents 1 or 2, and ms represents an integer of 0 to 6.

In Formulae (OS-103) to (OS-105), an alkyl group (preferably having 1 to 30 carbon atoms) represented by $R^{s1}$, an aryl group (preferably having 6 to 30 carbon atoms), or a heteroaryl group (preferably having 4 to 30 carbon atoms) may have a substituent T.

In Formulae (OS-103) to (OS-105), $R^{s2}$ is preferably a hydrogen atom, an alkyl group (preferably having 1 to 12 carbon atoms), or an aryl group (preferably having 6 to 30 carbon atoms), and more preferably a hydrogen atom or an alkyl group. Among $R^{s2}$'s in a case where two or more thereof are present in the compound, it is preferable that one or two thereof are an alkyl group, an aryl group, or a halogen atom, it is more preferable that one thereof is an alkyl group, an aryl group, or a halogen atom, and it is particularly preferable that one thereof is an alkyl group and the rest thereof is a hydrogen atom. The alkyl group or aryl group represented by $R^{s2}$ may have a substituent T.

In Formula (OS-103), Formula (OS-104), or Formula (OS-105), Xs represents O or S, and it is preferably O. In Formulae (OS-103) to (OS-105), the ring containing Xs as a ring member is a 5-membered ring or a 6-membered ring.

In Formulae (OS-103) to (OS-105), ns represents 1 or 2, and in a case where Xs is O, ns is preferably 1, and in a case where Xs is S, ns is preferably 2.

In Formulae (OS-103) to (OS-105), the alkyl group (preferably having 1 to 30 carbon atoms) and the alkyloxy group (preferably having 1 to 30 carbon atoms), which are represented by $R^{s6}$, may have a substituent.

In the Formulae (OS-103) to (OS-105), ms represents an integer of 0 to 6, and it is preferably an integer of 0 to 2, more preferably 0 or 1, and particularly preferably 0.

In addition, the compound represented by Formula (OS-103) is particularly preferably a compound represented by Formula (OS-106), Formula (OS-110), or Formula (OS-111), the compound represented by Formula (OS-104) is particularly preferably a compound represented by Formula (OS-107), and the compound represented by Formula (OS-105) is particularly preferably a compound represented by Formula (OS-108) or Formula (OS-109).

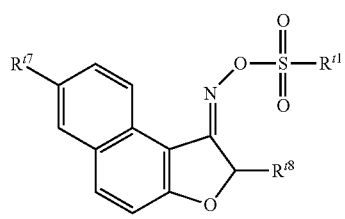
(OS-106)

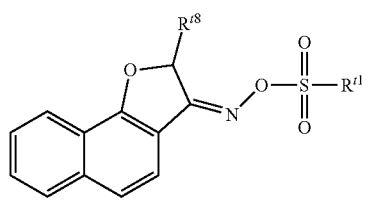
(OS-107)

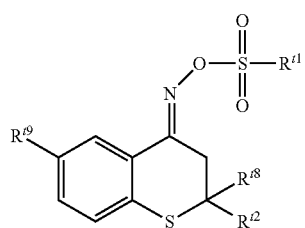
(OS-108)

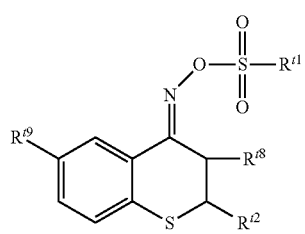
(OS-109)

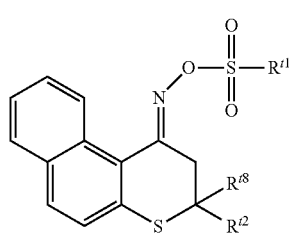
(OS-110)

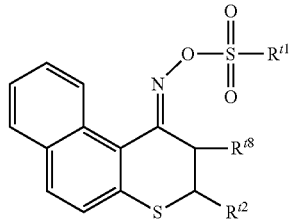
(OS-111)

In Formulae (OS-106) to (OS-111), $R^1$ represents an alkyl group, an aryl group, or a heteroaryl group, $R^{t7}$ represents a hydrogen atom or a bromine atom, $R^{t8}$ represents a hydrogen atom, an alkyl group having 1 to 8 carbon atoms, a halogen atom, a chloromethyl group, a bromomethyl group, a bromoethyl group, a methoxymethyl group, a phenyl group, or a chlorophenyl group, $R^{t9}$ represents a hydrogen atom, a halogen atom, a methyl group, or a methoxy group, and $R^2$ represents a hydrogen atom or a methyl group.

In Formulae (OS-106) to (OS-111), $R^{t7}$ represents a hydrogen atom or a bromine atom, and it is preferably a hydrogen atom.

In Formulae (OS-106) to (OS-111), $R^{t8}$ represents a hydrogen atom, an alkyl group having 1 to 8 carbon atoms, a halogen atom, a chloromethyl group, a bromomethyl group, a bromoethyl group, a methoxymethyl group, a phenyl group, or a chlorophenyl group, and it is preferably an alkyl group having 1 to 8 carbon atoms, a halogen atom or a phenyl group, more preferably an alkyl group having 1 to 8 carbon atoms, still more preferably an alkyl group having 1 to 6 carbon atoms, and particularly preferably a methyl group.

In Formulae (OS-106) to (OS-111), $R^{t9}$ represents a hydrogen atom, a halogen atom, a methyl group, or a methoxy group, and it is preferably a hydrogen atom.

$R^{t2}$ represents a hydrogen atom or a methyl group, and it is preferably a hydrogen atom.

In addition, in the above-described oxime sulfonate compound, the three-dimensional structure (E, Z) of the oxime may be any one or a mixture of E and Z.

Specific examples of the oxime sulfonate compounds represented by Formulae (OS-103) to (OS-105) include the compounds described in paragraph numbers 0088 to 0095 of JP2011-209692A and paragraph numbers 0168 to 0194 of JP2015-194674A, the contents of which are incorporated in the present specification.

Examples of suitable another aspect of the oxime sulfonate compound containing at least one oxime sulfonate group include compounds represented by Formulae (OS-101) and (OS-102).

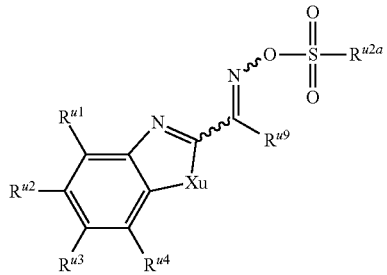
(OS-101)

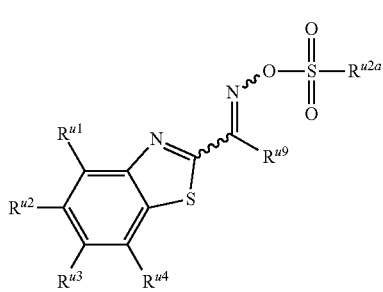

(OS-102)

In Formula (OS-101) or Formula (OS-102), $R^{u9}$ represents a hydrogen atom, an alkyl group, an alkenyl group, an alkoxyl group, an alkoxycarbonyl group, an acyl group, a carbamoyl group, a sulfamoyl group, a sulfo group, a cyano group, an aryl group, or a heteroaryl group. An aspect in which $R^{u9}$ is a cyano group or an aryl group is more preferable, and an aspect in which $R^{u9}$ is a cyano group, a phenyl group, or a naphthyl group is still more preferable.

In Formula (OS-101) or Formula (OS-102), $R^{u2a}$ represents an alkyl group or an aryl group.

In Formula (OS-101) or Formula (OS-102), Xu represents —O—, —S—, —NH—, —NR$^{u5}$—, —CH$_2$—, —CR$^{u6}$H—, or CR$^{u6}$R$^{u7}$—, and R$^{u5}$ to R$^{u7}$ each independently represent an alkyl group or an aryl group.

In Formula (OS-101) or Formula (OS-102), $R^{u1}$ to $R^{u4}$ each independently represent a hydrogen atom, a halogen atom, an alkyl group, an alkenyl group, an alkoxyl group, an amino group, an alkoxycarbonyl group, an alkylcarbonyl group, an arylcarbonyl group, an amide group, a sulfo group, a cyano group, or an aryl group. Two of $R^{u1}$ to $R^{u4}$ may be bonded to each other to form a ring. In this case, the ring may be fused to form a fused ring together with the benzene ring. $R^{u1}$ to $R^{u4}$ are preferably a hydrogen atom, a halogen atom, or an alkyl group, and an aspect in which at least two of $R^{u1}$ to $R^{u4}$ are bonded to each other to form an aryl group is also preferable. Among the above, an aspect in which all of $R^{u1}$ to $R^{u4}$ are a hydrogen atom is more preferable. Any one of the above-described substituents may further have a substituent.

The compound represented by Formula (OS-101) is more preferably a compound represented by Formula (OS-102).

In addition, in the above-described oxime sulfonate compound, the three-dimensional structure (E, Z, or the like) of the oxime or the benzothiazole ring may be each any one or a mixture of E, Z, and the like.

Specific examples of the compound represented by Formula (OS-101) include the compounds described in paragraph numbers 0102 to 0106 of JP2011-209692A and paragraph numbers 0195 to 0207 of JP2015-194674A, the contents of which are incorporated in the present specification.

Among the above compounds, b-9, b-16, b-31, or b-33 is preferable.

In addition, a commercially available product may be used as the photoacid generator. Examples of the commercially available product include WPAG-145, WPAG-149, WPAG-170, WPAG-199, WPAG-336, WPAG-367, WPAG-370, WPAG-443, WPAG-469, WPAG-638, and WPAG-699 (all manufactured by FUJIFILM Wako Pure Chemical Corporation), Omnicat 250 and Omnicat 270 (all manufactured by IGM Resins B.V.), Irgacure 250, Irgacure 270, and Irgacure 290 (all manufactured by BASF SE), and MBZ-101 (manufactured by Midori Kagaku Co., Ltd.).

In addition, preferred examples thereof also include compounds represented by the following structural formulae.

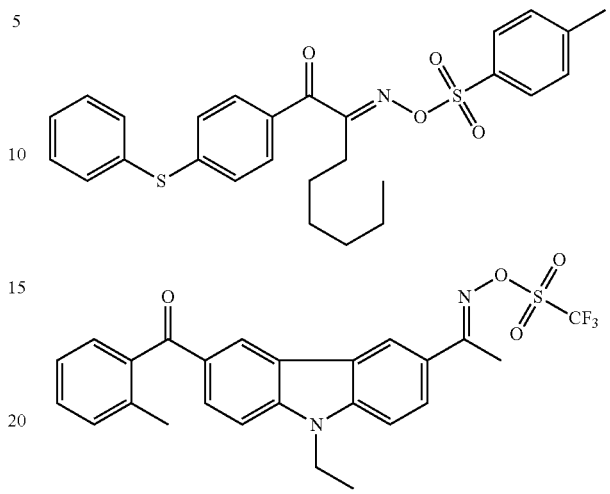

As the photoacid generator, an organic halogenated compound can also be applied. Specific examples of the organic halogenated compound include the compounds disclosed in Wakabayashi et al., "Bull Chem. Soc Japan" 42, 2924 (1969), U.S. Pat. No. 3,905,815A, JP1971-4605A (JP-S46-4605A), JP1973-36281A (JP-S48-36281A), JP1980-32070A (JP-S55-32070A), JP1985-239736A (JP-S60-239736A), JP1986-169835A (JP-S61-169835A), JP1986-169837A (JP-S61-169837A), JP1987-58241A (JP-S62-58241A), JP1987-212401A (JP-S62-212401A), JP1988-70243A (JP-S63-70243A), JP1988-298339A (JP-S63-298339A), and M. D. P. Hutt "Journal of Heterocyclic Chemistry" 1 (No. 3), (1970), and include particularly, an oxazole compound substituted with a trihalomethyl group: an S-triazine compound.

More preferred examples thereof include an s-triazine derivative in which at least one monohalogen-, dihalogen-, or trihalogen-substituted methyl group is bonded to an s-triazine ring, specifically, for example 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-natoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, and 2-methoxy-4,6-bis(tribromomethyl)-s-triazine.

As the photoacid generator, an organic borate compound can also be applied. Specific examples of the organic borate compound include the organic borates disclosed in JP1987-143044A (JP-S62-143044A), JP1987-150242A (JP-S62-

150242A), JP1997-188685A (JP-H9-188685A), JP1997-188686A (JP-H9-188686A), JP1997-188710A (JP-H9-188710A), JP2000-131837A, JP2002-107916A, JP2764769B, JP2000-310808, and the like, and Kunz, Martin "Rad Tech '98. Proceeding Apr. 19-22, 1998, Chicago"; the organic boron sulfonium complexes or the organic boron oxosulfonium complexes disclosed in JP1994-157623A (JP-H6-157623A), JP1994-175564A (JP-H6-175564A), and JP1994-175561A (JP-H6-175561A); the organic boron iodonium complexes disclosed in JP1994-175554A (JP-H6-175554A) and JP1994-175553A (JP-H6-175553A); the organic boron phosphonium complex disclosed in JP1997-188710A (JP-H9-188710A); and the organic boron transition metal coordination complexes disclosed in JP1994-348011A (JP-H6-348011A), JP1995-128785A (JP-H7-128785A), JP1995-140589A (JP-H7-140589A), JP1995-306527A (JP-H7-306527A), and JP1995-292014A (JP-H7-292014A).

As the photoacid generator, a disulfone compound can also be applied. Examples of the disulfone compound include the compounds disclosed in JP1986-166544A (JP-S61-166544A), JP2001-132318, and the like, and diazodisulfone compounds.

Examples of the onium salt compound include the onium salts such as the diazonium salt disclosed in S. I. Schlesinger, Photogr. Sci. Eng., 18,387 (1974), T. K. S. Bal et al., Polymer, 21, 423 (1980); the ammonium salts disclosed in U.S. Pat. No. 4,069,055A, JP1992-365049A (JP-H4-365049A), and the like; the phosphonium salts disclosed in U.S. Pat. Nos. 4,069,055A and 4,069,056A; the iodonium salts disclosed in EP104143B, U.S. Pat. Nos. 339,049A, 410,201A, JP1990-150848A (JP-H2-150848A), and JP1990-296514A (JP-H2-296514A); EP370693B, EP390214B, EP233567B, EP297443B, EP297442B, U.S. Pat. Nos. 4,933,377A, 161,811A, 410,201A, 339,049A, 4760,013A, 4,734,444A, 2,833,827A, GP2904626B, GP3604580B, and GP3604581B; the selenium salt disclosed in J. V. Crivello et al., Macromolecules, 10 (6), 1307 (1977), J. V. Crivello et al., J. Polymer Sci., Polymer Chem. Ed., 17, 1047 (1979); and the arsonium salt and the pyridinium salt disclosed in C. S. Wen et al., Teh, Proc. Conf. Rad. Curing ASIA, p478 Tokyo, October (1988).

Examples of the onium salt include onium salts represented by General Formulae (RI-I) to (RI-III).

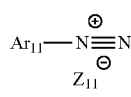

(RI-I)

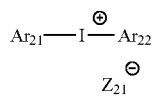

(RI-II)

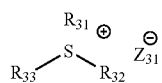

(RI-III)

In Formula (RI-I), $Ar_{11}$ represents an aryl group having 20 or fewer carbon atoms, which may have 1 to 6 substituents, and examples of the preferred substituents include an alkyl group having 1 to 12 carbon atoms, an alkenyl group having 1 to 12 carbon atoms, an alkynyl group having 1 to 12 carbon atoms, an aryl group having 1 to 12 carbon atoms, an alkoxy group having 1 to 12 carbon atoms, an allyloxy group having 1 to 12 carbon atoms, a halogen atom, an alkylamino group having 1 to 12 carbon atoms, a dialkylamino group having 1 to 12 carbon atoms, an alkylamide group or arylamide group having 1 to 12 carbon atoms, a carbonyl group, a carboxyl group, a cyano group, a sulfonyl group, a thioalkyl group having 1 to 12 carbon atoms, and a thioaryl group having 1 to 12 carbon atoms. $Zn_{11}^{-}$ represents a monovalent anion, and it is a halogen ion, a perchlorate ion, a hexafluorophosphate ion, a tetrafluoroborate ion, a sulfonate ion, a sulfinate ion, a thiosulfonate ion, or a sulfate ion, and in terms of stability, it is preferably a perchlorate ion, a hexafluorophosphate ion, a tetrafluoroborate ion, a sulfonate ion, or a sulfinate ion. In Formula (RI-II), $Ar_{21}$ and $Ar_{22}$ each independently represent an aryl group having 20 or fewer carbon atoms, which may have 1 to 6 substituents, and examples of the preferred substituents include an alkyl group having 1 to 12 carbon atoms, an alkenyl group having 1 to 12 carbon atoms, an alkynyl group having 1 to 12 carbon atoms, an aryl group having 1 to 12 carbon atoms, an alkoxy group having 1 to 12 carbon atoms, an allyloxy group having 1 to 12 carbon atoms, a halogen atom, an alkylamino group having 1 to 12 carbon atoms, a dialkylamino group having 1 to 12 carbon atoms, an alkylamide group or arylamide group having 1 to 12 carbon atoms, a carbonyl group, a carboxyl group, a cyano group, a sulfonyl group, a thioalkyl group having 1 to 12 carbon atoms, and a thioaryl group having 1 to 12 carbon atoms. $Z_{21}^{-}$ represents a monovalent anion, and it is a halogen ion, a perchlorate ion, a hexafluorophosphate ion, a tetrafluoroborate ion, a sulfonate ion, a sulfinate ion, a thiosulfonate ion, or a sulfate ion, and in terms of stability and reactivity, it is preferably a perchlorate ion, a hexafluorophosphate ion, a tetrafluoroborate ion, a sulfonate ion, a sulfinate ion, or a carboxylate ion. In Formula (RI-III), $R_{31}$, $R_{32}$, and $R_{33}$ each independently represent an aryl group, alkyl group, alkenyl group, or alkynyl group having 20 or fewer carbon atoms, which may have 1 to 6 substituents, and they are desirably an aryl group preferably in terms of reactivity and stability. Examples of the preferred substituents include an alkyl group having 1 to 12 carbon atoms, an alkenyl group having 1 to 12 carbon atoms, an alkynyl group having 1 to 12 carbon atoms, an aryl group having 1 to 12 carbon atoms, an alkoxy group having 1 to 12 carbon atoms, an allyloxy group having 1 to 12 carbon atoms, a halogen atom, an alkylamino group having 1 to 12 carbon atoms, a dialkylamino group having 1 to 12 carbon atoms, an alkylamide group or arylamide group having 1 to 12 carbon atoms, a carbonyl group, a carboxyl group, a cyano group, a sulfonyl group, a thioalkyl group having 1 to 12 carbon atoms, and a thioaryl group having 1 to 12 carbon atoms. $Z_{31}^{-}$ represents a monovalent anion, and it is a halogen ion, a perchlorate ion, a hexafluorophosphate ion, a tetrafluoroborate ion, a sulfonate ion, a sulfinate ion, a thiosulfonate ion, or a sulfate ion, and in terms of stability and reactivity, it is preferably a perchlorate ion, a hexafluorophosphate ion, a tetrafluoroborate ion, a sulfonate ion, a sulfinate ion, or a carboxylate ion.

Specific examples thereof include the following.

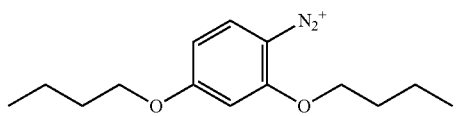

-continued
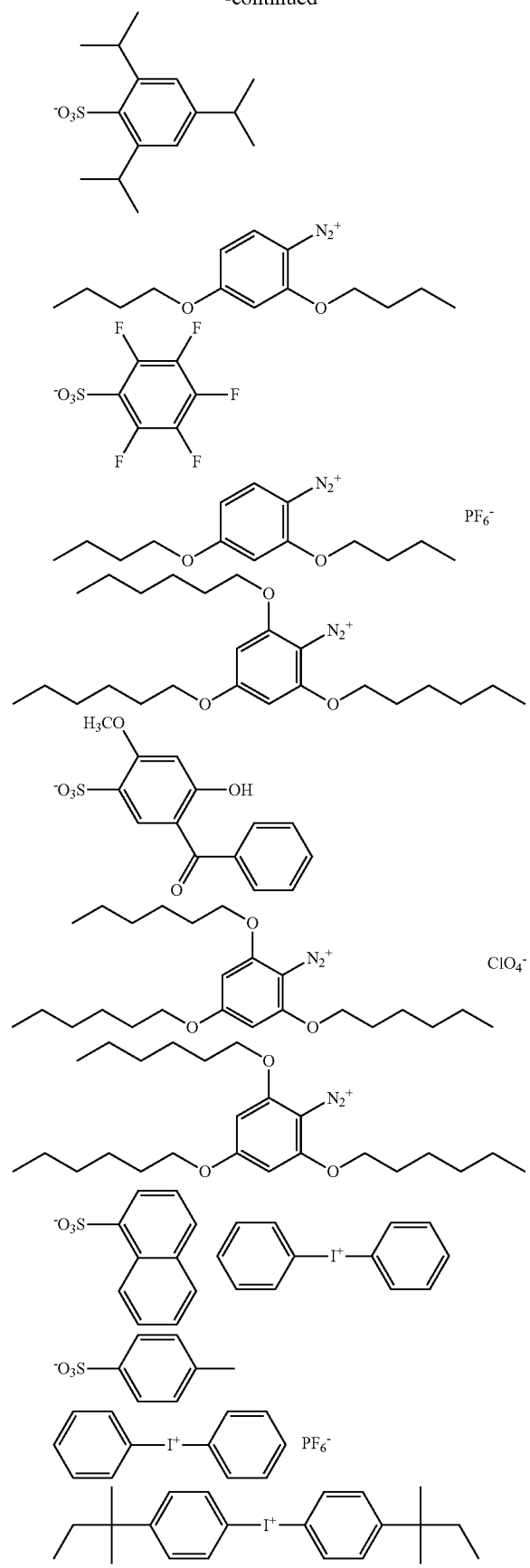
-continued
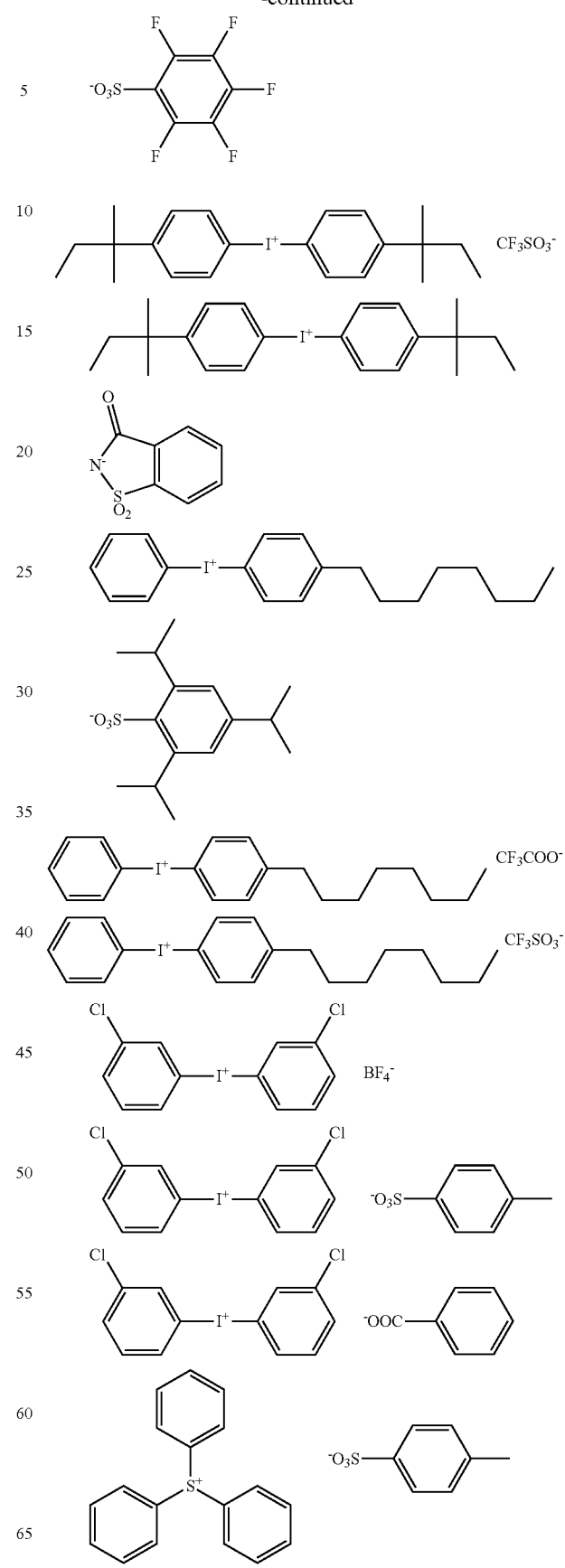

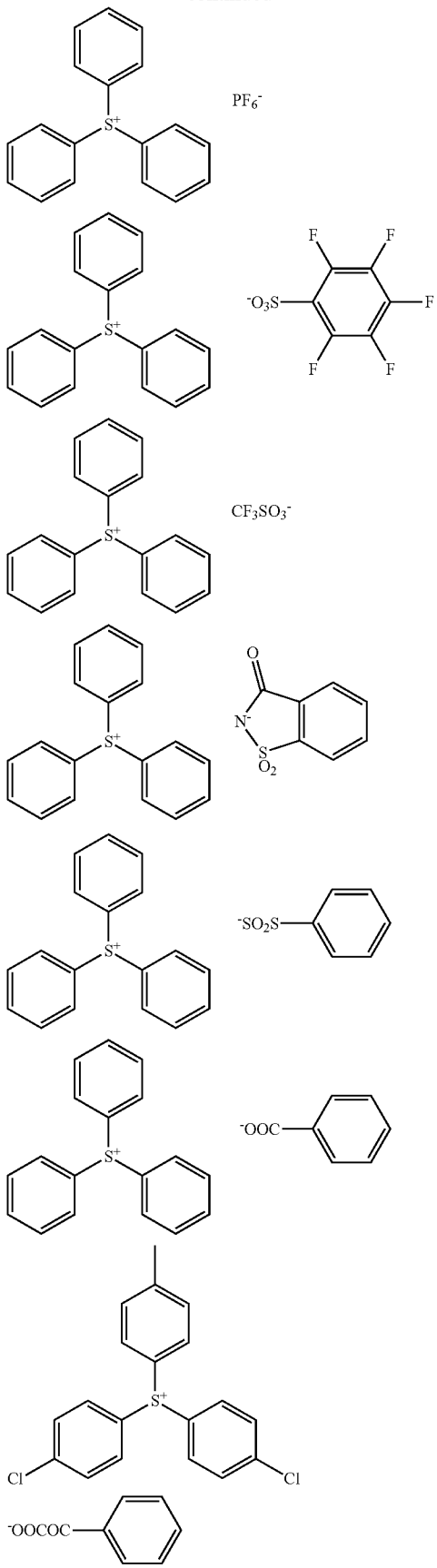
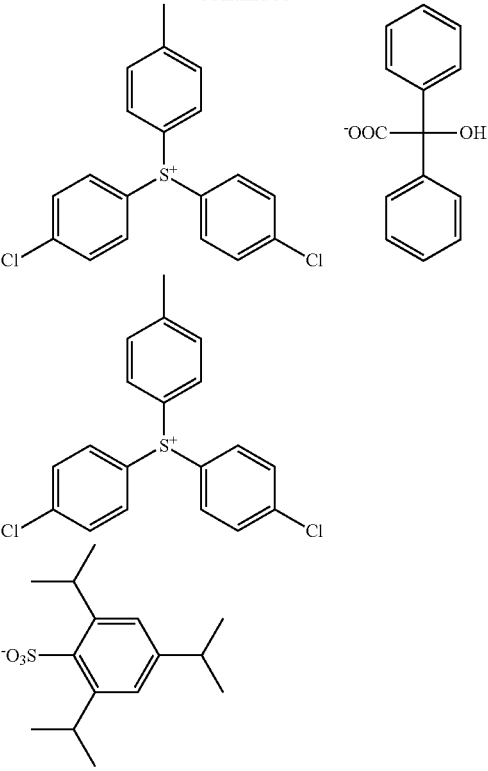

In a case where a photoacid generator is contained, the content thereof is preferably 0.1% to 30% by mass, more preferably 0.1% to 20% by mass, and still more preferably 2% to 15% by mass, with respect to the total solid content of the photocurable resin composition according to the embodiment of the present invention. One kind of photoacid generator may be contained, or two or more kinds thereof may be contained. In a case where two or more kinds of photoacid generators are contained, the total thereof is preferably within the above-described range.

<Photobase Generator>

The photocurable resin composition according to the embodiment of the present invention may contain a photobase generator as the photosensitive compound A.

In a case where the photocurable resin composition contains a photobase generator and a crosslinking agent described later, for example, an aspect in which the crosslinking reaction of the crosslinking agent is promoted by the base generated in the exposed portions, and the exposed portions are difficult to be removed by the developing solution as compared with the unexposed portions can be adopted. According to such an aspect, a negative type relief pattern can be obtained.

The photobase generator is not particularly limited as long as it generates a base upon exposure, and a known one can be used.

Examples thereof include a transition metal compound complex, a compound having a structure such as an ammonium salt, an ionic compound that is neutralized by a base component forming a salt, like a compound that is made to be latent by an amidine portion forming a salt with a carboxylic acid, and a nonionic compound in which a base component is made to be latent by a urethane bond or an oxime bond, such as a carbamate derivative, an oxime ester derivative, or an acyl compound, as described in M. Shirai, and M. Tsunooka, Prog. Polym. Sci., 21, 1 (1996); Masahiro Tsunooka, Polymer application, 46, 2 (1997); C. Kutal, Coord. Chem. Rev., 211, 353 (2001); Y. Kaneko, A. Sarker, and D. Neckers, Chem. Mater., 11, 170 (1999); H. Tachi, M. Shirai, and M. Tsunooka, J. Photopolym. Sci. Technol., 13, 153 (2000); M. Winkle, and K. Graziano, J. Photopolym. Sci. Technol., 3, 419 (1990); M. Tsunooka, H. Tachi, and S. Yoshitaka, J. Photopolym. Sci. Technol, 9, 13 (1996); and K. Suyama, H. Araki, M. Shirai, J. Photopolym. Sci. Technol, 19, 81 (2006).

In the present invention, examples of the more preferred photobase generator include a carbamate derivative, an amide derivative, an imide derivative, α-cobalt complexes, an imidazole derivative, a cinnamic acid amide derivative, and an oxime derivative.

The basic substance that is generated from the photobase generator is not particularly limited, and examples thereof include a compound having an amino group, particularly a polyamine such as a monoamine or a diamine, and an amidine.

The photobase generator is preferably a photobase generator that does contains no salt in the structure thereof, and it is preferable that the nitrogen atom of the base portion that is generated in the photobase generator has no charge. In the photobase generator, it is preferable that the base to be generated is made to be latent using a covalent bond, and it is more preferable that the mechanism of base generation is such that the covalent bond between the nitrogen atom of the base portion to be generated and the adjacent atom is cleaved to generate the base. In a case of a photobase generator that contains no salt in the structure thereof, the photobase generator can be made to be neutral, and thus the solvent solubility is better, whereby the pot life is improved. Due to such reasons, the amine generated from the photobase generator that is used in the present invention is preferably a primary amine or a secondary amine.

In addition, due to the above reason, in the photobase generator, the base to be generated as described above is preferably made to be latent by using a covalent bond, and the base to be generated is more preferably made to be latent by using an amide bond, a carbamate bond, or an oxime bond.

Examples of the photobase generator according to the embodiment of the present invention include photobase generators having a cinnamic acid amide structure, such as those as disclosed in JP2009-080452A and WO2009/123122A, photobase generators having a carbamate structure, such as those disclosed in JP2006-189591A and JP2008-247747A, photobase generators having an oxime structure or a carbamoyl oxime structure, such as those disclosed in JP2007-249013A and JP2008-003581A; however, the photobase generator is not limited to these, and other known photobase generator structures can be used.

In addition, examples of the photobase generator include the compounds described in paragraph numbers 0185 to 0188, 0199 to 0200, and 0202 of JP2012-093746A, the compounds described in paragraph numbers 0022 to 0069 of JP2013-194205A, the compounds described in paragraph numbers 0026 to 0074 of JP2013-204019A, and the compounds described in paragraph number 0052 of WO2010/064631A.

In addition, a commercially available product may be used as the photobase generator. Examples of the commercially available product thereof include WPBG-266, WPBG-300, WPGB-345, WPGB-140, WPBG-165, WPBG-027, WPGB-018, WPGB-015, WPGB-041, WPGB-172, WPGB-174, WPBG-166, WPBG-158, WPGB-025, WPGB-168, WPGB-167, and WPBG-082 (all manufactured by FUJIFILM Wako Pure Chemical Corporation).

In a case where a photobase generator is contained, the content thereof is preferably 0.1% to 30% by mass, more preferably 0.1% to 20% by mass, and still more preferably 2% to 15% by mass, with respect to the total solid content of the photocurable resin composition according to the embodiment of the present invention. Only one kind of the photobase generator may be contained, or two or more kinds thereof may be contained. In a case where two or more kinds of photobase generators are contained, the total thereof is preferably within the above-described range.

<Photosensitive Compound B>

In the first aspect of the method of manufacturing a cured film according to the embodiment of the present invention, the photocurable resin composition contains a compound which is the photosensitive compound B having no sensitivity to the exposure wavelength in the first exposure step and having a sensitivity to the exposure wavelength in the second exposure step.

The fact that the photosensitive compound B has no sensitivity to the exposure wavelength in the first exposure step and the fact that it has a sensitivity to the exposure wavelength in the second exposure step are determined by the same method as the method of determining whether or not having a sensitivity, described in the explanation of the photosensitive compound A described above.

In the first aspect, examples of the photosensitive compound B include a compound that is the photopolymerization initiator, the photoacid generator, or the photobase generator, which is the same as the photosensitive compound A described above, where the compound has a sensitivity at an exposure wavelength different from that of a compound selected as the photosensitive compound A.

As an example, in a case where a photoradical polymerization initiator having a sensitivity in the vicinity of 365 nm is used as the photosensitive compound A, a photoacid generator having a sensitivity in the vicinity of 216 nm can be used as the photosensitive compound B.

In addition, as another example, in a case where a photoradical polymerization initiator having a sensitivity in the vicinity of 365 nm is used as the photosensitive compound A, a photoradical polymerization initiator having a sensitivity in the vicinity of 270 nm can also be used as the photosensitive compound B.

In the second aspect of the method of manufacturing a cured film according to the embodiment of the present invention, the difference between the maximum absorption wavelength of the photosensitive compound A and the maximum absorption wavelength of the photosensitive compound B is as described above.

The maximum absorption wavelength of the photosensitive compound B is preferably 190 to 450 nm and more preferably 190 to 315 nm.

The maximum absorption wavelength of the photosensitive compound B is measured by the method described above.

In the second aspect, examples of the photosensitive compound B include a compound that is the photopolymerization initiator, the photoacid generator, or the photobase generator, which is the same as the photosensitive compound A described above, where the compound has a maximum absorption wavelength separated by 80 nm or more from that of a compound selected as the photosensitive compound A.

As an example, in a case where a photoradical polymerization initiator having a maximum absorption wavelength in the vicinity of 365 nm is used as the photosensitive compound A, a photoacid generator having a maximum absorption wavelength in the vicinity of 216 nm can be used as the photosensitive compound B.

In addition, as another example, in a case where a photoradical polymerization initiator having a maximum absorption wavelength in the vicinity of 365 nm is used as the photosensitive compound A, a photoradical polymerization initiator having a maximum absorption wavelength in the vicinity of 270 nm can also be used as the photosensitive compound B.

In a case where a photopolymerization initiator, a photoacid generator, or a photobase generator is used as the photosensitive compound B, the preferred content of this compound is the same as the preferred content of this compound in a case of being used as the photosensitive compound A.

In addition, the preferred combination of the photosensitive compound A and the photosensitive compound B is as described in the aspect 1 to the aspect 7 described above.

The photosensitive compound B is preferably a compound that generates an acid from the second exposure step. Examples of the compound that generates an acid in the second exposure step include the above-described photoacid generator.

In a case where the photosensitive compound B is a compound that generates an acid in the second exposure step, the photocurable resin composition according to the embodiment of the present invention preferably contains another crosslinking agent described later.

The photosensitive compound B is preferably a compound that generates a radical in the second exposure step. Examples of the compound that generates a radical in the second exposure step include the above-described photoradical polymerization initiator.

In a case where the photosensitive compound B is a compound that generates a radical in the second exposure step, the photocurable resin composition according to the embodiment of the present invention preferably contains a radical crosslinking agent described later.

The photosensitive compound B is preferably a compound that generates a base in the second exposure step. Examples of the compound that generates a base in the second exposure step include the above-described photobase generator.

In a case where the photosensitive compound B is a compound that generates a base in the second exposure step, the photocurable resin composition according to the embodiment of the present invention preferably contains another crosslinking agent described later and more preferably contains an epoxy compound described later.

<Solvent>

The photocurable resin composition according to the embodiment of the present invention preferably contains a solvent.

As the solvent, any known solvent can be used. The solvent is preferably an organic solvent. Examples of the organic solvent include compounds such as esters, ethers, ketones, cyclic hydrocarbons, sulfoxides, and amides, and alcohols.

Suitable examples of the esters include ethyl acetate, n-butyl acetate, isobutyl acetate, hexyl acetate, amyl formate, isoamyl acetate, butyl propionate, isopropyl butyrate, ethyl butyrate, butyl butyrate, methyl lactate, ethyl lactate, γ-butyrolactone, ε-caprolactone, δ-valerolactone, alkyl alkyloxyacetate (for example, methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), 3-alkyloxypropionic acid alkyl esters (for example, methyl 3-alkyloxypropionate, and ethyl 3-alkyloxypropionate (for example, methyl 3-methoxypropionate, ethyl 3-methoxypropionate, methyl 3-ethoxypropionate, and ethyl 3-ethoxypropionate)), 2-alkyloxypropionic acid alkyl esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methylpropionate and ethyl 2-alkyloxy-2-methylpropionate (for example, methyl 2-methoxy-2-methylpropionate and ethyl 2-ethoxy-2-methylpropionate), methyl pyruvate, ethyl pyruvate, propyl pyruvate, methyl acetoacetate, ethyl acetoacetate, methyl 2-oxobutanoate, ethyl 2-oxobutanoate, ethyl hexanoate, ethyl heptanoate, dimethyl malonate, and diethyl malonate.

Suitable examples of the ethers include diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, ethylene glycol monobutyl ether, ethylene glycol monobutyl ether acetate, diethylene glycol ethyl methyl ether, and propylene glycol monopropyl ether acetate.

Suitable examples of the ketones include methyl ethyl ketone, cyclohexanone, cyclopentanone, 2-heptanone, 3-heptanone, 3-methylcyclohexanone, levoglucosenone, and dihydrolevoglucosenone.

Suitable examples of the cyclic hydrocarbon include aromatic hydrocarbons such as toluene, xylene, and anisole, and cyclic terpenes such as limonene.

Suitable examples of the sulfoxides include dimethyl sulfoxide.

Suitable examples of the amide include N-methyl-2-pyrrolidone, N-ethyl-2-pyrrolidone, N,N-dimethylacetamide, N,N-dimethylformamide, N,N-dimethylisobutylamide, 3-methoxy-N,N-dimethylpropionamide, 3-butoxy-N,N-dimethylpropionamide, N-formylmorpholine, and N-acetylmorpholine.

Suitable examples of the urea include N,N,N',N'-tetramethylurea and 1,3-dimethyl-2-imidazolidinone.

Examples of the alcohols include methanol, ethanol, 1-propanol, 2-propanol, 1-butanol, 1-pentanol, 1-hexanol, benzyl alcohol, ethylene glycol monomethyl ether, 1-methoxy-2-propanol, 2-ethoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methylphenyl carbinol, n-amyl alcohol, methylamyl alcohol, and diacetone alcohol.

From the viewpoint of improving the properties of a coated surface or the like, it is also preferable to mix two or more kinds of solvents.

In the present invention, the solvent is preferably one solvent selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclopentanone, γ-butyrolactone, dimethyl sulfoxide, ethyl carbitol acetate, butyl carbitol acetate, N-methyl-2-pyrrolidone, propylene glycol methyl ether, and propylene glycol methyl ether acetate, or a mixed solvent composed of two or more solvents selected therefrom. A combination of dimethyl sulfoxide and γ-butyrolactone is particularly preferable. In addition, a combination of N-methyl-2-pyrrolidone and ethyl lactate a combination of diacetone alcohol and ethyl lactate, or a combination of cyclopentanone and γ-butyrolactone is also preferable.

From the viewpoint of coating property, the content of the solvent is such that the total solid content concentration of the photocurable resin composition according to the embodiment of the present invention is preferably 5% to 80% by mass, more preferably 5% to 75% by mass, still more preferably 10% to 70% by mass, even still more preferably 20% to 70% by mass, and even further still more preferably 40% to 70% by mass. The content of the solvent may be adjusted depending on the desired thickness of the coating film and the coating method.

One kind of solvent may be contained, or two or more kinds thereof may be contained. In a case where two or more kinds of solvents are contained, the total thereof is preferably within the above-described range.

<Crosslinking Agent>

The photocurable resin composition according to the embodiment of the present invention preferably contains a crosslinking agent.

The crosslinking agent is preferably a crosslinking agent having a group in which a bonding reaction with another group is promoted by the photosensitization of the photosensitive compound B in the second exposure step under the condition 2 described above.

Examples of the crosslinking agent include a radical crosslinking agent and another crosslinking agent.

<Radical Crosslinking Agent>

The photocurable resin composition according to the embodiment of the present invention preferably further contains a radical crosslinking agent.

The radical crosslinking agent is a compound having a radically polymerizable group. The radically polymerizable group is preferably a group containing an ethylenically unsaturated bond. Examples of the group containing the ethylenically unsaturated bond include groups having an ethylenically unsaturated bond, such as a vinyl group, an allyl group, a vinylphenyl group, and a (meth)acryloyl group.

Among these, the (meth)acryloyl group is preferable as the group containing the ethylenically unsaturated bond, and a (meth)acryloxy group is more preferable from the viewpoint of reactivity.

It is sufficient that the radical crosslinking agent is a compound having one or more ethylenically unsaturated bonds; however, a compound having two or more ethylenically unsaturated bonds is more preferable.

The compound having two ethylenically unsaturated bonds is preferably a compound having two groups containing the above ethylenically unsaturated bond.

In addition, from the viewpoint of the film hardness of the cured film to be obtained, the photocurable resin composition according to the embodiment of the present invention preferably contains a compound having three or more ethylenically unsaturated bonds as the radical crosslinking agent. The compound having 3 or more ethylenically unsaturated bonds is preferably a compound having 3 to 15 ethylenically unsaturated bonds, more preferably a compound having 3 to 10 ethylenically unsaturated bonds, and still more preferably a compound having 3 to 6 ethylenically unsaturated bonds.

In addition, the compound having 3 or more ethylenically unsaturated bonds is preferably a compound having 3 or more groups containing the ethylenically unsaturated bond, more preferably a compound having 3 to 15 groups containing the ethylenically unsaturated bond, still more preferably a compound having 3 to 10 groups containing the ethylenically unsaturated bond, and particularly preferably a compound having 3 to 6 groups containing the ethylenically unsaturated bond.

In addition, from the viewpoint of the film hardness of the cured film to be obtained, the photocurable resin composition according to the embodiment of the present invention preferably contains a compound having two ethylenically unsaturated bonds and a compound having three or more ethylenically unsaturated bonds.

On the other hand, from the viewpoint of developability, the radical crosslinking agent is particularly preferably a compound having two ethylenically unsaturated bonds.

The molecular weight of the radical crosslinking agent is preferably 2,000 or less, more preferably 1,500 or less, and still more preferably 900 or less. The lower limit of the molecular weight of the radical crosslinking agent is preferably 100 or more.

Specific examples of the radical crosslinking agent include unsaturated carboxylic acids (for example, acrylic acid, methacrylic acid, itaconic acid, crotonic acid, isocrotonic acid, and maleic acid), and esters and amides thereof, and esters formed from unsaturated carboxylic acids and polyhydric alcohol compounds or amides formed from unsaturated carboxylic acids and polyvalent amine compounds are preferable. In addition, addition reaction products produced by reacting unsaturated carboxylic acid esters or amides, having a nucleophilic substituent such as a hydroxy group, an amino group, or a sulfanyl group, with monofunctional or polyfunctional isocyanates or epoxies, dehydration condensation reaction products produced by reacting the above esters or amides with a monofunctional or polyfunctional carboxylic acid, or the like are also suitably used. In addition, an addition reaction product produced by reacting unsaturated carboxylic acid esters or amides, having an electrophilic substituent such as an isocyanate group or an epoxy group, with monofunctional or polyfunctional alcohols, amines, or thiols, and further, a substitution reaction product produced by reacting unsaturated carboxylic acid esters or amides, having an eliminable substituent such as a halogen group or a tosyloxy group, with monofunctional or polyfunctional alcohols, amines, or thiols are also suitable. In addition, as other examples, it is also possible to use a group of compounds in which the unsaturated carboxylic acid described above is replaced with an unsaturated phosphonic acid, a vinylbenzene derivative such as styrene, a vinyl ether, an allyl ether, or the like. Regarding the specific examples thereof, the description of paragraphs 0113 to 0122 of JP2016-027357A can be referenced, the content of which is incorporated in the present specification.

In addition, the radical crosslinking agent is also preferably a compound having a boiling point of 100° C. or higher under atmospheric pressure. Examples thereof include a compound obtained by adding ethylene oxide or propylene oxide to a polyfunctional alcohol such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri (acryloyloxypropyl)ether, tri(acryloyloxyethyl) isocyanurate, glycerin, and trimethylolethane, and then being subjected to (meth)acrylation, urethane (meth)acrylates respectively described in JP1973-041708B (JP-S48-041708B), JP1975-006034B (JP-S50-006034B), and JP1976-037193A (JP-S51-037193A), polyester acrylates respectively described in JP1973-064183A (JP-S48-064183A), JP1974-043191B (JP-S49-043191B), and JP1977-030490B (JP-S52-030490B), polyfunctional acrylates or methacrylates such as epoxy acrylates which are reaction products of epoxy resins and (meth)acrylic acid, and mixtures thereof. In addition, the compounds described in paragraphs 0254 to 0257 of JP2008-292970A are also suitable. In addition, the polyfunctional (meth)acrylate or the like obtained by reacting a compound having a cyclic ether group with an ethylenically unsaturated bond, such as glycidyl (meth)acrylate, with polyfunctional carboxylic acid can also be mentioned.

In addition, as the preferred radical crosslinking agent other than those described above, a compound having two or more groups containing a fluorene ring and an ethylenically unsaturated bond and a cardo resin, which are described in JP2010-160418A, JP2010-129825A, and JP4364216B, can also be used.

Further, other examples thereof include the specific unsaturated compounds described in JP1971-043946B (JP-S46-043946B), JP1989-040337B (JP-H01-040337B), and JP1989-040336B (JP-H01-040336B), and the vinylphosphonic acid-based compound described in JP1990-025493A (JP-H02-025493A). In addition, the compounds containing a perfluoroalkyl group described in JP1986-022048A (JP-S61-022048A) can also be used. Furthermore, photopolymerizable monomers and oligomers which are described in Journal of the Adhesion Society of Japan, Vol. 20, No. 7, pages 300 to 308 (1984) can also be used.

In addition to the above, the compounds described in paragraphs 0048 to 0051 of JP2015-034964A or the compounds described in paragraphs 0087 to 0131 of WO2015/199219A can also be preferably used, the contents of which are incorporated in the present specification.

In addition, the compounds which are represented as Formula (1) and Formula (2) in JP1998-062986A (JP-H10-062986A), described together with the specific examples thereof, which are obtained by adding ethylene oxide or propylene oxide to a polyfunctional alcohol and then being subjected to (meth)acrylation can be used as a radical crosslinking agent.

Further, the compounds described in paragraphs 0104 to 0131 of JP2015-187211A can also be used as the radical crosslinking agent, the content of which is incorporated in the present specification.

As the radical crosslinking agent, dipentaerythritol triacrylate (as a commercially available product, KAYARAD D-330; manufactured by Nippon Kayaku Co., Ltd.), dipentaerythritol tetraacrylate (as a commercially available product, KAYARAD D-320; Nippon Kayaku Co., Ltd., A-TMMT: manufactured by Shin-Nakamura Chemical Co., Ltd.), dipentaerythritol penta(meth)acrylate (as a commercially available product, KAYARAD D-310; manufactured by Nippon Kayaku Co., Ltd.), dipentaerythritol hexa(meth) acrylate (as a commercially available product, KAYARAD DPHA; by Nippon Kayaku Co., Ltd., A-DPH; manufactured by Shin-Nakamura Chemical Co., Ltd.), or a structure in which a (meth)acryloyl group thereof is bonded through an ethylene glycol residue or a propylene glycol residue is preferable. Oligomer types thereof can also be used.

Examples of the commercially available product of the radical crosslinking agent include SR-494 which is a tetrafunctional acrylate having four ethyleneoxy chains, manufactured by Sartomer Company Inc., SR-209, 231, and 239 which are a difunctional methacrylate having four ethyleneoxy chains, manufactured by Sartomer Company Inc., DPCA-60 which is a hexafunctional acrylate having six pentyleneoxy chains, manufactured by Nippon Kayaku Co., Ltd., TPA-330 which is a trifunctional acrylate having three isobutylene oxy chains, a urethane oligomer UAS-10, UAB-140 (manufactured by Nippon Paper Industries Co., Ltd.), NK Ester M-40G, NK Ester 4G, NK Ester M-9300, NK Ester A-9300, UA-7200 (manufactured by Shin-Nakamura Chemical Co., Ltd.), DPHA-40H (manufactured by Nippon Kayaku Co., Ltd.), UA-306H, UA-306T, UA-306I, AH-600, T-600, AI-600 (manufactured by KYOEISHA CHEMICAL Co., Ltd.), and Brenmer PME400 (manufactured by NOF Corporation).

As the radical crosslinking agent, the urethane acrylates as described in JP1973-041708B (JP-S48-041708B), JP1976-037193A (JP-S51-037193A), JP1990-032293B (JP-H02-032293B), and JP1990-016765B (JP-H02-016765B), and the urethane compounds having an ethylene oxide-based skeleton described in JP1983-049860B (JP-S58-049860B), JP1981-017654B (JP-S56-017654B), JP1987-039417B (JP-S62-039417B), and JP1987-039418B (JP-S62-039418B) are also suitable. Further, as the radical crosslinking agent, the compounds having an amino structure or a sulfide structure in a molecule as described in JP1988-277653A (JP-S63-277653A), JP1988-260909A (JP-S63-260909A), and JP1989-105238A (JP-H01-105238A) can also be used.

The radical crosslinking agent may be a radical crosslinking agent having an acid group such as a carboxy group or a phosphoric acid group. The radical crosslinking agent having an acid group is preferably an ester of an aliphatic polyhydroxy compound and an unsaturated carboxylic acid and more preferably a radical crosslinking agent obtained by reacting an unreacted hydroxy group of an aliphatic polyhydroxy compound with a non-aromatic carboxylic acid anhydride to have an acid group. The radical crosslinking agent is particularly preferably a compound in which an aliphatic polyhydroxy compound is pentaerythritol or dipentaerythritol in a radical crosslinking agent having an acid group obtained by reacting an unreacted hydroxy group of the aliphatic polyhydroxy compound with a non-aromatic carboxylic acid anhydride. Examples of the commercially available product thereof include M-510 and M-520 as polybasic acid-modified acrylic oligomers which are manufactured by Toagosei Co., Ltd.

The acid value of the radical crosslinking agent having an acid group is preferably 0.1 to 40 mgKOH/g, and particularly preferably 5 to 30 mgKOH/g. In a case where the acid value of the radical crosslinking agent is within the above-described range, excellent manufacturing handleability is exhibited, and furthermore, excellent developability is exhibited. In addition, good polymerization properties are exhibited. On the other hand, from the viewpoint of the speed of development in a case of carrying out alkaline development, the acid value of the radical crosslinking agent having an acid group is preferably 0.1 to 300 mgKOH/g and particularly preferably 1 to 100 mgKOH/g. The acid value is measured according to the description of JIS K 0070: 1992.

In the photocurable resin composition according to the embodiment of the present invention, it is preferable to use difunctional methacrylate or acrylate from the viewpoint of pattern resolution and film elasticity.

As the specific compound, the following compound can be used; triethylene glycol diacrylate, triethylene glycol dimethacrylate, tetraethylene glycol dimethacrylate, tetraethylene glycol diacrylate, and PEG200 diacrylate (which is polyethylene glycol diacrylate and in which a formula weight of the polyethylene glycol chain is 200), PEG200 dimethacrylate, PEG600 diacrylate, PEG600 dimethacrylate, polytetraethylene glycol diacrylate, polytetraethylene glycol dimethacrylate, neopentyl glycol diacrylate, neopentyl glycol dimethacrylate, 3-methyl-1, 5-pentanediol diacrylate, 1,6-hexanediol diacrylate, 1,6-hexanediol dimethacrylate, dimethylol-tricyclodecanediacrylate, dimethyloltricyclodecanedimethacrylate, diacrylate of an ethylene oxide (EO) adduct of bisphenol A, dimethacrylate of an EO adduct of bisphenol A, diacrylate of a propylene oxide (PO) adduct of bisphenol A, dimethacrylate of an PO adduct of bisphenol A, 2-hydroxy-3-acryloyloxypropyl methacrylate, isocyanuric acid EO-modified diacrylate, isocyanuric acid-PO modified dimethacrylate, another difunctional acrylate having a urethane bond, and difunctional methacrylate having a urethane bond. As necessary, two or more of these can be mixedly used.

From the viewpoint of suppressing warping associated with the control of the elastic modulus of the cured film, a monofunctional radical crosslinking agent can be preferably used as the radical crosslinking agent. As the monofunctional radical crosslinking agent, (meth)acrylic acid derivatives such as n-butyl (meth)acrylate, 2-ethylhexyl (meth)acrylate, 2-hydroxyethyl (meth)acrylate, butoxyethyl (meth)acrylate, carbitol (meth)acrylate, cyclohexyl (meth)acrylate, benzyl (meth)acrylate, phenoxyethyl (meth)acrylate, N-methylol (meth)acrylamide, glycidyl (meth)acrylate, polyethylene glycol mono(meth)acrylate, and polypropylene glycol mono(meth)acrylate, N-vinyl compounds such as N-vinylpyrrolidone and N-vinylcaprolactam, allyl glycidyl ethers, and the like are preferably used. As the monofunctional radical crosslinking agent, a compound having a boiling point of 100° C. or higher under atmospheric pressure is also preferable in order to suppress volatilization before exposure.

In addition, as a difunctional or higher functional radical crosslinking agent, allyl compounds such as diallyl phthalate and triallyl trimellitate can also be used.

In a case where a radical crosslinking agent is contained, the content thereof is preferably more than 0% by mass and 60% by mass or less with respect to the total solid content of the photocurable resin composition according to the embodiment of the present invention. The lower limit thereof is more preferably 5% by mass or more. An upper limit is more preferably 50% by mass or less and still more preferably 30% by mass or less.

One kind of radical crosslinking agent may be used alone, or two or more kinds thereof may be mixedly used. In a case where two or more kinds thereof are used in combination, the total amount thereof is preferably in the above range.

<Another Crosslinking Agent>

The photocurable resin composition according to the embodiment of the present invention preferably contains another crosslinking agent different from the radical crosslinking agent described above.

In the present invention, the other crosslinking agent refers to a crosslinking agent other than the above-described radical crosslinking agent. It is preferably a compound having a plurality of groups, in the molecule, which promotes a reaction of forming a covalent bond between other compounds in the composition or reaction products thereof, by the photosensitization of the above-described photosensitive compound A or photosensitive compound B, and it is more preferably a compound having a plurality of groups, in the molecule, which promotes a reaction of forming a covalent bond between other compounds in the composition or reaction products thereof, by the action of the acid or the base.

The above acid or the above base is an acid or a base, which is generated from a photoacid generator or a photobase generator, which is the photosensitive compound A or the photosensitive compound B in the first exposure step or the second exposure step.

The other crosslinking agent is preferably a compound having at least one group selected from the group consisting of a methylol group and an alkoxymethyl group, and more preferably a compound having a structure in which at least one group selected from the group consisting of a methylol group and an alkoxymethyl group is directly bonded to a nitrogen atom.

Examples of the other crosslinking agent include a compound having a structure in which formaldehyde, or formaldehyde and alcohol are reacted with an amino group-containing compound such as melamine, glycoluril, urea, an alkylene urea, or benzoguanamine to substitute a hydrogen atom of the amino group with a methylol group or an alkoxymethyl group. The method of producing these compounds is not particularly limited, and any compound having the same structure as the compound produced by the above method may be used. In addition, oligomers formed by the self-fusion of the methylol groups of these compounds may be used.

As the above amino group-containing compound, the crosslinking agent in which melamine is used is referred to as a melamine-based crosslinking agent, the crosslinking agent in which glycoluril, urea, or an alkylene urea is used is referred to a urea-based crosslinking agent, the crosslinking agent in which an alkylene urea is used is referred to as an alkylene urea-based crosslinking agent, and the crosslinking agent in which benzoguanamine is used is referred to as a benzoguanamine-based crosslinking agent.

Among these, the photocurable resin composition according to the embodiment of the present invention preferably contains at least one compound selected from the group consisting of a urea-based crosslinking agent and a melamine-based crosslinking agent and more preferably contains at least one compound selected from the group consisting of a glycoluril-based crosslinking agent described later and a melamine-based crosslinking agent.

Specific examples of the melamine-based crosslinking agent include hexamethoxymethylmelamine, hexaethoxymethylmelamine, hexapropoxymethylmelamine, and hexabutoxybutylmelamine.

Specific examples of the urea-based crosslinking agent include glycoluril-based crosslinking agents such as monohydroxymethylated glycoluril, dihydroxymethylated glycoluril, trihydroxymethylated glycoluril, tetrahydroxymethylated glycoluril, monomethoxymethylated glycoluril, dimethoxymethylated glycoluril, trimethoxymethylated glycoluril, tetramethoxymethylated glycoluril, monomethoxymethylated glycoluril, dimethoxymethylated glycoluril, trimethoxymethylated glycoluril, tetraethoxymethylated glycoluril, monopropoxymethylated glycoluril, dipropoxymethylated glycoluril, tripropoxymethylated glycoluril, tetrapropoxymethylated glycoluril, monobutoxymethylated glycoluril, dibutoxymethylated glycoluril, tributoxymethylated glycoluril, and tetrabutoxymethylated glycoluril, urea-based crosslinking agents such as bismethoxymethylurea, bisethoxymethylurea, bispropoxymethylurea, and bisbutoxymethylurea, ethylene urea-based crosslinking agents such as monohydroxymethylated ethylene urea or dihydroxymethylated ethylene urea, monomethoxymethylated ethylene urea, dimethoxymethylated ethylene urea, monoethoxymethylated ethylene urea, diethoxymethylated ethylene urea, monopropoxymethylated ethylene urea, dipropoxymethylated ethylene urea, monobutoxymethylated ethylene urea, and dibutoxymethylated ethylene urea, propylene urea-based crosslinking agents such as monohydroxymethylated propylene urea, dihydroxymethylated propylene urea, monomethoxymethylated propylene urea, dimethoxymethylated propylene urea, monodiethoxymethylated propylene urea, diethoxymethylated propylene urea, monopropoxymethylated propylene urea, dipropoxymethylated propylene urea, monobutoxymethylated propylene urea, and dibutoxymethylated propylene urea, 1,3-di(methoxymethyl)-4,5-dihydroxy-2-imidazolidinone, and 1,3-di(methoxymethyl)-4,5-dimethoxy-2-imidazolidinone.

Specific examples of the benzoguanamine-based crosslinking agent include monohydroxymethylated benzoguanamine, dihydroxymethylated benzoguanamine, trihydroxymethylated benzoguanamine, tetrahydroxymethylated benzoguanamine, monomethoxymethylated benzoguanamine, dimethoxymethylated benzoguanamine, trimethoxymethylated benzoguanamine, tetramethoxymethylated benzoguanamine, monomethoxymethylated benzoguanamine, dimethoxymethylated benzoguanamine, trimethoxymethylated benzoguanamine, tetraethoxymethylated benzoguanamine, monopropoxymethylated benzoguanamine, dipropoxymethylated benzoguanamine, tripropoxymethylated benzoguanamine, tetrapropoxymethylated benzoguanamine, monobutoxymethylated benzoguanamine, dibutoxymethylated benzoguanamine, tributoxymethylated benzoguanamine, and tetrabutoxymethylated benzoguanamine.

In addition, as the compound having at least one group selected from the group consisting of a methylol group and an alkoxymethyl group, a compound in which at least one group selected from the group consisting of a methylol group and an alkoxymethyl group is directly bonded to an aromatic ring (preferably a benzene ring) can also be suitably used.

Specific examples of such compounds include benzenedimethanol, bis(hydroxymethyl)cresol, bis(hydroxymethyl)dimethoxybenzene, bis(hydroxymethyl)diphenyl ether, bis(hydroxymethyl)benzophenone, hydroxymethylphenyl hydroxymethylbenzoate, bis(hydroxymethyl)biphenyl, dimethylbis(hydroxymethyl)biphenyl, bis(methoxymethyl)benzene, bis(methoxymethyl)cresol, bis(methoxymethyl)dimethoxybenzene, bis(methoxymethyl)diphenyl ether, bis(methoxymethyl)benzophenone, methoxymethylphenyl methoxymethylbenzoate, bis(methoxymethyl)biphenyl, dimethylbis(methoxymethyl)biphenyl, 4,4',4"-ethylidenetris[2,6-bis(methoxymethyl)phenol], 5, 5'-[2,2,2-trifluoro-1-(trifluoromethyl)ethylidene]bis[2-hydroxy-1,3-benzenedimethanol], and 3,3',5,5'-tetrakis(methoxymethyl)-1,1'-biphenyl-4,4'-diol.

As the other crosslinking agent, a commercially available product may be used, and examples of the suitable commercially available product include 46DMOC and 46DMOEP (all manufactured by ASAHI YUKIZAI Corporation), DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DML-BisOCHP-Z, DML-BPC, DMLBisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, and HMOM-TPHAP (all manufactured by Honshu Chemical Industry Co., Ltd.), and NIKALAC (registered trade name, the same applies hereinafter) MX-290, NIKALAC MX-280, NIKALAC MX-270, NIKALAC MX-279, NIKALAC MW-100LM, and NIKALAC MX-750LM (all manufactured by Sanwa Chemical Co., Ltd.).

In addition, the photocurable resin composition according to the embodiment of the present invention preferably contains, as the other crosslinking agent, at least one compound selected from the group consisting of an epoxy compound, an oxetane compound, and a benzoxazine compound.

[Epoxy Compound (Compound Having Epoxy Group)]

The epoxy compound is preferably a compound having two or more epoxy groups in one molecule. Since the epoxy group undergoes a crosslinking reaction at 200° C. or lower and a dehydration reaction derived from crosslinking does not occur, film shrinkage hardly occurs. Therefore, containing an epoxy compound is effective for the low-temperature curing of the photocurable resin composition and the suppression of warping.

The epoxy compound preferably contains a polyethylene oxide group. As a result, it is possible to further decrease the elastic modulus and suppress the warping. The polyethylene oxide group means a group in which the number of repeating units of ethylene oxide is 2 or more, and the number of repeating units is preferably 2 to 15.

Examples of the epoxy compound include a bisphenol A type epoxy resin; a bisphenol F type epoxy resin; an alkylene glycol type epoxy resin or a polyhydric alcohol hydrocarbon type epoxy resin, such as propylene glycol diglycidyl ether, neopentyl glycol diglycidyl ether, ethylene glycol diglycidyl ether, butylene glycol diglycidyl ether, hexamethylene glycol diglycidyl ether, or trimethylolpropane triglycidyl ether; a polyalkylene glycol type epoxy resin such as polypropylene glycol diglycidyl ether; and an epoxy group-containing silicone such as polymethyl (glycidyloxypropyl)siloxane; however, the epoxy compound is not limited thereto. Specific examples thereof include EPICLON (registered trade name) 850-S, EPICLON (registered trade name) HP-4032, EPICLON (registered trade name) HP-7200, EPICLON (registered trade name) HP-820, EPICLON (registered trade name) HP-4700, EPICLON (registered trade name) EXA-4710, EPICLON (registered trade name) HP-4770, EPICLON (registered trade name) EXA-859CRP, EPICLON (registered trade name) EXA-1514, EPICLON (registered trade name) EXA-4880, EPICLON (registered trade name) EXA-4850-150, EPICLON EXA-4850-1000 (registered trade name), EPICLON (registered trade name) EXA-4816, EPICLON (registered trade name) EXA-4822, EPICLON (registered trade name) EXA-830LVP, EPICLON (registered trade name) EXA-8183, EPICLON (registered trade name) EXA-8169, EPICLON (registered trade name) N-660, EPICLON (registered trade name) N-665-EXP-S, EPICLON (registered trade name) N-740 (all product names, manufactured by DIC Corporation), and RIKARESIN (registered trade name) BEO-20E; RIKARESIN (registered trade name) BEO-60E, RIKARESIN (registered trade name) HBE-100, RIKARESIN (registered trade name) DME-100, and RIKARESIN (registered trade name) L-200 (product name, manufactured by New Japan Chemical Co., Ltd.); EP-4003S, EP-4000S, EP-4088S, and EP-3950S (all product names, manufactured by ADEKA Corporation); CELLOXIDE (registered trade name) 2021P, 2081, 2000, 3000, EHPE3150, EPOLEAD (registered trade name) GT400, EPOLEAD (registered trade name) GT401, EPOLEAD (registered trade name) PB4700, EPOLEAD (registered trade name) PB3600, and SELVINERS (registered trade name) B0134, B0177 (all product names, manufactured by Daicel Corporation); and NC-3000, NC-3000-L, NC-3000-H, NC-3000-FH-75M, NC-3100, CER-3000-L, NC-2000-L, XD-1000, NC-7000L, NC-7300L, EPPN-501H, EPPN-501HY, EPPN-502H, EOCN-1020, EOCN-102S, EOCN-103S, EOCN-104S, CER-1020, EPPN-201, BREN-S, and BREN-10S (all product names, manufactured by Nippon Kayaku Co., Ltd.).

[Oxetane Compound (Compound Having Oxetanyl Group)]

Examples of the oxetane compound include a compound having two or more oxetane rings in one molecule, 3-ethyl-3-hydroxymethyloxetane, 1,4-bis{[(3-ethyl-3-oxetanyl)methoxy]methyl}benzene, 3-ethyl-3-(2-ethylhexylmethyl)oxetane, and 1,4-benzenedicarboxylic acid-bis[(3-ethyl-3-oxetanyl)methyl]ester. As specific examples thereof, ARON OXETANE series (for example, OXT-121, OXT-221, OXT-191, OXT-223) manufactured by Toagosei Co., Ltd., can be suitably used, and these can be used alone or two or more thereof may be mixedly used.

[Benzoxazine Compound (Compound Having Benzoxazolyl Group)]

Due to a crosslinking reaction derived from a ring-opening addition reaction, the benzoxazine compound does not result in degassing during curing and results in decreased thermal contraction, and thus the occurrence of warping is suppressed, which is preferable.

Preferred examples of the benzoxazine compound include B-a type benzoxazine, B-m type benzoxazine, P-d type benzoxazine, and F-a type benzoxazine (all product names, manufactured by Shikoku Chemicals Corporation), a benzoxazine adduct of polyhydroxystyrene resin, and a phenol novolak type dihydrobenzoxazine compound. These may be used alone, or two or more thereof may be mixedly used.

The content of the other crosslinking agent is preferably 0.1% to 30% by mass, more preferably 0.1% to 20% by mass, still more preferably 0.5% to 15% by mass, and particularly preferably 1.0% to 10% by mass, with respect to the total solid content of the photocurable resin composition according to the embodiment of the present invention. One kind of the other crosslinking agent may be contained, or two or more kinds thereof may be contained. In a case where two or more kinds of the other crosslinking agents are contained, the total thereof is preferably within the above-described range.

<Compound Having Sulfonamide Structure and Compound Having Thiourea Structure>

From the viewpoint of improving the adhesiveness of the cured film to be obtained to the base material, the photocurable resin composition according to the embodiment of the present invention preferably contains at least one compound selected from the group consisting of a compound having a sulfonamide structure and a compound having a thiourea structure.

[Compound Having Sulfonamide Structure]

The sulfonamide structure is a structure represented by Formula (S-1).

(S-1)

In Formula (S-1), R represents a hydrogen atom or an organic group, R may be bonded to another structure to form a ring structure, and *'s each independently represent a bonding site to another structure.

The above R is preferably a group that is the same as $R^2$ in Formula (S-2).

The compound having a sulfonamide structure may be a compound having two or more sulfonamide structures; however, it is preferably a compound having one sulfonamide structure.

The compound having a sulfonamide structure is preferably a compound represented by Formula (S-2).

(S-2)

In Formula (S-2), $R^1$, $R^2$, and $R^3$ each independently represent a hydrogen atom or a monovalent organic group, and two or more of $R^1$, $R^2$, and $R^3$ may be bonded to each other to form a ring structure.

$R^1$, $R^2$, and $R^3$ are each independently a monovalent organic group.

Examples of $R^1$, $R^2$, and $R^3$ include a hydrogen atom, and an alkyl group, a cycloalkyl group, an alkoxy group, an alkyl ether group, an alkylsilyl group, an alkoxysilyl group, an aryl group, an aryl ether group, a carboxy group, a carbonyl group, an allyl group, a vinyl group, a heterocyclic group, and a group in which two or more of these are combined.

The alkyl group is preferably an alkyl group having 1 to 10 carbon atoms and more preferably an alkyl group having 1 to 6 carbon atoms. Examples of the alkyl group include a methyl group, an ethyl group, a propyl group, a butyl group, a pentyl group, a hexyl group, an isopropyl group, and a 2-ethylhexyl group.

The cycloalkyl group is preferably a cycloalkyl group having 5 to 10 carbon atoms and more preferably a cycloalkyl group having 6 to 10 carbon atoms. Examples of the cycloalkyl group include a cyclopropyl group, a cyclobutyl group, a cyclopentyl group, and a cyclohexyl group.

The alkoxy group is preferably an alkoxy group having 1 to 10 carbon atoms and more preferably an alkoxy group having 1 to 5 carbon atoms. Examples of the alkoxy group include a methoxy group, an ethoxy group, a propoxy group, a butoxy group, and a pentoxy group.

The alkoxysilyl group is preferably an alkoxysilyl group having 1 to 10 carbon atoms and more preferably an alkoxysilyl group having 1 to 4 carbon atoms. Examples of the alkoxysilyl group include a methoxysilyl group, an ethoxysilyl group, a propoxysilyl group, and a butoxysilyl group.

The aryl group is preferably an aryl group having 6 to 20 carbon atoms and more preferably an aryl group having 6 to 12 carbon atoms. The aryl group may have a substituent such as an alkyl group. Examples of the aryl group include a phenyl group, a tolyl group, a xylyl group, and a naphthyl group.

Examples of the heterocyclic group include a group obtained by removing one hydrogen atom from a heterocyclic ring structure, such as a triazole ring, a pyrrole ring, a furan ring, a thiophene ring, an imidazole ring, an oxazole ring, a thiazole ring, a pyrazole ring, an isoxazole ring, an isothiazole ring, a tetrazole ring, a pyridine ring, a pyridazine ring, a pyrimididine ring, a pyrazine ring, a piperidine ring, a piperazine ring, a morpholine ring, a dihydropyran ring, a tetrahydropyran group, or a triazine ring.

Among these, a compound in which $R^1$ is an aryl group, and $R^2$ and $R^3$ are each independently a hydrogen atom or an alkyl group is preferable.

Examples of the compound having a sulfonamide structure include benzenesulfonamide, dimethylbenzenesulfonamide, N-butylbenzenesulfonamide, sulfanylamide, o-toluenesulfonamide, p-toluenesulfonamide, hydroxynaphthalenesulfonamide, naphthalene-1-sulfonamide, naphthalene-2-sulfonamide, m-nitrobenzenesulfonamide, p-chlorobenzenesulfonamide, methanesulfonamide, N,N-dimethylmethanesulfonamide, N,N-dimethylethanesulfonamide, N,N-diethylmethanesulfonamide, N-methoxymethanesulfonamide, N-dodecylmethanesulfonamide, N-cyclohexyl-1-butanesulfonamide, and 2-aminoethanesulfonamide.

[Compound Having Thiourea Structure]

The thiourea structure is a structure represented by Formula (T-1).

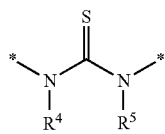

(T-1)

In Formula (T-1), $R^4$ and $R^5$ each independently represent a hydrogen atom or a monovalent organic group, and $R^4$ and $R^5$ may be bonded to form a ring structure. $R^4$ may be bonded to another structure to which * is bonded, thereby forming a ring structure, $R^5$ may be bonded to another structure to which * is bonded, thereby forming a ring structure, and *'s each independently represent a bonding site to another structure.

It is preferable that $R^4$ and $R^5$ are each independently a hydrogen atom.

Examples of $R^4$ and $R^5$ include a hydrogen atom, and an alkyl group, a cycloalkyl group, an alkoxy group, an alkyl ether group, an alkylsilyl group, an alkoxysilyl group, an aryl group, an aryl ether group, a carboxy group, a carbonyl group, an allyl group, a vinyl group, a heterocyclic group, and a group in which two or more of these are combined.

The alkyl group is preferably an alkyl group having 1 to 10 carbon atoms and more preferably an alkyl group having 1 to 6 carbon atoms. Examples of the alkyl group include a methyl group, an ethyl group, a propyl group, a butyl group, a pentyl group, a hexyl group, an isopropyl group, and a 2-ethylhexyl group.

The cycloalkyl group is preferably a cycloalkyl group having 5 to 10 carbon atoms and more preferably a cycloalkyl group having 6 to 10 carbon atoms. Examples of the cycloalkyl group include a cyclopropyl group, a cyclobutyl group, a cyclopentyl group, and a cyclohexyl group.

The alkoxy group is preferably an alkoxy group having 1 to 10 carbon atoms and more preferably an alkoxy group having 1 to 5 carbon atoms. Examples of the alkoxy group include a methoxy group, an ethoxy group, a propoxy group, a butoxy group, and a pentoxy group.

The alkoxysilyl group is preferably an alkoxysilyl group having 1 to 10 carbon atoms and more preferably an alkoxysilyl group having 1 to 4 carbon atoms. Examples of the alkoxysilyl group include a methoxysilyl group, an ethoxysilyl group, a propoxysilyl group, and a butoxysilyl group.

The aryl group is preferably an aryl group having 6 to 20 carbon atoms and more preferably an aryl group having 6 to 12 carbon atoms. The aryl group may have a substituent such as an alkyl group. Examples of the aryl group include a phenyl group, a tolyl group, a xylyl group, and a naphthyl group.

Examples of the heterocyclic group include a group obtained by removing one hydrogen atom from a heterocyclic ring structure, such as a triazole ring, a pyrrole ring, a furan ring, a thiophene ring, an imidazole ring, an oxazole ring, a thiazole ring, a pyrazole ring, an isoxazole ring, an isothiazole ring, a tetrazole ring, a pyridine ring, a pyridazine ring, a pyrimididine ring, a pyrazine ring, a piperidine ring, a piperazine ring, a morpholine ring, a dihydropyran ring, a tetrahydropyran ring, or a triazine ring.

The compound having a thiourea structure may be a compound having two or more thiourea structures; however, it is preferably a compound having one thiourea structure.

The compound having a thiourea structure is preferably a compound represented by Formula (T-2).

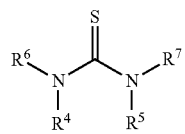

(T-2)

In Formula (T-2), $R^4$ to $R^7$ each independently represent a hydrogen atom or a monovalent organic group, and at least two of $R^4$ to $R^7$ may be bonded to each other to form a ring structure.

In Formula (T-2), $R^4$ and $R^5$ are synonymous with $R^4$ and $R^5$ in Formula (T-1), and the same applies to the preferred aspect thereof.

In Formula (T-2), $R^6$ and $R^7$ are each independently preferably a monovalent organic group.

In Formula (T-2), the preferred aspect of the monovalent organic group as $R^6$ and $R^7$ is the same as the preferred aspect of the monovalent organic group as $R^4$ and $R^5$ in Formula (T-1).

Examples of the compound having a thiourea structure include N-acetylthiourea, N-allyl thiourea, N-allyl-N'-(2-hydroxyethyl)thiourea, 1-adamantylthiourea, N-benzoylthiourea, N,N'-diphenylthiourea, 1-benzyl-phenylthiourea, 1,3-dibutylthiourea, 1,3-diisopropylthiourea, 1,3-dicyclohexylthiourea, 1-(3-(trimethoxysilyl)propyl)-3-methylthiourea, trimethylthiourea, tetramethylthiourea, N,N-diphenylthiourea, ethylenethiourea (2-imidazolinthione), carbimazole, and 1,3-dimethyl-2-thiohydantoin.

[Content]

The total content of the compound having a sulfonamide structure and the compound having a thiourea structure is preferably 0.05% to 10% by mass, more preferably 0.1% to 5% by mass, and still more preferably 0.2% to 3% by mass, with respect to the total mass of the photocurable resin composition according to the embodiment of the present invention.

The photocurable resin composition according to the embodiment of the present invention may contain only one compound selected from the group consisting of a compound having a sulfonamide structure and a compound having a thiourea structure, or may contain two or more compounds. In a case where only one kind of compound is contained, the content of the compound is preferably within the above range, and in a case where two or more kinds of compounds are contained, the total amount thereof is preferably within the above range.

<Migration Suppressing Agent>

The photocurable resin composition according to the embodiment of the present invention preferably further contains a migration suppressing agent. In a case where a migration suppressing agent is contained, it is possible to effectively suppress metal ions derived from a metal layer (a metal wire) from being migrated into a photocurable layer.

The migration suppressing agent is not particularly limited; however, examples thereof include a compound having a heterocyclic ring (a pyrrole ring, a furan ring, a thiophene ring, an imidazole ring, an oxazole ring, a thiazole ring, a pyrazole ring, an isoxazole ring, an isothiazole ring, a tetrazole ring, a pyridine ring, a pyridazine ring, a pyrimidine ring, a pyrazine ring, a piperidine ring, a piperazine ring, a morpholine ring, a 2H-pyran ring and a 6H-pyran ring, or a triazine ring), a compound having thioureas and a sulfanyl group, a hindered phenol-based compound, a salicylic acid derivative-based compound, and a hydrazide derivative-based compound. In particular, a triazole-based compounds such as 1,2,4-triazole, benzotriazole, 5-methylbenzotriazole, or 4-methylbenzotriazole, or a tetrazole-based compound such as 1H-tetrazole or 5-phenyltetrazole can be preferably used.

Alternatively, an ion trapping agent that captures an anion such as a halogen ion can also be used.

As other migration suppressing agents, the rust inhibitors described in paragraph 0094 of JP2013-015701A, the compounds described in paragraphs 0073 to 0076 of JP2009-283711A, the compounds described in paragraph 0052 of JP2011-059656A, the compounds described in paragraphs 0114, 0116, and 0118 of JP2012-194520A, the compounds described in paragraph 0166 of WO2015/199219A, or the like can be used.

The following compounds can be mentioned as specific examples of the migration suppressing agent.

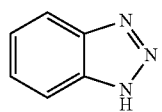

M-1

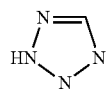

M-2

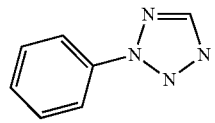

M-3

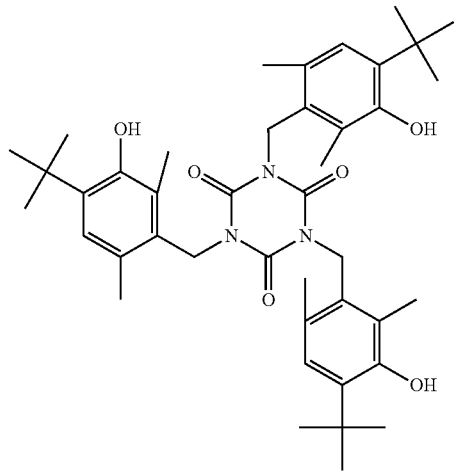

M-4

In a case where the photocurable resin composition contains the migration suppressing agent, the content of the migration suppressing agent is preferably 0.01% to 5.0% by mass, more preferably 0.05% to 2.0% by mass, and still more preferably 0.1% to 1.0% by mass, with respect to the total solid content of the photocurable resin composition.

One kind of migration suppressing agent may be used alone, or two or more kinds thereof may be used. In a case where two or more kinds of migration suppressing agents are used, the total thereof is preferably within the above-described range.

<Polymerization Inhibitor>

The photocurable resin composition according to the embodiment of the present invention preferably contains a polymerization inhibitor.

As the polymerization inhibitor, for example, hydroquinone, o-methoxyphenol, p-methoxyphenol, di-tert-butyl-p-cresol, pyrogallol, p-tert-butylcatechol, 1,4-benzoquinone, diphenyl-p-benzoquinone, 4,4'-thiobis(3-methyl-6-tert-butylphenol), 2,2'-methylenebis(4-methyl-6-tert-butylphenol), an N-nitroso-N-phenylhydroxyamine aluminum salt, phenothiazine, N-nitrosodiphenylamine, N-phenyl naphthylamine, ethylenediamine tetraacetic acid, 1,2-cyclohexanediamine tetraacetic acid, glycol ether diamine tetraacetic acid, 2,6-di-tert-butyl-4-methyl phenol, 5-nitroso-8-hydroxyquinoline, 1-nitroso-2-naphthol, 2-nitroso-1-naphthol, 2-nitroso-5-(N-ethyl-N-sulfopropylamino)phenol, an N-nitrosophenylhydroxyamine cerium (III) salt, an N-nitroso-N-(1-naphthyl)hydroxyamine ammonium salt, bis(4-hydroxy-3,5-tert-butyl)phenylmethane, 1,3,5-tris(4-t-butyl-3-hydroxy-2,6-dimethylbenzyl)-1,3,5-triazine-2,4,6-(1H,3H,5H)-trione, a 4-hydroxy-2,2,6,6-tetramethylpiperidin 1-oxyl free radical, 1,1-diphenyl-2-picrylhydrazyl, dibutyldithiocarbamate copper (II), nitrobenzene, an N-nitroso-N-phenylhydroxylamine aluminum salt, or the like is suitably used. In addition, the polymerization inhibitors described in paragraph 0060 of JP2015-127817A and the compounds described in paragraphs 0031 to 0046 of WO2015/125469A can also be used.

In addition, the following compounds can be used (Me is a methyl group).

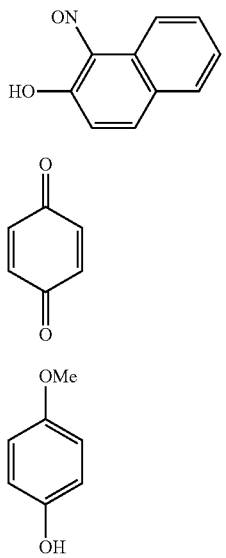

F-1

F-2

F-3

In a case where the photocurable resin composition according to the embodiment of the present invention has a polymerization inhibitor, examples of the aspect thereof include an aspect in which the content of the polymerization inhibitor is 0.01% to 20.0% by mass, where it is preferably 0.01% to 5% by mass, more preferably 0.02% to 3% by mass, and still more preferably 0.05% to 2.5% by mass, with respect to the total solid content of the photocurable resin composition according to the embodiment of the present invention. In addition, in a case where the storage stability of the photocurable resin composition is required, an aspect of 0.02% to 15.0% by mass is preferably included, and in that case, 0.05% to 10.0% by mass is more preferable.

One kind of polymerization inhibitor may be used, or two or more kinds thereof may be used. In a case where two or more kinds of polymerization inhibitors are used, the total thereof is preferably within the above-described range.

<Metal Adhesiveness Improving Agent>

The photocurable resin composition according to the embodiment of the present invention preferably contains a metal adhesiveness improving agent for improving adhesiveness to a metal material used for electrodes, wiring lines, and the like. Examples of the metal adhesiveness improving agent include a silane coupling agent, an aluminum-based adhesive aid, a titanium-based adhesive aid, a compound having a sulfonamide structure and a compound having a thiourea structure, a phosphoric acid derivative compound, a B-ketoester compound, and an amino compound.

Examples of the silane coupling agent include the compounds described in paragraph 0167 of WO2015/199219A, the compounds described in paragraphs 0062 to 0073 of JP2014-191002A, the compounds described in paragraphs 0063 to 0071 of WO2011/080992A, the compounds described in paragraphs 0060 and 0061 of JP2014-191252A, the compounds described in paragraphs 0045 to 0052 of JP2014-041264A, and the compounds described in paragraph 0055 of WO2014/097594A. In addition, it is also preferable to use two or more kinds of different silane coupling agents as described in paragraphs 0050 to 0058 of JP2011-128358A. In addition, as the silane coupling agent, the following compounds are also preferably used. In the following formulae, Et represents an ethyl group.

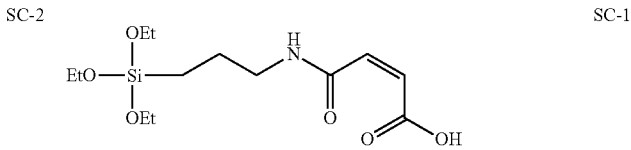

SC-1

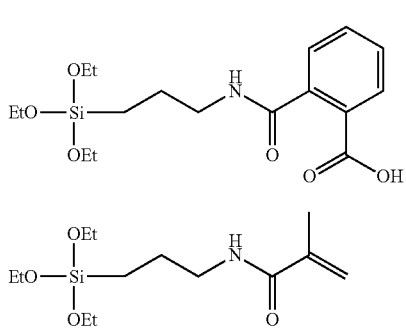

SC-2

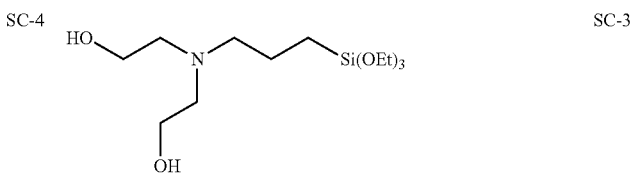

SC-3

SC-4

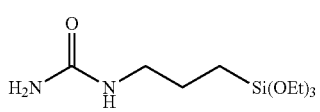

SC-5

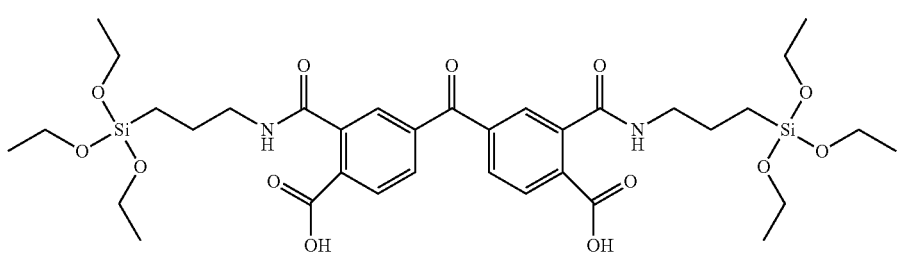

SC-6

Examples of the other silane coupling agent include vinyltrimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, tris-(trimethoxysilylpropyl)isocyanurate, a 3-ureidopropyltrialkoxysilane, 3-mercaptopropylmethyldimethoxysilane, 3-mercaptopropyltrimethoxysilane, 3-isocyanatepropyltriethoxysilane, and a 3-trimethoxysilylpropylsuccinic acid anhydride. These can be used alone or in a combination of two or more thereof.

[Aluminum-Based Adhesive Aid]

Examples of the aluminum-based adhesive aid include aluminum tris(ethyl acetoacetate), aluminum tris(acetyl acetonate), and ethyl acetoacetate aluminum diisopropylate.

In addition, as the metal adhesiveness improving agent, the compounds described in paragraphs 0046 to 0049 of JP2014-186186A, and the sulfide-based compounds described in paragraphs 0032 to 0043 of JP2013-072935A can also be used.

The content of the metal adhesiveness improving agent is preferably in a range of 0.1 to 30 parts by mass, more preferably in a range of 0.5 to 15 parts by mass, and still more preferably in a range of 0.5 to 5 parts by mass, with respect to 100 parts by mass of the specific resin. In a case where the content is set to be equal to or larger than the above lower limit value, good adhesiveness between a cured film and a metal layer after a curing step is exhibited, and in a case where the content is set to be equal to or smaller than the above upper limit value, good heat resistance of the cured film after the curing step and good mechanical properties are exhibited. One kind of metal adhesiveness improving agent may be used, or two or more kinds thereof may be used. In a case where two or more kinds thereof are used, the total content thereof is preferably within the above-described range.

<Other Additives>

As necessary, various additives, for example, a sensitizer such as N-phenyldiethanolamine, a surfactant, a chain transfer agent, a higher fatty acid derivative, an inorganic particle, a curing agent, a curing catalyst, a filler, an antioxidant, an ultraviolet absorbing agent, and an aggregation inhibitor can be blended in the photocurable resin composition according to the embodiment of the present invention within the scope in which the effects of the present invention are obtained. In a case where these additives are blended, the total blending amount thereof is preferably 3% by mass or less of the solid content of the photocurable resin composition.

[Surfactant]

As the surfactant, various surfactants such as a fluorine-based surfactant, a silicone-based surfactant, and a hydrocarbon-based surfactant can be used. The surfactant may be a nonionic surfactant, a cationic surfactant, or an anionic surfactant.

In a case where a surfactant is contained in the photosensitive resin composition according to the embodiment of the present invention, the liquid characteristics (particularly, the fluidity) in a case of being prepared as a coating liquid are further improved, and thus the uniformity of the coating thickness and the liquid saving property can be further improved. That is, in a case where a film is formed using a coating liquid to which a composition containing a surfactant is applied, the interfacial tension between a surface to be coated and a coating liquid is reduced, the wettability to the surface to be coated is improved, and thus the coatability to the surface to be coated is improved. As a result, it is possible to more suitably form a film having a uniform thickness with small thickness unevenness.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, RS-72-K (all manufactured by DIC Corporation); Florard FC430, Florard FC431, Florard FC171, Novec FC4430, and Novec FC4432 (all manufactured by 3M Japan Limited); Surflon S-382, Surflon SC-101, Surflon SC-103, Surflon SC-104, Surflon SC-105, Surflon SC1068, Surflon SC-381, Surflon SC-383, Surflon S393, and Surflon KH-40 (all manufactured by AGC Inc.); and PF636, PF656, PF6320, PF6520, and PF7002 (manufactured by OMNOVA Solutions Inc.). As the fluorine-based surfactant, the compounds described in paragraphs 0015 to 0158 of JP2015-117327A and the compounds described in paragraphs 0117 to 0132 of JP2011-132503A can also be used. A block polymer can also be used as the fluorine-based surfactant, and specific examples thereof include the compound described in JP2011-89090A.

As the fluorine-based surfactant, a fluorine-containing polymer compound containing a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) can also be preferably used, and examples of the fluorine-based surfactant that is used in the present invention include the following compounds as well.

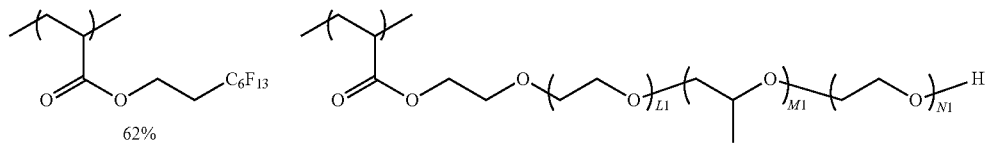

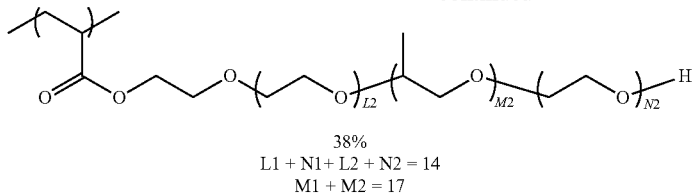

38%
L1 + N1 + L2 + N2 = 14
M1 + M2 = 17

The weight-average molecular weight of the above compound is preferably 3,000 to 50,000, and it is, for example, 14,000.

Regarding the fluorine-based surfactant, a fluorine-containing polymer having an ethylenically unsaturated group in the side chain can also be used as the fluorine-based surfactant. Specific examples thereof include the compounds described in paragraphs 0050 to 0090 and paragraphs 0289 to 0295 of JP2010-164965A, such as MEGAFACE RS-101, RS-102, and RS-718K, manufactured by DIC Corporation.

The fluorine content in the fluorine-based surfactant is preferably 3% to 40% by mass, more preferably 5% to 30% by mass, and particularly preferably 7% to 25% by mass. The fluorine-based surfactant having a fluorine content within this range is effective in terms of the uniformity of coating film thickness or the liquid saving property and also has good solubility in the composition.

Examples of the silicone-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, TORAY SILICONE SH8400 (all, manufactured by DuPont Toray Specialty Materials K.K.), TSF-4440, TSF-4300, TSF-4445, TSF-4460, TSF-4452 (all manufactured by Momentive Performance Materials Inc.), KP341, KF6001, KF6002 (all manufactured by Shin-Etsu Silicone Co., Ltd.), and BYK307, BYK323, and BYK330 (all manufactured by BYK Additives & Instruments).

Examples of the hydrocarbon-based surfactant include Pionin A-76, Newkalgen FS-3PG, Pionin B-709, Pionin B-811-N, Pionin D-1004, Pionin D-3104, Pionin D-3605, Pionin, D-6112, Pionin D-2104-D, Pionin D-212, Pionin D-931, Pionin D-941, Pionin D-951, Pionin E-5310, Pionin P-1050-B, Pionin P-1028-P, Pionin P-4050-T (all manufactured by TAKEMOTO OIL & FAT Co., Ltd.).

Examples of the nonionic surfactant include glycerol, trimethylolpropane, trimethylolethane, and ethoxylates and propoxylates (for example, glycerol propoxylate, glycerol ethoxylate) thereof, polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid ester, Pluronic L10, L31, L61, L62, 10R5, 17R2, 25R2 (manufactured by BASF SE), Tetronic 304, 701, 704, 901, 904, 150R1 (manufactured by BASF SE), Solsperse 20000 (manufactured by Lubrizol Japan Limited.), NCW-101, NCW-1001, NCW-1002 (FUJIFILM Wako Pure Chemical Corporation). Pionin D-6112, D-6112-W, D-6315 (manufactured by TAKEMOTO OIL & FAT Co., Ltd.), and OLFINE E1010, SURFYNOL 104, 400, 440 (manufactured by Nissin Chemical Co., Ltd.).

Specific examples of the cationic surfactant include an organosiloxane polymer KP341 (manufactured by Shin-Etsu Chemical Co., Ltd.), a (meth)acrylic acid-based (co)polymer POLYFLOW No. 75, No. 77, No. 90, or No. 95 (manufactured by Kyoeisha Chemical Co., Ltd.), W001 (manufactured by Yusho Co., Ltd.).

Specific examples of the anionic surfactant include W004, W005, W017 (manufactured by Yusho Co., Ltd.), and SANDET BL (manufactured by Sanyo Chemical Industries, Ltd.).

Only one kind of surfactant may be used, or two or more kinds thereof may be used in combination.

The content of the surfactant is preferably 0.001% to 2.0% by mass and more preferably 0.005% to 1.0% by mass with respect to the total solid content of the composition.

[Sensitizer]

The photocurable resin composition according to the embodiment of the present invention may contain a sensitizer. The sensitizer absorbs a specific radioactive ray to be in an electronically excited state. The sensitizer in the electronically excited state is brought into contact with a thermal radical polymerization initiator, a photoradical polymerization initiator, or the like, to cause actions such as electron transfer, energy transfer, and heat generation. As a result, the thermal radical polymerization initiator or the photoradical polymerization initiator undergoes a chemical change and decomposes to generate a radical, an acid, or a base.

Examples of the sensitizer include a sensitizer such as N-phenyldiethanolamine. In addition, a benzophenone-based, a Michler's ketone-based, a coumarin-based, a pyrazole azo-based, an anilino azo-based, a triphenylmethane-based, an anthraquinone-based, an anthracene-based, an anthrapylidene-based, a benzylidene-based, an oxonol-based, a pyrazolotriazole azo-based, a 115yridine azo-based, a cyanine-based, a phenothiazine-based, a pyrrolopyrazole azomethine-based, a xanthene-based, a phthalocyanine-based, a benzopyran-based, and an indigo-based compound can be used.

Examples thereof include, Michler's ketone, 4,4'-bis(diethylamino)benzophenone, 2,5-bis(4'-diethylaminobenzal) cyclopentane, 2,6-bis(4'-diethylaminobenzal)cyclohexanone, 2,6-bis(4'-diethylaminobenzal)-4-methylcyclohexanone, 4,4'-bis(dimethylamino)chalcone, 4,4'-bis(diethylamino)chalcone, p-dimethylaminocinnamylidene indanone, p-dimethylamino benzylidene indanone, 2-(p-dimethylaminophenylbiphenylene)-benzothiazole, 2-(p-dimethylaminophenylvinylene)benzothiazole, 2-(p-dimethylaminophenylvinylene)isonaphtothiazole, 1,3-bis(4'-dimethylaminobenzal)acetone, 1,3-bis(4'-diethylaminobenzal)acetone, 3,3'-carbonyl-bis(7-diethylaminocoumarin), 3-acetyl-7-dimethylaminocoumarin, 3-ethoxycarbonyl-7-dimethylaminocoumarin, 3-benzyloxycarbonyl-7-dimethylaminocoumarin, 3-methoxycarbonyl-7-diethylaminocoumarin, 3-ethoxycarbonyl-7-diethylaminocoumarin(7-(diethylamino) coumarin-3-carboxylate), N-phenyl-N'-ethyletanolamine, N-phenyldiethanolamine, N-p-tolyldiethanolamine, N-phenylethanolamine, 4-morpholinobenzophenone, isoamyl dimethylaminobenzoate, isoamyl diethylaminobenzoate, 2-mercaptobenzimidazole, 1-phenyl-5-mercaptotetrazole, 2-mercaptobenzothiazole, 2-(p-dimethylaminostyryl)benzoxazole, 2-(p-dimethylaminostyryl)benzothiazole, 2-(p-dimethylaminostyryl)naphtho (1,2-d)thiazole, 2-(p-dimethylaminobenzoyl)styrene, diphenylacetamide, benzanilide, N-methylacetanilide, and 3',4'-dimethylacetanilide.

In addition, a sensitizing dye may be used as the sensitizer.

For details of the sensitizing dye, reference can be made to the description in paragraphs 0161 to 0163 of JP2016-027357A, the content of which is incorporated in the present specification.

In a case where the photocurable resin composition according to the embodiment of the present invention contains a sensitizer, the content of the sensitizer is preferably 0.01% to 20% by mass, more preferably 0.1% to 15% by mass, and still more preferably 0.5% to 10% by mass, with respect to the total solid content of the photocurable resin composition according to the embodiment of the present invention. One kind of sensitizer may be used alone, or two or more kinds thereof may be used in combination.

[Chain Transfer Agent]

The photocurable resin composition according to the embodiment of the present invention may contain a chain transfer agent. The chain transfer agent is defined, for example, in Polymer Dictionary, 3rd Edition, pp. 683 to 684 (edited by The Society of Polymer Science, 2005). As the chain transfer agent, for example, the following compound is used; a group of compounds having —S—S—, —SO$_2$—S—, —N—O—, SH, PH, SiH, or GeH in the molecule, or a dithiobenzoate compound, a trithiocarbonate compound, dithiocarbamate, or a xanthate compound, which has a thiocarbonylthio group that is used for the reversible addition fragmentation chain transfer (RAFT) polymerization. These can donate hydrogen to a low active radical to generate a radical or can be oxidized and then deprotonated to generate a radical. In particular, a thiol compound can be preferably used.

In addition, as the chain transfer agent, the compounds described in paragraphs 0152 and 0153 of WO2015/199219A can also be used.

In a case where the photocurable resin composition according to the embodiment of the present invention has a chain transfer agent, the content of the chain transfer agent is preferably 0.01 to 20 parts by mass, more preferably 1 to 10 parts by mass, and still more preferably 1 to 5 parts by mass, with respect to 100 parts by mass of the total solid content of the photocurable resin composition according to the embodiment of the present invention. One kind of chain transfer agent may be used, or two or more kinds thereof may be used. In a case where two or more kinds of chain transfer agents are used, the total thereof is preferably within the above-described range.

[Higher Fatty Acid Derivative]

In the photocurable resin composition according to the embodiment of the present invention, in order to prevent polymerization inhibition due to oxygen, a higher fatty acid derivative such as behenic acid or behenic acid amide may be added and be caused to be localized on a surface of the photocurable resin composition in the process of drying after coating.

In addition, as the higher fatty acid derivative, the compounds described in paragraph 0155 of WO2015/199219A can also be used.

In a case where the photocurable resin composition according to the embodiment of the present invention has a higher fatty acid derivative, the content of the higher fatty acid derivative is preferably 0.1% to 10% by mass with respect to the total solid content of the photocurable resin composition according to the embodiment of the present invention. One kind of higher fatty acid derivative may be used, or two or more kinds thereof may be used. In a case where two or more kinds of higher fatty acid derivatives are used, the total thereof is preferably within the above-described range.

[Thermal Polymerization Initiator]

The resin composition according to the embodiment of the present invention may contain a thermal polymerization initiator and particularly may contain a thermal radical polymerization initiator. The thermal radical polymerization initiator is a compound that generates a radical by heat energy and initiates or promotes a polymerization reaction of a compound having polymerization properties. In a case where a thermal radical polymerization initiator is added, the polymerization reaction of the resin and the polymerizable compound can be allowed to proceed, and thus the solvent resistance can be further improved.

Specific examples of the thermal radical polymerization initiator include the compounds described in paragraphs 0074 to 0118 of JP2008-063554A.

In a case where thermal polymerization initiator is contained, the content thereof is preferably 0.1% to 30% by mass, with respect to the total solid content of the resin composition according to the embodiment of the present invention, more preferably 0.1% to 20% by mass, and still more preferably 0.5% to 15% by mass. Only one kind of thermal polymerization initiator may be contained, or two or more kinds thereof may be contained. In a case where two or more kinds of thermal polymerization initiators are contained, the total amount thereof is preferably within the above-described range.

[Inorganic Particle]

The resin composition according to the embodiment of the present invention may contain inorganic fine particles. Specific examples of the inorganic particle include calcium carbonate, calcium phosphate, silica, kaolin, talc, titanium dioxide, alumina, barium sulfate, calcium fluoride, lithium fluoride, zeolite, molybdenum sulfide, and glass.

The average particle diameter of the inorganic particles is preferably 0.01 to 2.0 µm, more preferably 0.02 to 1.5 µm, still more preferably 0.03 to 1.0 µm, and particularly preferably 0.04 to 0.5 µm.

In a case where a large amount of the inorganic particles having the above average particle diameter is contained, the mechanical properties of the cured film may deteriorate. In addition, in a case where the average particle diameter of the inorganic particles exceeds 2.0 µm, the resolution may decrease due to the scattering of the exposure light.

[Ultraviolet Absorbing Agent]

The composition according to the embodiment of the present invention may contain an ultraviolet absorbing agent. As the ultraviolet absorbing agent, an ultraviolet absorbing agent such as a salicylate-based, a benzophenone-based, a benzotriazole-based, a substituted acrylonitrile-based, or a triazine-based ultraviolet absorbing agent can be used.

Examples of the salicylate-based ultraviolet absorbing agent include phenyl salicylate, p-octylphenyl salicylate, and p-t-butylphenyl salicylate, and examples of the benzophenone-based ultraviolet absorbing agent include 2,2'-dihydroxy-4-methoxybenzophenone, 2,2'-dihydroxy-4,4'-dimethoxybenzophenone, 2,2',4,4'-tetrahydroxybenzophenone, 2-hydroxy-4-methoxybenzophenone, 2,4-dihydroxybenzophenone, and 2-hydroxy-4-octoxybenzophenone. Examples of the benzotriazole-based ultraviolet absorbing agents include 2-(2'-hydroxy-3',5'-di-tert-butylphenyl)-5-chlorobenzotriazole, 2-(2'-hydroxy-3'-tert-butyl-5'-methylphenyl)-5-chlorobenzotriazole, 2-(2'-hydroxy-3'-tert-amyl-5'-isobutylphenyl)-5-chlorobenzotriazole, 2-(2'-hydroxy-3'-isobutyl-5'-methylphenyl)-5-chlorobenzotriazole, 2-(2'-hydroxy-3'-isobutyl-5'-propylphenyl)-5-chlorobenzotriazole, 2-(2'-hydroxy-3',5'-di-tert-butylphenyl)benzotriazole, 2-(2'-hydroxy-5'-methylphenyl)benzotriazole, and 2-[2'-hydroxy-5'-(1,1,3,3-tetramethyl)phenyl]benzotriazole.

Examples of the substituted acrylonitrile-based ultraviolet absorbing agent include ethyl 2-cyano-3,3-diphenylacrylate and 2-ethylhexyl 2-cyano-3,3-diphenylacrylate. Further, examples of the triazine-based ultraviolet absorbing agent include mono(hydroxyphenyl)triazine compounds such as 2-[4-[(2-hydroxy-3-dodecyloxypropyl)oxy]-2-hydroxyphenyl]-4,6-bis(2,4-dimethylphenyl)-1, 3,5-triazine, 2-[4-[(2-hydroxy-3-tridecyloxypropyl)oxy]-2-hydroxyphenyl]-4,6-bis(2,4-dimethylphenyl)-1, 3,5-triazine, and 2-(2,4-dihydroxyphenyl)-4,6-bis(2,4-dimethylphenyl)-1,3,5-triazine; bis(hydroxyphenyl)triazine compounds such as 2,4-bis(2-hydroxy-4-propyloxyphenyl)-6-(2,4-dimethylphenyl)-1,3,5-triazine, 2,4-bis(2-hydroxy-3-methyl)-4-propyloxyphenyl)-6-(4-methylphenyl)-1,3,5-triazine, and 2,4-bis(2-hydroxy-3-methyl-4-hexyloxyphenyl)-6-(2,4-dimethylphenyl)-1,3,5-triazine; and tris(hydroxyphenyl)triazine compounds such as 2,4-bis(2-hydroxy-4-butoxyphenyl)-6-(2,4-dibutoxyphenyl))-1,3,5-triazine, 2,4,6-tris(2-hydroxy-4-octyloxyphenyl)-1,3,5-triazine, and 2,4,6-tris[2-hydroxy-4-(3-butoxy-2-hydroxypropyloxy)phenyl]-1,3,5-triazine.

In the present invention, the above-described various ultraviolet absorbing agents may be used alone, or two or more thereof may be used in combination.

The composition according to the embodiment of the present invention may contain or may not contain an ultraviolet absorbing agent. However, in a case of containing it, the content of the ultraviolet absorbing agent is preferably 0.001% by mass or more and 1% by mass or less, and more preferably 0.01% by mass or more and 0.1% by mass or less, with respect to the total solid content mass of the composition according to the embodiment of the present invention.

[Organic Titanium Compound]

The resin composition of the present embodiment may contain an organic titanium compound. In a case where the resin composition contains an organic titanium compound, it is possible to form a resin layer having excellent chemical resistance even in a case where curing is carried out at a low temperature.

Examples of the usable organic titanium compound include those in which an organic group is bonded to a titanium atom through a covalent bond or an ionic bond.

Specific examples of the organic titanium compound are described in I) to VII) below.

I) Titanium chelate compounds: among them, a titanium chelate compound having two or more alkoxy groups is more preferable since the negative type photosensitive resin composition has good storage stability and a good curing pattern can be obtained. Specific examples thereof include titanium bis(triethanolamine)diisopropoxide, titanium di(n-butoxide) bis(2,4-pentanedionate, titanium diisopropoxide bis(2,4-pentanedionate), titanium diisopropoxide bis(tetramethylheptandionate), and titanium diisopropoxide bis(ethyl acetoacetate).

II) Tetraalkoxy titanium compounds: examples thereof include titanium tetra(n-butoxide), titanium tetraethoxide, titanium tetra(2-ethylhexoxide), titanium tetraisobutoxide, titanium tetraisopropoxide, titanium tetramethoxide, titanium tetramethoxypropoxide, titanium tetramethylphenoxide, titanium tetra(n-nonyloxide), titanium tetra(n-propoxide), and titanium tetrastearyloxide, titanium tetrakis[bis{2,2-(aryloxymethyl)butoxide}].

III) Titanocene compounds: examples thereof include pentamethylcyclopentadienyl titanium trimethoxide, bis(η5-2,4-cyclopentadiene-1-yl) bis(2,6-difluorophenyl)titanium, and bis(η5-2,4-cyclopentadiene-1-yl) bis(2,6-difluoro-3-(1H-pyrrole-1-yl)phenyl)titanium.

IV) Monoalkoxytitanium compounds: examples thereof include titanium tris(dioctyl phosphate)isopropoxide, and titanium tris(dodecylbenzene sulfonate)isopropoxide.

V) Titanium oxide compounds: examples thereof include titanium oxide bis(pentanedionate), titanium oxide bis(tetramethylheptandionate), and phthalocyanine titanium oxide.

VI) Titanium tetraacetylacetonate compounds: examples thereof include titanium tetraacetylacetoneate.

VII) Titanate coupling agents: examples thereof include isopropyltridodecylbenzenesulfonyl titanate.

Among them, it is preferable that the organic titanium compound is at least one compound selected from the group consisting of the above-described I) titanium chelate compound, II) tetraalkoxytitanium compound, and III) titanocene compound, from the viewpoint that better chemical resistance is exhibited. In particular, titanium diisopropoxide bis(ethyl acetoacetate), titanium tetra(n-butoxide), or bis(η5-2,4-cyclopentadiene-1-yl) bis(2,6-difluoro-3-(1H-pyrrole-1-yl)phenyl)titanium is preferable.

In a case where an organic titanium compound is blended, the blending amount thereof is preferably 0.05 to 10 parts by mass and more preferably 0.1 to 2 parts by mass with respect to 100 parts by mass of the precursor of the cyclized resin. In a case where the blending amount is 0.05 parts by mass or more, good heat resistance and good chemical resistance are exhibited in the curing pattern to be obtained. On the other hand, in a case where it is 10 parts by mass or less, the storage stability of the composition is excellent.

[Antioxidant]

The composition according to the embodiment of the present invention may contain an antioxidant. In a case where an antioxidant is contained as an additive, it is possible to improve the elongation characteristics of the film after curing and the adhesiveness to the metal material. Examples of the antioxidant include a phenol compound, a phosphorous acid ester compound, and a thioether compound. As the phenol compound, any phenol compound known as the phenolic antioxidant can be used. Examples of the preferred phenolic compound include a hindered phenolic compound. A compound having a substituent at the site (the ortho position) adjacent to the phenolic hydroxy group is preferable. The above-described substituent is preferably a substituted or unsubstituted alkyl group having 1 to 22 carbon atoms. In addition, the antioxidant is also preferably a compound having a phenol group and a phosphorous acid ester group in the same molecule. In addition, as the antioxidant, a phosphorus-based antioxidant can also be preferably used. Examples of the phosphorus-based antioxidant include tris[2-[[2,4,8,10-tetrakis(1,1-dimethylethyl)dibenzo[d, f][1,3,2]dioxaphosphepin-6-yl]oxy]ethyl]amine, tris[2-[(4,6,9,11-tetra-tert-butyldibenzo[d, f][1,3,2]dioxaphosphepin-2-yl)oxy]ethyl]amine, and ethyl phosphite bis(2,4-di-tert-butyl-6-methylphenyl). Examples of the commercially available product of antioxidant include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G, ADEKA STAB AO-80, and ADEKA STAB AO-330 (all manufactured by ADEKA Corporation). In addition, as the antioxidant, the compounds described in paragraph numbers 0023 to 0048 of JP6268967B can also be used. In addition, the composition according to the embodiment of the present invention may contain a latent antioxidant, as necessary. Examples of the latent antioxidant include a compound of which the portion functioning as an antioxidant is protected by a protective group, where the protective group of the compound is eliminated by heating at 100° C. to 250° C. or by heating at 80° C. to 200° C. in the presence of an acid/base catalyst and thus the compound functions as an antioxidant. Examples of the latent antioxidant include the compounds disclosed in WO2014/021023A, WO2017/030005A, and JP2017-008219A. Examples of the commercially available product of latent antioxidant include ADEKA ARKLS GPA-5001 (manufactured by ADEKA Corporation). Examples of the preferred antioxidant include 2,2-thiobis(4-methyl-6-t-butylphenol), 2,6-di-t-butylphenol, and a compound represented by General Formula (3).

In General Formula (3), $R^5$ represents a hydrogen atom or an alkyl group having 2 or more carbon atoms, and $R^6$ represents an alkylene group having 2 or more carbon atoms. $R^7$ represents a monovalent to tetravalent organic group containing at least one of an alkylene group having 2 or more carbon atoms, an O atom, or an N atom. k represents an integer of 1 to 4.

The compound represented by General Formula (3) suppresses the oxidative deterioration of the aliphatic group or the phenolic hydroxyl group of the resin. In addition, metal oxidation can be suppressed by the rust prevention action on the metal material.

Since the above compound can act on the resin and the metal material at the same time, k is more preferably an integer of 2 to 4. Examples of $R^7$ include an alkyl group, a cycloalkyl group, an alkoxy group, an alkyl ether group, an alkylsilyl group, an alkoxysilyl group, an aryl group, an aryl ether group, a carboxyl group, a carbonyl group, an allyl group, a vinyl group, a heterocyclic group, —O—, —NH—, —NHNH—, and combinations thereof, and $R^7$ may further have a substituent. Among these, an alkyl ether or —NH— is preferably contained from the viewpoints of solubility in a developing solution and metal adhesiveness, and —NH— is more preferably contained from the viewpoints of the metal adhesiveness due to interaction with a resin and the metal complex formation.

Examples of the compound represented by General Formula (3) include the following compounds; however, the structure thereof is not limited to the following structure.

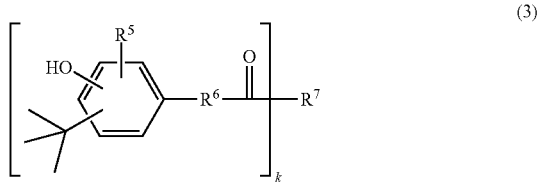

(3)

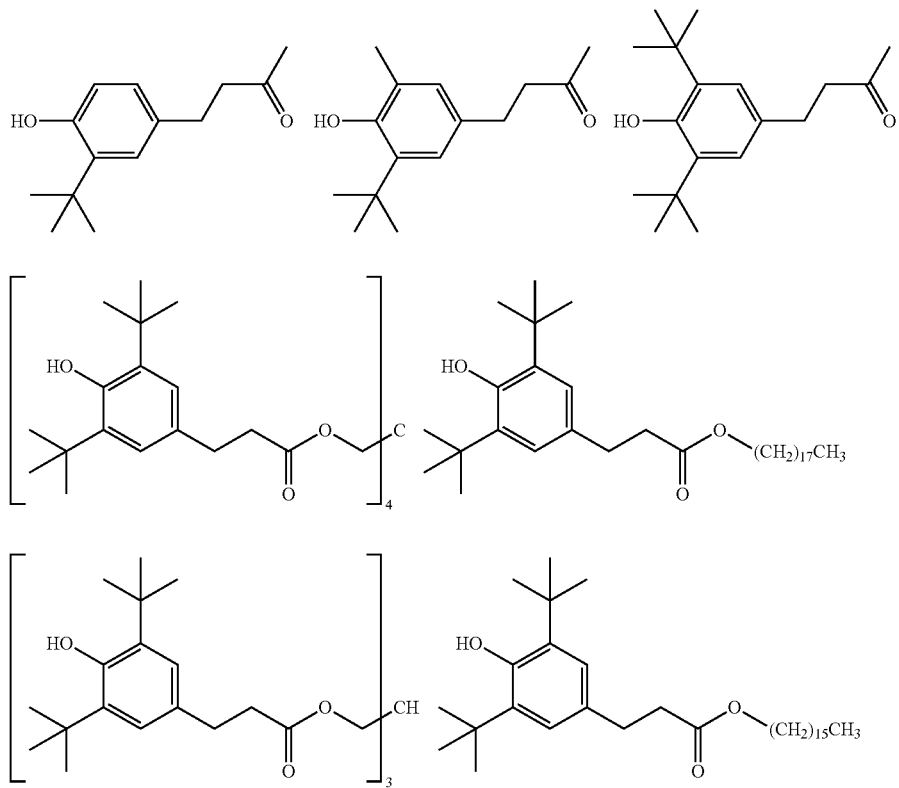

-continued
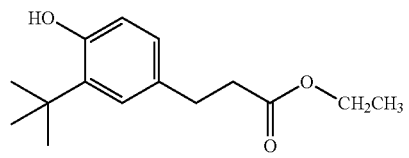
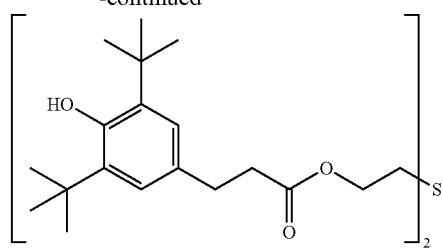
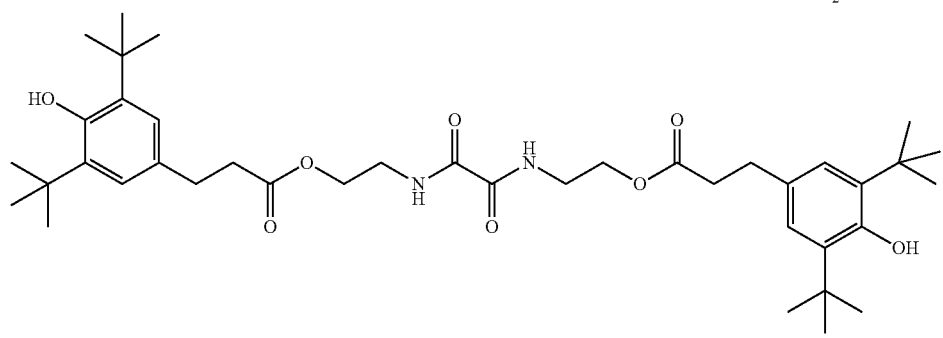
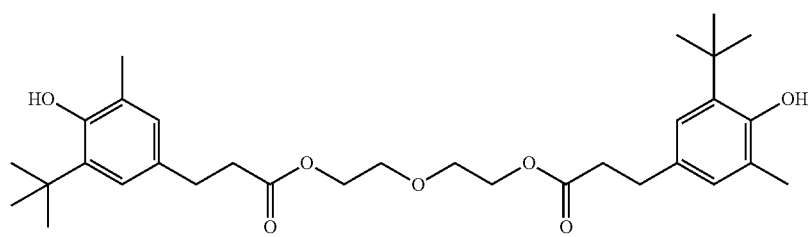
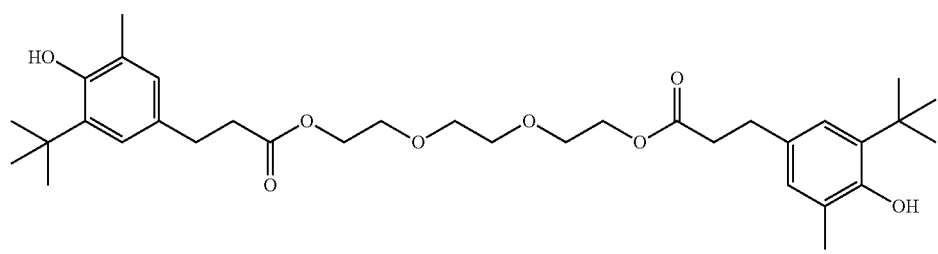
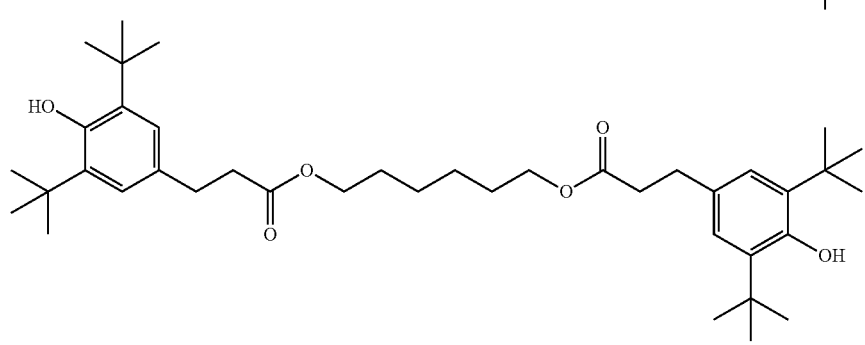
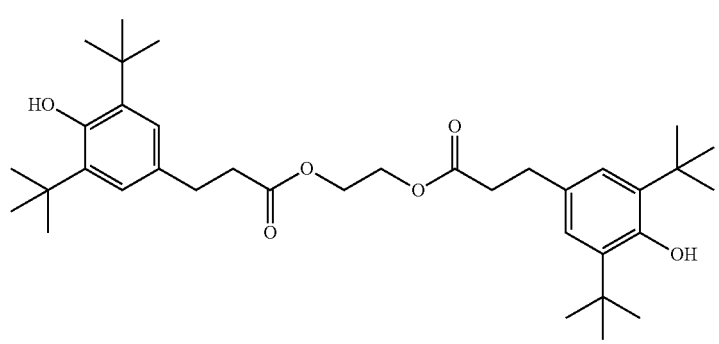

-continued
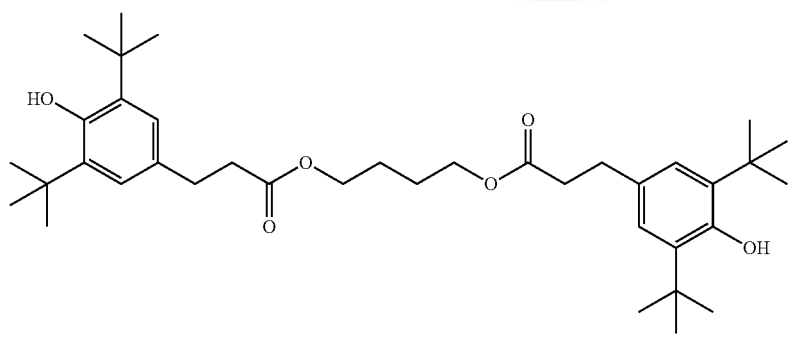
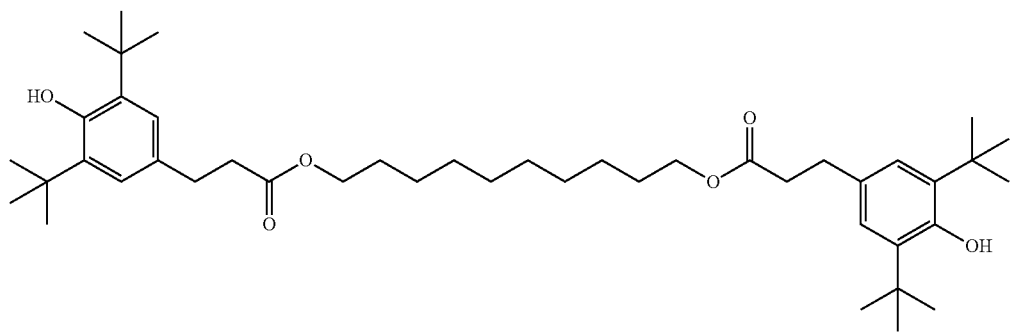
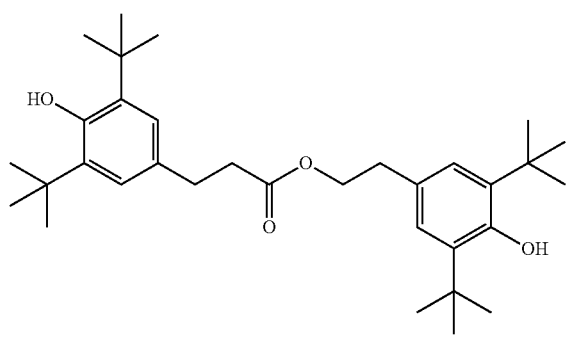
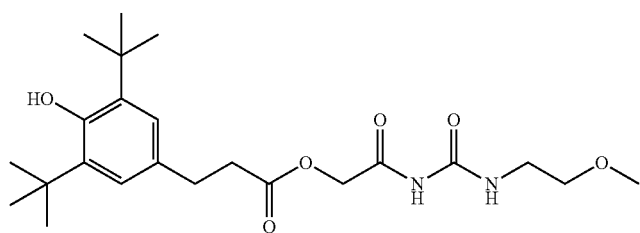
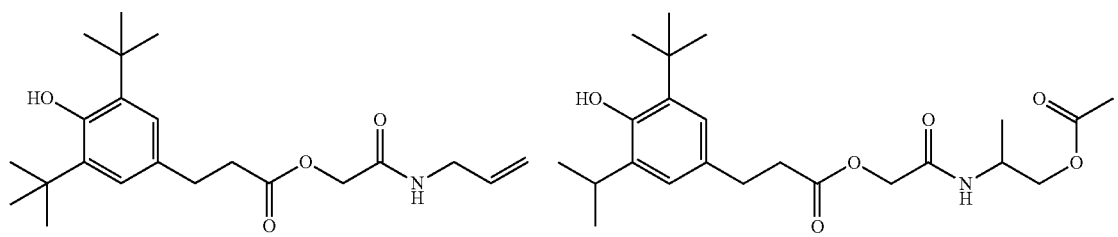
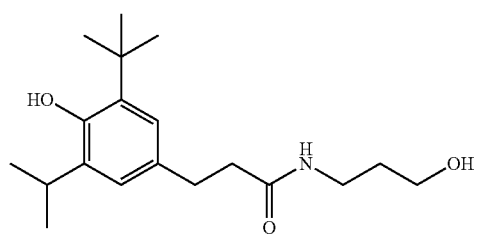

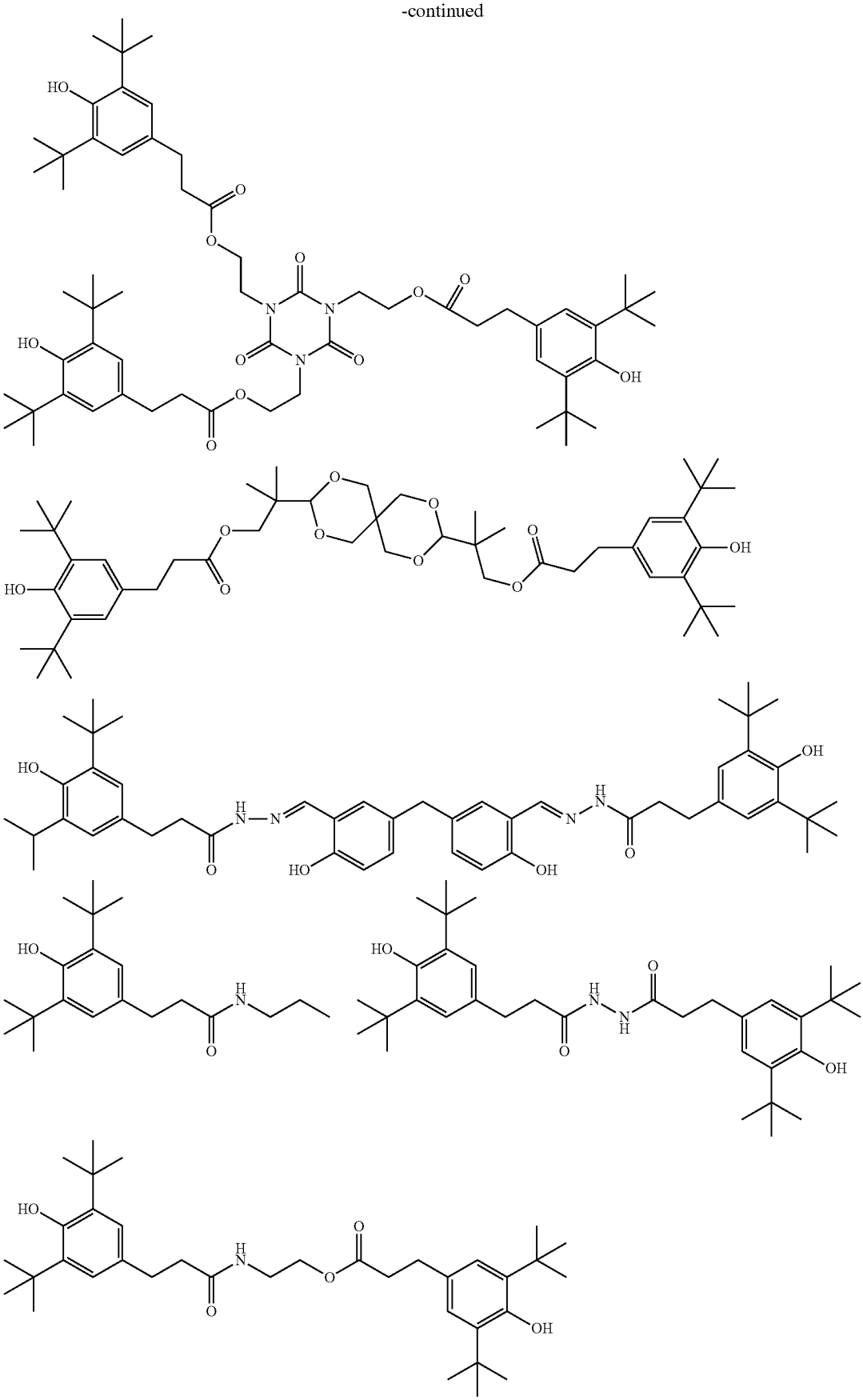

107            108
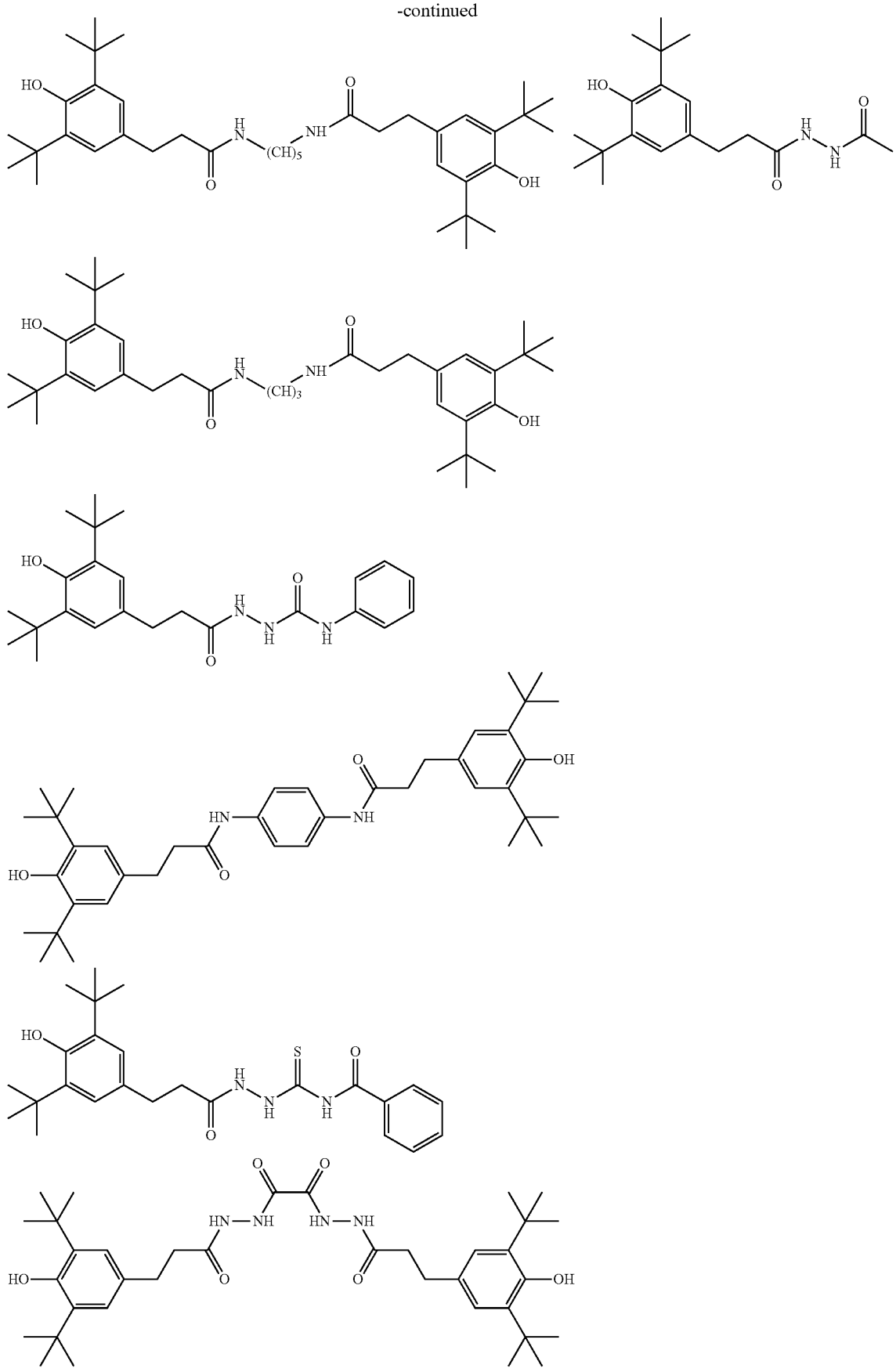

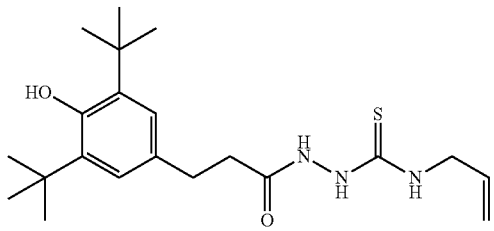

The adding amount of the antioxidant is preferably 0.1 to 10 parts by mass and more preferably 0.5 to 5 parts by mass with respect to the resin. In a case where the adding amount is less than 0.1 parts by mass, it is difficult to obtain the effects of improving the elongation characteristics after reliability test and the adhesiveness to the metal material, and in a case where it is more than 10 parts by mass, there is a risk of a decrease in the sensitivity of the resin composition due to the interaction with the photosensitizer. Only one kind of antioxidant may be used, or two or more kinds thereof may be used. In a case where two or more kinds thereof are used, the total amount thereof is preferably within the above-described range.

<Restriction on Another Substance to be Contained>

The water content of the photocurable resin composition according to the embodiment of the present invention is preferably less than 5% by mass, more preferably less than 1% by mass, and still more preferably less than 0.6% by mass, from the viewpoint of properties of a coated surface.

From the viewpoint of insulating properties, the metal content of the photocurable resin composition according to the embodiment of the present invention is preferably less than 5 parts per million (ppm) by mass, more preferably less than 1 ppm by mass, and still more preferably less than 0.5 ppm by mass. Examples of the metal include sodium, potassium, magnesium, calcium, iron, chromium, nickel, and the like. In a case where a plurality of metals are contained, the total of these metals is preferably within the above-described range.

In addition, as a method of reducing metal impurities which are unintentionally contained in the photocurable resin composition according to the embodiment of the present invention, a method of selecting a raw material containing a low metal content as the raw material that constitutes the photocurable resin composition according to the embodiment of the present invention, a method of filtering a raw material constituting the photocurable resin composition according to the embodiment of the present invention, a method of distilling under the conditions in which the inside of the device is lined with polytetrafluoroethylene or the like to suppress the contamination as little as possible, and the like can be mentioned.

In the photocurable resin composition according to the embodiment of the present invention, in a case of considering the use application as a semiconductor material, the content of halogen atoms is preferably less than 500 ppm by mass, more preferably less than 300 ppm by mass, and still more preferably less than 200 ppm by mass, from the viewpoint of the wiring line corrosiveness. Among these, in a case of being present in a halogen ion state, the content is preferably less than 5 ppm by mass, more preferably less than 1 ppm by mass, and still more preferably less than 0.5 ppm by mass. Examples of the halogen atom include a chlorine atom and a bromine atom. It is preferable that the total content of the chlorine atom and the bromine atom, or the total content of the chlorine ion and the bromine ion is within the above-described range.

As a storage container of the photocurable resin composition according to the embodiment of the present invention, a known storage container in the related art can be used. In addition, as the storage container, for the intended purpose of suppressing incorporation of impurities into the raw materials and the photocurable resin composition, a multi-layer bottle in which an inner wall of a container is composed of six kinds of six layers of resin, and a bottle with six kinds of resin being made as a seven-layer structure are preferably used. Examples of such a container include the container described in JP2015-123351A.

<Use Application of Photocurable Resin Composition>

The photocurable resin composition according to the embodiment of the present invention is preferably used for forming an interlayer insulating film for a re-distribution layer. In addition, it can also be used for forming an insulating film of a semiconductor device, forming a stress buffer film, and the like.

<Preparation of Photocurable Resin Composition>

The photocurable resin composition according to the embodiment of the present invention can be prepared by mixing the above-described components. The mixing method is not particularly limited, and mixing can be carried out by methods conventionally known in the related art.

In addition, for the intended purpose of removing foreign substances such as dust and fine particles in the photocurable resin composition, it is preferable to carry out filtration using a filter. The filter pore diameter is preferably 1 μm or less, more preferably 0.5 μm or less, and still more preferably 0.1 μm or less. On the other hand, the filter pore diameter is preferably 5 μm or less, more preferably 3 μm or less, and still more preferably 1 μm or less, from the viewpoint of productivity. The material of the filter is preferably polytetrafluoroethylene, polyethylene, or nylon. As the filter, a filter washed in advance with an organic solvent may be used. In the filtration step using the filter, a plurality of kinds of filters may be connected in series or in parallel and used. In a case where a plurality of kinds of filters are used, filters having different pore diameters or different materials may be used in combination. In addition, various materials may be filtered a plurality of times. In a case of being filtered a plurality of times, circulation filtration may be used. In addition, filtration may be carried out under pressure. In a case where filtration is carried out under pressure, the pressure is preferably 0.05 MPa or more and 0.3 MPa or less. On the other hand, from the viewpoint of productivity, it is preferably 0.01 MPa or more and 1.0 MPa or less, more preferably 0.03 MPa or more and 0.9 MPa or less, and still more preferably 0.05 MPa or more and 0.7 MPa or less.

In addition to filtration using a filter, impurity removal treatment using an adsorption material may be carried out. The filtration using a filter and the impurity removal treatment using an adsorption material may be combined. As the adsorption material, a conventionally known adsorption material can be used. Examples thereof include an inorganic adsorption material such as silica gel and zeolite and an organic adsorption material such as activated carbon.

EXAMPLES

Hereinafter, the present invention will be described more specifically with reference to Examples. Materials, using amounts, proportions, treatment details, treatment procedures, and the like shown in the following examples can be appropriately changed without departing from the gist of the present invention. Accordingly, the scope of the present invention is not limited to the following specific examples. "Parts" and "%" are on the mass basis unless otherwise specified.

Synthesis Example 1

[Synthesis of Polyimide PI-1]

Under a dry nitrogen stream, 2,2-bis(3-amino-4-hydroxyphenyl)hexafluoropropane (32.78 g (0.0895 mol)) and 1,3-bis(3-aminopropyl)tetramethyldisiloxane (1.24 g (0.005 mol)) were dissolved in N-methyl-2-pyrrolidone (NMP, 100 g) to prepare a solution.

To the above solution, bis(3,4-dicarboxyphenyl)ether dianhydride (31.02 g (0.10 mol)) was added together with NMP (30 g), and the resultant mixture was stirred at 20° C. for 1 hour and then stirred at 50° C. for 4 hours. 3-aminophenol (1.09 g (0.01 mol)) was added to the stirred solution, and the solution was stirred at 50° C. for 2 hours and then at 180° C. for 5 hours to obtain a resin solution. Next, this resin solution was poured into water (3 L) to generate a white precipitate. The white precipitate was collected by filtration, washed with water three times, and then dried with a vacuum dryer at 80° C. for 5 hours. As a result, a powder of an alkali-soluble polyimide (a polyimide PI-1) was obtained.

Synthesis Example 2

[Synthesis of Polyimide PI-2]

4,4'-(hexafluoroisopropylidene) bis(phthalic acid anhydride) (2.370 kg, 5.33 mol) was put into an NMP (9.86 kg) solution, at 25° C., of 1-(4-aminophenyl)-1,3,3-trimethylindane-5-amine (4,4'-[1,4-phenylene-bis(1-methylethylidene)]bisaniline (also known as DAPI)) (1.465 kg, 5.51 mol). The temperature of the reaction mixture was raised to 40° C. and the reaction was carried out for 6 hours. Next, acetic anhydride (1.125 kg) and pyridine (0.219 kg) were added thereto, the temperature of the reaction mixture was raised to 100° C., and the reaction mixture was reacted for 12 hours.

The reaction mixture was cooled to room temperature and transferred to a larger container equipped with a mechanical stirrer. The reaction solution was diluted with ethyl acetate and subjected to washing with water for 1 hour (first washing). After stopping the stirring, the mixture was allowed to stand. After the phase separation occurred, the aqueous phase was removed. The organic phase was diluted with a combination of ethyl acetate and acetone and washed twice with water (second washing and third washing). Table 1 shows the amounts of the organic solvent (ethyl acetate and acetone) and water, which have been used for the first to third washings, respectively.

TABLE 1

|                   | First washing | Second washing | Third washing |
|-------------------|---------------|----------------|---------------|
| Ethyl acetate (kg) | 20.5          | 4.1            | 4.1           |
| Acetone (kg)      | —             | 2.3            | 2.3           |
| Water (kg)        | 22.0          | 26.0           | 26.0          |

γ-butyrolactone (GBL, 10 kg) was added to the washed organic phase, and the solution was subjected to concentration by distillation under reduced pressure to obtain a polymer solution. The polymer solution was dried using a vacuum dryer to obtain a polyimide (a polyimide PI-2).

Synthesis Example 3

[Synthesis of Polyimide PI-3]

To a three-neck flask, 123 ml of N-methylpyrrolidone and 54.97 g (0.124 mol) of 4,4'-(hexafluoroisopropylidene)diphthalic acid dianhydride (manufactured by Tokyo Chemical Industry Co., Ltd., product number: H1438) were added and dissolved at 40° C., and to the resultant mixture under stirring under a nitrogen stream, 84.0 ml of an N-methylpyrrolidone solution of 8.13 g (0.049 mol) of 2,3,5,6-tetramethylphenylenediamine (manufactured by Tokyo Chemical Industry Co., Ltd., product number: T1457), 19.85 g (0.062 mol) of 2,2'-bis(trifluoromethyl)benzidine, and 1.971 g (0.013 mol) of 3,5-diaminobenzoic acid (manufactured by Tokyo Chemical Industry Co., Ltd., product number: D0294) was added dropwise over 30 minutes while keeping the inside of the system at 40° C. After the reaction solution was stirred at 40° C. for 2.5 hours, 2.94 g (0.037 mol) of pyridine and 31.58 g (0.31 mol) of acetic anhydride were added to the reaction mixture, and stirring was further carried out at 80° C. for 3 hours. Then, the reaction solution was diluted by adding 676.6 mL of acetone. 1.15 L of methanol and 230 mL of acetone were added to a stainless steel container and to the resultant mixture under stirring, the acetone-diluted solution of the reaction solution was added dropwise. The obtained polymer crystals were subjected to suction filtration and then air drying at 60° C. to obtain 70.9 g of a polymer.

10 g of the above polymer and 200 ml of tetrahydrofuran were added to a three-neck flask, and, while stirring the resultant mixture at room temperature, 0.21 g (0.002 mol) of N-(2-aminoethyl)acrylamide (manufactured by FUJIFILM Wako Pure Chemical Corporation) was added thereto and stirring was further carried out for 2 hours. A solution of the reaction solution in tetrahydrofuran was added dropwise to a stainless steel container to which 1.5 L of ethyl acetate was added, where the ethyl acetate was under stirring. The obtained polymer crystals were subjected to suction filtration and then air drying at 60° C. to obtain 9.2 g of a polymer (a polyimide PI-3).

Synthesis Example 4

[Synthesis of Polyimides PI-4 and PI-5]
—Synthesis of Polyimide PI-5—

To a three-neck flask, 123 ml of N-methylpyrrolidone and 54.97 g (0.124 mol) of 4,4'-(hexafluoroisopropylidene)diphthalic acid anhydride (6FDA, manufactured by Tokyo Chemical Industry Co., Ltd., product number: H1438) were added and dissolved at 40° C., and under stirring under a nitrogen stream, 84.0 ml of an N-methylpyrrolidone solution of 8.13 g (0.049 mol) of 2,3,5,6-tetramethylphenylenediamine (TeMPD, manufactured by Tokyo Chemical Industry Co., Ltd., product number: T1457), 6.69 g (0.062 mol) of m-phenylene diamine (manufactured by FUJIFILM Wako Pure Chemical Corporation, product number: 164-01515), and 1.971 g (0.012 mol) of 3,5-diaminobenzoic acid (DABA, manufactured by Tokyo Chemical Industry Co., Ltd., product number: D0294) was added dropwise over 30 minutes while keeping the inside of the system at 40° C. After stirring the reaction solution at 40° C. for 2.5 hours, 2.94 g (0.037 mol) of pyridine (manufactured by FUJIFILM Wako Pure Chemical Corporation, product number: 166-22575) and 31.58 g (0.31 mol) of acetic anhydride (manufactured by FUJIFILM Wako Pure Chemical Corporation, product number: 018-00286) were added thereto, and the resultant mixture was further stirred at 80° C. for 3 hours. Then, the reaction solution was diluted by adding 676.6 mL of acetone. 1.15 L of methanol and 230 mL of acetone were added to a 5 L of a stainless steel container and to the resultant mixture under stirring, the acetone-diluted solution of the reaction solution was added dropwise. The obtained polymer crystals were subjected to suction filtration and then air drying at 60° C. to obtain 60.1 g of a polymer (PI-5).

To a three-neck flask, 10 g of the above polymer, 200 ml of tetrahydrofuran, 0.00185 g (0.017 mmol) of tetramethylammonium chloride, and 0.2 g (0.002 mol) of epichlorohydrin were added. While introducing air into the flask at 10 ml/min, the reaction solution was heated to 90° C. in an oil bath while stirring the reaction solution. After the temperature of the reaction solution reached 90° C., the reaction solution was further stirred for 3 hours and then cooled to room temperature. The solution of the reaction solution in tetrahydrofuran was added dropwise to a stainless steel container to which 1.5 L of ethyl acetate was added, where the ethyl acetate was under stirring. The obtained polymer crystals were subjected to suction filtration and then air drying at 60° C. to obtain 9.2 g of a polymer (a polyimide PI-4). The structure of the polymer (PI-4) is shown by the following formula. In the following formula, the subscript in parentheses represents the content ratio (the molar ratio) of each repeating unit.

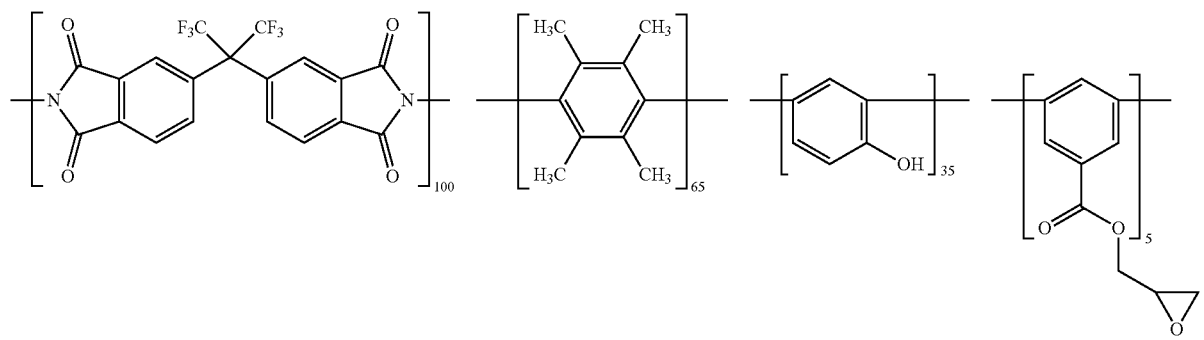

(PI-4)

[Synthesis of Polybenzoxazole (PBO)]

50.0 g (0.137 mol) of 2,2-bis(3-amino-4-hydroxyphenyl) hexafluoropropane (6F-BAPH) and 53.5 g (0.137 mol) of 2,2-bis(4-carboxyphenyl)hexafluoropropane (BIS-B-AF) were added to 300 g of polyphosphoric acid (PPA), heated to 100° C. under a nitrogen stream, subsequently heated to 200° C. at a temperature elevation rate of about 10° C./min, and maintained at 200° C. for 150 minutes to obtain polybenzoxazole PBO.

EXAMPLES AND COMPARATIVE EXAMPLES

In each of Examples, components shown in Table 2 or Table 3 below were mixed to obtain each of the photocurable resin compositions. Further, in each of Comparative Examples, components shown in Table 3 below were mixed to obtain each of the comparative compositions.

Specifically, the content of the component shown in Table 2 or Table 3 is the amount shown in "Part by mass" of Table 2 or Table 3. In addition, in each composition, the content of the solvent was adjusted so that the solid content concentration of the composition was the value shown in Table 2 or Table 3.

The obtained photocurable resin composition and the comparative composition were pressure-filtered through a filter made of polytetrafluoroethylene, having a filter pore diameter of 0.8 μm.

In addition, in Table 2 or Table 3, the description of "-" indicates that the corresponding component is not contained in the composition.

TABLE 2

| | | | Example | | | | | | | | |
|---|---|---|---|---|---|---|---|---|---|---|---|
| | | | 1 | 2 | 3 | 4 | 5 | 6 | 7 | 8 | 9 |
| Constitution | Resin | Kind | PI-1 | PI-2 | PI-3 | PI-4 | PBO | PI-1 | PI-1 | PI-2 | PI-5 |
| | | Part by mass | 50.0 | 50.0 | 50.0 | 50.0 | 50.0 | 50.0 | 48.0 | 50.0 | 55.0 |
| | Radical crosslinking agent | Kind | B-1 | B-1 | B-1 | B-1 | B-1 | B-1 | B-1 | B-1 | B-1 |
| | | Part by mass | 3 | 3 | 3 | 3 | 3 | 3 | 3 | 3 | 3 |
| | | Kind | B-3 | B-3 | B-3 | B-3 | B-3 | B-3 | B-3 | B-3 | B-3 |
| | | Part by mass | 20 | 20 | 10 | 20 | 20 | 35 | 28 | 20 | 25 |
| | Photosensitive compound A | Kind | C-1 | C-1 | C-1 | C-1 | C-1 | C-1 | C-1 | C-1 | C-2 |
| | | Part by mass | 5 | 5 | 5 | 5 | 5 | 5 | 5 | 5 | 10 |
| | Another crosslinking agent | Kind | D-1 | D-1 | D-1 | D-1 | D-1 | — | D-2 | D-1 | — |
| | | Part by mass | 15 | 15 | 25 | 15 | 15 | — | 9 | 15 | — |
| | Photosensitive compound B | Kind | E-1 | E-1 | E-1 | E-1 | E-1 | E-2 | E-1 | E-3 | E-2 |
| | | Part by mass | 5 | 5 | 5 | 5 | 5 | 5 | 5 | 5 | 5 |
| | Silane coupling agent | Kind | F-1 | F-1 | F-1 | F-1 | F-1 | F-1 | F-1 | F-1 | F-1 |
| | | Part by mass | 1 | 1 | 1 | 1 | 1 | 1 | 1 | 1 | 1 |
| | Polymerization inhibitor | Kind | G-1 | G-1 | G-1 | G-1 | G-1 | G-1 | G-1 | G-1 | G-1 |
| | | Part by mass | 0.02 | 0.02 | 0.02 | 0.02 | 0.02 | 0.02 | 0.02 | 0.02 | 0.02 |
| | Additive | Kind | H-1 | H-1 | H-1 | H-1 | H-1 | H-1 | H-1 | H-1 | H-1 |
| | | Part by mass | 1 | 1 | 1 | 1 | 1 | 1 | 1 | 1 | 1 |
| | Solvent | Kind | I-1 | I-1 | I-1 | I-1 | I-1 | I-1 | I-2 | I-1 | I-2 |
| | | Rate in solvent | 40 | 40 | 40 | 40 | 40 | 40 | 40 | 40 | 40 |
| | | Kind | I-3 | I-3 | I-3 | I-3 | I-3 | I-3 | I-3 | I-3 | I-3 |
| | | Rate in solvent | 60 | 60 | 60 | 60 | 60 | 60 | 60 | 60 | 60 |
| | | Solid content concentration | 42 | 42 | 42 | 42 | 42 | 42 | 42 | 42 | 42 |
| Process | | Film thickness (μm) | 20 | 20 | 20 | 20 | 20 | 20 | 20 | 20 | 20 |
| | | Pattern size (μm) | 10 | 10 | 10 | 10 | 10 | 10 | 10 | 10 | 10 |
| | | Developing solution | 1 | 2 | 2 | 2 | 2 | 1 | 3 | 2 | 1 |
| | | Curing method | 1 | 1 | 1 | 1 | 1 | 1 | 1 | 1 | 1 |
| Evaluation result | Evaluation of pattern shape | | A | A | A | A | A | B | A | A | B |
| | Evaluation of breaking elongation | | A | A | B | B | B | A | B | A | A |
| | Evaluation of solvent resistance | | A | A | A | A | B | A | A | B | B |

TABLE 3

| | | | Example | | | | | | | | Comparative Example | | |
|---|---|---|---|---|---|---|---|---|---|---|---|---|---|
| | | | 10 | 11 | 12 | 13 | 14 | 15 | 16 | 1 | 2 | 3 |
| Constitution | Resin | Kind | PI-1 | PI-2 | PI-2 | PI-2 | PI-2 | PI-1 | PI-1 | PI-1 | PI-2 | PI-2 |
| | | Part by mass | 50.0 | 50.0 | 50.0 | 53.0 | 50.0 | 50.0 | 50.0 | 53.0 | 53.0 | 47.0 |
| | Radical crosslinking agent | Kind | B-1 | B-1 | B-1 | B-1 | B-1 | B-1 | B-1 | B-1 | B-1 | B-1 |
| | | Part by mass | 3 | 3 | 3 | 10 | 3 | 3 | 3 | 3 | 3 | 3 |
| | | Kind | B-3 | B-3 | B-4 | B-5 | B-3 | B-3 | B-3 | B-3 | B-3 | B-3 |
| | | Part by mass | 20 | 20 | 20 | 10 | 20 | 20 | 20 | 28 | 28 | 28 |
| | Photosensitive compound A | Kind | C-1 | C-1 | C-1 | C-1 | C-1 | C-1 | C-4 | C-1 | C-1 | C-1 |
| | | Part by mass | 5 | 5 | 5 | 5 | 5 | 5 | 5 | 5 | 5 | 5 |
| | Another crosslinking agent | Kind | D-1 | D-1 | D-1 | D-1 | D-3 | D-1 | D-1 | D-2 | D-2 | D-1 |
| | | Part by mass | 15 | 15 | 15 | 15 | 15 | 15 | 15 | 9 | 9 | 15 |
| | Photosensitive compound B | Kind | E-1 | E-1 | E-1 | E-1 | E-1 | E-1 | E-4 | — | — | — |
| | | Part by mass | 5 | 5 | 5 | 5 | 5 | 5 | 5 | — | — | — |
| | Silane coupling agent | Kind | F-1 | F-1 | F-1 | F-1 | F-1 | F-1 | F-1 | F-1 | F-1 | F-1 |
| | | Part by mass | 1 | 1 | 1 | 1 | 1 | 1 | 1 | 1 | 1 | 1 |
| | Polymerization inhibitor | Kind | G-1 | G-1 | G-1 | G-1 | G-1 | G-1 | G-1 | G-1 | G-1 | G-1 |
| | | Part by mass | 0.02 | 0.02 | 0.02 | 0.02 | 0.02 | 0.02 | 0.02 | 0.02 | 0.02 | 0.02 |
| | Additive | Kind | H-1 | H-1 | H-1 | H-1 | H-1 | H-1 | H-1 | H-1 | H-1 | H-1 |
| | | Part by mass | 1 | 1 | 1 | 1 | 1 | 1 | 1 | 1 | 1 | 1 |
| | Solvent | Kind | I-1 | I-1 | I-1 | I-1 | I-1 | I-1 | I-1 | I-1 | I-2 | I-1 |
| | | Rate in solvent | 40 | 40 | 40 | 40 | 40 | 40 | 40 | 40 | 40 | 40 |
| | | Kind | I-3 | I-3 | I-3 | I-3 | I-3 | I-3 | I-3 | I-3 | I-3 | I-3 |
| | | Rate in solvent | 60 | 60 | 60 | 60 | 60 | 60 | 60 | 60 | 60 | 60 |
| | | Solid content concentration | 42 | 42 | 42 | 42 | 42 | 42 | 42 | 42 | 42 | 42 |
| Process | | Film thickness (μm) | 40 | 40 | 20 | 20 | 20 | 20 | 20 | 20 | 20 | 20 |
| | | Pattern size (μm) | 20 | 20 | 10 | 10 | 10 | 10 | 10 | 10 | 10 | 10 |
| | | Developing solution | 1 | 2 | 2 | 2 | 2 | 1 | 1 | 1 | 1 | 2 |
| | | Curing method | 1 | 1 | 1 | 1 | 1 | 3 | 4 | 2 | — | 2 |

TABLE 3-continued

|  |  | Example | | | | | | | Comparative Example | | |
| --- | --- | --- | --- | --- | --- | --- | --- | --- | --- | --- | --- |
|  |  | 10 | 11 | 12 | 13 | 14 | 15 | 16 | 1 | 2 | 3 |
| Evaluation result | Evaluation of pattern shape | A | A | A | A | A | A | A | C | B | C |
|  | Evaluation of breaking elongation | A | A | A | B | A | A | B | C | C | C |
|  | Evaluation of solvent resistance | A | A | B | A | A | B | A | B | C | B |

Details of each component listed in Table 2 or Table 3 are as follows.
[Resin]
  PI1 to PI-5: PI1 to PI-5 synthesized as described above
  PBO: PBO synthesized as described above
[Radical Crosslinking Agent]
  B-1: Dipentaerythritol hexaacrylate
  B-2: LIGHT ESTER TMP (manufactured by KYOEISHA CHEMICAL Co., Ltd.)
  B-3: LIGHT ESTER BP-6EM (manufactured by KYOEISHA CHEMICAL Co., Ltd.)
  B-4: LIGHT ESTER 9EG (manufactured by KYOEISHA CHEMICAL Co., Ltd.)
  B-5: LIGHT ACRYLATE DCP-A (manufactured by KYOEISHA CHEMICAL Co., Ltd.)
[Photosensitive Compound A]
  C-1: ADEKA NCI-930 (manufactured by ADEKA Corporation)
  C-2: Diazonaphthoquinone
  C-3: ADEKA NCI-831 (manufactured by ADEKA Corporation)
  C-4: Irgacure 784 (manufactured by BASF SE)
[Another Crosslinking Agent]
  D-1: Daicel CELLOXIDE CEL2081 (manufactured by Daicel Corporation)
  D-2: NIKALAC MX-270 (manufactured by Sanwa Chemical Co., Ltd.)
  D-3: EPPN-502H (manufactured by Nippon Kayaku Co., Ltd.)
[Photosensitive Compound B]
  E-1: WPAG-145 (manufactured by FUJIFILM Wako Pure Chemical Corporation)
  E-2: Irgacure 2959 (manufactured by BASF SE)
  E-3: WPBG-027 (manufactured by FUJIFILM Wako Pure Chemical Corporation)
  E-4: Irgacure 290 (manufactured by BASF SE)
[Silane Coupling Agent]
  F-1: IM-1000 (manufactured by JX Nippon Mining & Metals Corporation)
[Polymerization Inhibitor]
  G-1: 4-methoxy-1-naphthol
[Additive]
  H-1: 1,3-dibutylthiourea
[Solvent]
  I-1: N-methyl-2-pyrrolidone
  I-2: Diacetone alcohol
  I-3: Ethyl lactate
In Table 2 or Table 3, the description in the column of "Rate in solvent" indicates the content (% by mass) of each solvent with respect to the total mass of the whole solvent.
<Evaluation>
[Evaluation of Pattern Shape]
Each photocurable resin composition or comparative composition in each of Examples and Comparative Examples was applied in a layer shape onto a silicon wafer (used for coating) by a spin coating method to form a resin composition film.

In each of Examples and Comparative Examples, the silicon wafer onto which the obtained resin composition film was applied was dried on a hot plate at 80° C. for 3 minutes, and a photocurable film having a thickness shown in Table 2 or Table 3 was formed on the silicon wafer.

In the example described as "1" or "2" in the column of "Curing method" of Table 2 or Table 3, the photocurable film on the silicon wafer was subjected to exposure (the first exposure step) with the i-line by using an exposure energy of 500 mJ/cm$^2$ and using a stepper (Nikon NSR 2005 i9C). Exposure was carried out through a mask (a binary mask in which the pattern is a pattern of 1:1 line and space and the line width is a line width shown in the column of "Pattern size (μm)" in Table 2 or Table 3).

In the example described as "3" in the column of "Curing method" of Table 2 or Table 3, the photocurable film on the silicon wafer was subjected to exposure (the first exposure step) with the h-line (405 nm) through a bandpass filter MZ405 (manufactured by Asahi Spectra Co., Ltd.) by using an exposure energy of 500 mJ/cm$^2$ and a high-pressure mercury lamp. Exposure was carried out through a mask (a binary mask in which the pattern is a pattern of 1:1 line and space and the line width is a line width shown in the column of "Pattern size (μm)" in Table 2 or Table 3).

In the example described as "4" in the column of "Curing method" of Table 2 or Table 3, the photocurable film on the silicon wafer was subjected to exposure (the first exposure step) with the g-line (436 nm) through a bandpass filter MZ436 (manufactured by Asahi Spectra Co., Ltd.) by using an exposure energy of 500 mJ/cm$^2$ and a high-pressure mercury lamp. Exposure was carried out through a mask (a binary mask in which the pattern is a pattern of 1:1 line and space and the line width is a line width shown in the column of "Pattern size (μm)" in Table 2 or Table 3).

In addition, the photosensitive compound A and polymethylmethacrylate (PMMA, weight-average molecular weight: 10,000), used in each of Examples, were dissolved in methyl ethyl ketone to prepare a composition for forming a model film. The content of the photosensitive compound with respect to the total mass of the photosensitive compound A and PMMA in the composition for forming a model film was set to 0.5 mmol/g. In addition, the using amount of methyl ethyl ketone with respect to the total mass of the photosensitive compound A and PMMA in the composition for forming a model film was appropriately set depending on the film thickness of the model film described later.

Then, the above composition for forming a model film was applied onto glass by the spin coating method and subjected to heat drying at 80° C. for 1 minute to obtain a model film. The film thickness of the model film was set to 10 μm.

Then, the model film was subjected to exposure with the same exposure wavelength and the same exposure amount as the above exposure using the stepper, and the residual rate of the photosensitive compound A was measured by the above method.

In addition, the residual rate of the photosensitive compound B was also measured by the same method as the residual rate of the photosensitive compound A, except that the photosensitive compound A was replaced with the photosensitive compound B in the production of the model film.

In each of Examples, the residual rate of the photosensitive compound A was less than 80%.

Moreover, in each of Examples, the residual rate of the photosensitive compound B was 80% or more.

After the above exposure, in the example described as "1" in the column of "Developing solution" of Table 2 or Table 3, development was carried out for 60 seconds using a 2.5% by mass tetramethylammonium hydroxide aqueous solution, and then rinsing was carried out for 20 seconds with pure water to obtain a line and space pattern of the photocurable film after the exposure.

In the example described as "2" in the column of "Developing solution" of Table 2 or Table 3, development was carried out for 60 seconds using cyclopentanone, and then rinsing was carried out for 20 seconds with propylene glycol monomethyl ether acetate (PGMEA) to obtain a line and space pattern of the photocurable film.

In the example described as "3" in the column of "Developing solution" of Table 2 or Table 3, development was carried out for 60 seconds using a 7.5% by mass tetramethylammonium hydroxide aqueous solution, and then rinsing was carried out for 20 seconds with pure water to obtain a line and space pattern of the photocurable film after the exposure.

In the example described as "1" or "3" in the column of "Curing method" of Table 2 or Table 3, the pattern after the development was subjected to curing by exposure (the second exposure step) by using an exposure amount of 10 J/cm$^2$ under the condition of 60° C. and using a high-pressure mercury lamp, whereby a silicon wafer on which a cured film was formed obtained.

In the example described as "4" in the column of "Curing method" of Table 2 or Table 3, the pattern after the development was subjected to curing by exposure (the second exposure step) with the i-line by using an exposure energy of 10 J/cm$^2$ under the condition of 60° C. and using a stepper (Nikon NSR 2005 i9C), whereby a silicon wafer on which a cured film was formed obtained.

In the example described as "2" in the column of "Curing method" of Table 2 or Table 3, the pattern after the development and the silicon wafer on which the pattern was formed was subjected to temperature elevation at a temperature elevation rate of 10° C./minute in a nitrogen atmosphere, and after reaching 180° C., the temperature was maintained at 180° C. for 2 hours for curing, whereby a silicon wafer on which a cured film was formed was obtained.

In the example described as "-" in the column of "Curing method" of Table 2 or Table 3, neither the exposure with the high-pressure mercury lamp nor the heating at 180° C. was carried out, and the silicon wafer on which the pattern after the development was formed was used as the silicon wafer on which a cured film was formed.

In addition, in each of Examples, the residual rate of the photosensitive compound B was measured by the same method as the above-described measurement of the residual rate of the photosensitive compound B except that the above-described high-pressure mercury lamp was used to carry out the exposure with the same exposure wavelength and the same exposure amount as the above-described exposure.

In each of Examples, the residual rate of the photosensitive compound B was less than 80%.

The obtained silicon wafer on which the cured film was formed was cut to be perpendicular to the line and space pattern of the cured film on the silicon wafer, and the cross section of the pattern was exposed. Using an optical microscope, the pattern cross section of the line and space pattern was observed at a magnification of 200 folds, and the cross section shape of the pattern was evaluated.

Specifically, in each of Examples and Comparative Examples, the taper angle formed by the surface of the silicon wafer (the surface of the substrate) and the side surface of the cured film was measured and evaluated according to the following evaluation standards. In a case where the taper angle does not exceed 90°, the cross-sectional shape of the pattern is not a constricted shape, and the closer the taper angle is to 90°, it can be said that the better the pattern shape is.

—Evaluation Standards—

A: The taper angle was 850 or more and 900 or less.
B: The taper angle was 800 or more and less than 85°.
C: The taper angle was less than 80°, the cross-sectional shape of the pattern was a reverse taper shape having a taper angle of more than 90°, or the cross-sectional shape of the pattern was a constricted shape.

[Evaluation of Breaking Elongation]

Each photocurable resin composition or comparative composition in each of Examples and Comparative Examples was applied in a layer shape onto a silicon wafer (used for coating) by a spin coating method to form a resin composition film.

In each of Examples and Comparative Examples, the silicon wafer onto which the obtained resin composition film was applied was dried on a hot plate at 80° C. for 3 minutes, and a photocurable film having a thickness shown in Table 2 or Table 3 was formed on the silicon wafer.

In the example described as "1" or "2" in the column of "Curing method" of Table 2 or Table 3, the entire surface of the photocurable film on the silicon wafer was subjected to exposure (the first exposure step) using an exposure energy of 500 mJ/cm$^2$ by using a stepper (Nikon NSR 2005 i9C).

In the example described as "3" in the column of "Curing method" of Table 2 or Table 3, the entire surface of the photocurable film on the silicon wafer was subjected to exposure (the first exposure step) with the h-line (405 nm) through a bandpass filter MZ405 (manufactured by Asahi Spectra Co., Ltd.) by using an exposure energy of 500 mJ/cm$^2$ and a high-pressure mercury lamp.

In the example described as "4" in the column of "Curing method" of Table 2 or Table 3, the entire surface of the photocurable film on the silicon wafer was subjected to exposure (the first exposure step) with the g-line (436 nm) through a bandpass filter MZ436 (manufactured by Asahi Spectra Co., Ltd.) by using an exposure energy of 500 mJ/cm$^2$ and a high-pressure mercury lamp.

In the example described as "1" or "3" in the column of "Curing method" of Table 2 or Table 3, the entire surface of the photocurable film after the exposure was subjected to curing by exposure (the second exposure step) with an exposure amount of 10 I/cm$^2$ under the condition of 60° C. and using a high-pressure mercury lamp, whereby a silicon wafer on which a cured film was formed obtained.

In the example described as "4" in the column of "Curing method" of Table 2 or Table 3, the entire surface of the pattern after the development was subjected to curing by exposure (the second exposure step) with the i-line by using an exposure energy of 10 J/cm² under the condition of 60° C. and using a stepper (Nikon NSR 2005 i9C), whereby a silicon wafer on which a cured film was formed obtained.

In the example described as "2" in the column of "Curing method" of Table 2 or Table 3, the photocurable film after the exposure was subjected to temperature elevation at a temperature elevation rate of 10° C./minute in a nitrogen atmosphere, and after reaching 180° C., the temperature was maintained at 180° C. for 2 hours for curing, whereby a silicon wafer on which a cured film was formed was obtained.

In the example described as "-" in the column of "Curing method" of Table 2 or Table 3, neither the exposure with the high-pressure mercury lamp nor the heating at 180° C. was carried out, and the silicon wafer on which the photocurable film after the exposure using the stepper was formed was used as the silicon wafer on which a cured film was formed.

After each operation, the cured film was immersed in a 4.9% by mass hydrofluoric acid aqueous solution, and the cured film was peeled off from the silicon wafer. Hereinafter, the peeled cured film is also referred to as a cured film 1.

The breaking elongation rate of the cured film 1 was measured in accordance with JIS-K6251: 2017 in the longitudinal direction of the film using a tensile tester (Tensilon) with a crosshead speed of 300 mm/min, a sample width of 10 mm, and a sample length of 50 mm in an environment of 25° C. and 65% relative humidity (RH). The breaking elongation rate was calculated according to $E_b$ (%)=$(L_b-L_0)/L_0 \times 100$ ($E_b$: elongation when being cut, $L_0$: the length of the cured film before the test, $L_b$: the length of the cured film when the cured film is cut). The breaking elongation rate in the longitudinal direction was measured 5 times, and the arithmetic mean value thereof was used as an index value. The evaluation was carried out according to the following evaluation standards. The evaluation results are described in the column of "Evaluation of breaking elongation" in Table 2 or Table 3. It can be said that the larger the index value is, the more excellent the cured film to be obtained is in breaking elongation and the more excellent the film hardness is.

—Evaluation Standards—
A: The index value was more than 60%.
B: The index value was more than 40% and 60% or less.
C: The index value was 40% or less.

[Solvent Resistance Evaluation]

A silicon wafer on which a cured film was formed was obtained by the same method as the method described in above-described evaluation of breaking elongation.

The silicon wafer on which the cured film was formed was immersed in N-methyl-2-pyrrolidone for 3 hours, washed with isopropyl alcohol, and then air-dried. The film thicknesses of the cured film before and after immersion were measured, and the solvent resistance was evaluated according to the following evaluation standards.

The evaluation results are described in the column of "Solvent resistance" of Table 2 or Table 3. It can be said that the smaller the change in film thickness, the better the solvent resistance.

—Evaluation Standards—
A: The change in film thickness (film thickness after immersion/film thickness before immersion×100(%)) was less than 95%.
B: The change in film thickness was 95% or more and less than 80%.
C: The change in film thickness was 80% or more.

Example 17

The solid content concentration was adjusted to 30% by mass in the composition of Example 1, the coating method was changed from spin coating to slit coating, and the coating was carried out with a coating GAP of 100 μm and a scan speed of slit die of 5 mm/sec. Other evaluations were carried out in the same manner as in Example 1, and the evaluation results were also the same as those in Example 1.

Example 18

The solid content concentration was adjusted to 30% by mass in the composition of Example 2, the coating method was changed from spin coating to slit coating, and the coating was carried out with a coating GAP of 100 μm and a scan speed of slit die of 5 mm/sec. Other evaluations were carried out in the same manner as in Example 2, and the evaluation results were also the same as those in Example 2.

From the above results, it can be seen that it is possible to obtain a cured film having excellent pattern shape and excellent film hardness as compared with Comparative Examples 1 to 3, according to the method of manufacturing a cured film according to the embodiment of the present invention, which includes a first exposure step of exposing a part of a photocurable film formed from a photocurable resin composition, a development step of developing the photocurable film after the exposure with a developing solution to obtain a pattern, and a second exposure step of exposing the pattern with light including light having a wavelength different from a wavelength of light used in the first exposure step, in which the photocurable resin composition contains at least one resin selected from the group consisting of polyimide and polybenzoxazole, a photosensitive compound A having a sensitivity to an exposure wavelength in the first exposure step, and a photosensitive compound B having no sensitivity to the exposure wavelength in the first exposure step and having a sensitivity to an exposure wavelength in the second exposure step, where the photosensitive compound A is a compound that changes a solubility of the photocurable film in the developing solution in the first exposure step, and at least one of the following condition 1 or condition 2 is satisfied.

In addition, it can be seen that it is possible to obtain a cured film having excellent pattern shape and excellent film hardness as compared with Comparative Examples 1 to 3, according to the method of manufacturing a cured film according to the embodiment of the present invention, which includes a first exposure step of exposing a part of a photocurable film formed from a photocurable resin composition, a development step of developing the photocurable film after the exposure with a developing solution to obtain a pattern, and a second exposure step of exposing the pattern with light including light having a wavelength different from a wavelength of light used in the first exposure step, in which the photocurable resin composition contains at least one resin selected from the group consisting of polyimide and polybenzoxazole, and a photosensitive compound A and photosensitive compound B, between which a maximum absorption wavelength difference is 80 nm or more, where the photosensitive compound A is a compound that changes a solubility of the photocurable film in the developing solution in the first exposure step, and at least one of the following condition 1 or condition 2 is satisfied.

In the method of manufacturing a cured film according to Comparative Example 1 or Comparative Example 3, curing is carried out by heating instead of the second exposure step. In such an example, it can be seen that the pattern shape is inferior.

In the method of manufacturing a cured film according to Comparative Example 2, the curing corresponding to the second exposure step is not carried out. In such an example, it can be seen that the cured film is inferior in breaking elongation (film hardness).

Example 101

The photocurable resin composition used in Example 1 was applied in a layer shape onto a surface of a thin copper layer of the resin base material on the surface of which the thin copper layer was formed, by a spin coating method, dried at 80° C. for 5 minutes, and after forming a photocurable layer having a thickness of 30 pin, exposure was carried out using a stepper (NSR1505 i6, manufactured by Nikon Corporation). Exposure was carried out through a mask (a binary mask in which the pattern is a pattern of 1:1 line and space and the line width is 10 µm) at a wavelength of 365 nm. After the exposure, development was carried out for 60 seconds using 2.5% by mass tetramethylammonium hydroxide, and then rinsing was carried out for 20 seconds with pure water to obtain a layer pattern.

Next, using a high-pressure mercury lamp, the entire surface was subjected to curing by exposure with an exposure amount of 10 J/cm$^2$ to form an interlayer insulating film for a re-distribution layer. This interlayer insulating film for a re-distribution layer was excellent in insulating properties.

In addition, in a case where a semiconductor device was manufactured using this interlayer insulating film for a re-distribution layer, it has been confirmed that the semiconductor device operates without any problem.

What is claimed is:

1. A method of manufacturing a cured film, comprising:
    a first exposure step of exposing a part of a photocurable film formed from a photocurable resin composition;
    a development step of developing the photocurable film after the exposure with a developing solution to obtain a pattern; and
    a second exposure step of exposing the pattern with light including light having a wavelength in a range of 190 nm to 550 nm and different from a wavelength of light used in the first exposure step,
    wherein the photocurable resin composition contains
    at least one resin selected from the group consisting of polyimide and polybenzoxazole,
    a photosensitive compound A having a sensitivity to an exposure wavelength in the first exposure step, and
    a photosensitive compound B having no sensitivity to the exposure wavelength in the first exposure step and having a sensitivity to an exposure wavelength in the second exposure step,
    where the photosensitive compound A is a compound that changes a solubility of the photocurable film in the developing solution in the first exposure step, and at least one of the following condition 1 or condition 2 is satisfied;
    the condition 1: the resin in the photocurable resin composition contains a group in which a bonding reaction with another group is promoted due to photosensitization of the photosensitive compound B in the second exposure step,
    the condition 2: the photocurable resin composition further contains a crosslinking agent having a group in which a bonding reaction with another group is promoted due to photosensitization of the photosensitive compound B in the second exposure step.

2. The method of manufacturing a cured film according to claim 1,
    wherein the photosensitive compound A is a compound that generates a radical in the first exposure step.

3. The method of manufacturing a cured film according to claim 1,
    wherein the photosensitive compound B is a compound that generates an acid in the second exposure step.

4. The method of manufacturing a cured film according to claim 2,
    wherein the photosensitive compound B is a compound that generates an acid in the second exposure step.

5. The method of manufacturing a cured film according to claim 1,
    wherein the photosensitive compound B is a compound that generates a radical in the second exposure step.

6. The method of manufacturing a cured film according to claim 2,
    wherein the photosensitive compound B is a compound that generates a radical in the second exposure step.

7. The method of manufacturing a cured film according to claim 1,
    wherein the photosensitive compound B is a compound that generates a base in the second exposure step.

8. The method of manufacturing a cured film according to claim 2,
    wherein the photosensitive compound B is a compound that generates a base in the second exposure step.

9. The method of manufacturing a cured film according to claim 1,
    wherein the photosensitive compound A is a photoradical polymerization initiator and the photosensitive compound B is a photoacid generator.

10. The method of manufacturing a cured film according to claim 1,
    wherein both the photosensitive compound A and the photosensitive compound B are a photoradical polymerization initiator.

11. The method of manufacturing a cured film according to claim 1,
    wherein the exposure in the first exposure step is exposure with an i-line.

12. The method of manufacturing a cured film according to claim 2,
    wherein the exposure in the first exposure step is exposure with an i-line.

13. The method of manufacturing a cured film according to claim 3,
    wherein the exposure in the first exposure step is exposure with an i-line.

14. The method of manufacturing a cured film according to claim 1,
    wherein a temperature of the second exposure step is 20° C. to 60° C.

15. The method of manufacturing a cured film according to claim 1,
    wherein the second exposure step is performed by a mercury lamp.

16. The method of manufacturing a cured film according to claim 1,
    wherein the second exposure step is performed in a stepper .

17. A method of manufacturing a laminate, the method comprising the method of manufacturing a cured film according to claim 1.

18. A method of manufacturing an electronic device, the method comprising:
  the method of manufacturing a cured film according to claim 1.

* * * * *